(12) United States Patent
Saitoh et al.

(10) Patent No.: US 8,787,067 B2
(45) Date of Patent: Jul. 22, 2014

(54) SEMICONDUCTOR DEVICE AND METHOD OF CONTROLLING SEMICONDUCTOR DEVICE

(75) Inventors: Motofumi Saitoh, Kanagawa (JP); Masayuki Terai, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 363 days.

(21) Appl. No.: 13/359,449

(22) Filed: Jan. 26, 2012

(65) Prior Publication Data
US 2012/0195100 A1    Aug. 2, 2012

(30) Foreign Application Priority Data

Jan. 31, 2011   (JP) ................................. 2011-018703
Jun. 3, 2011    (JP) ................................. 2011-125331
Oct. 28, 2011   (JP) ................................. 2011-237272

(51) Int. Cl.
*G11C 11/00*    (2006.01)

(52) U.S. Cl.
USPC .. 365/148; 365/189.011; 257/4; 257/E21.004

(58) Field of Classification Search
CPC ............... G11C 13/004; G11C 13/007; G11C 13/0069; G11C 2213/56; G11C 2213/79; G11C 2213/82; H01L 27/24; H01L 27/2436; H01L 45/04; H01L 45/145
USPC ................ 365/148, 189.011; 257/4, E21.004
See application file for complete search history.

(56) References Cited

U.S. PATENT DOCUMENTS

| | | | | |
|---|---|---|---|---|
| 7,898,839 | B2 * | 3/2011 | Aoki | 365/148 |
| 2009/0046496 | A1 * | 2/2009 | Katoh | 365/148 |
| 2010/0271860 | A1 * | 10/2010 | Muraoka et al. | 365/148 |
| 2012/0008367 | A1 * | 1/2012 | Kajiyama | 365/148 |

FOREIGN PATENT DOCUMENTS

JP        2010-015662 A    1/2010

OTHER PUBLICATIONS

Y. Sakotsubo, et al., "A New Approach for Improving Operating Margin of Unipolar ReRAM using Local Minimum of Reset Voltage", 2010 Symposium on VLSI Technology Digest of Technical Papers, p. 87-88.

* cited by examiner

*Primary Examiner* — Toan Le
(74) *Attorney, Agent, or Firm* — McGinn IP Law Group, PLLC

(57) ABSTRACT

Provided is a semiconductor device including: a memory cell having a variable resistance device; and a control unit that controls a voltage applied to the memory cell, wherein the variable resistance device includes a lower electrode contains a first metal material, an upper electrode containing a second metal material, and an insulating film containing oxygen, the first metal material has a normalized oxide formation energy higher than that of the second metal material, and the control unit applies a positive voltage to the upper electrode at the time of an operation of increasing a resistance value of the insulating film and an operation of decreasing the resistance value thereof, and applies a positive voltage to the lower electrode at the time of an operation of reading out the resistance value of the insulating film.

31 Claims, 70 Drawing Sheets

ELEMENT IN WHICH TRANSITION
TO OFF STATE IS NOT OBSERVED

ELEMENT IN WHICH TRANSITION
TO OFF STATE IS OBSERVED

TRANSITION TO OFF STATE IS
NOT OBSERVED IN ALL THE ELEMENTS

FIG. 37A
FIG. 37B
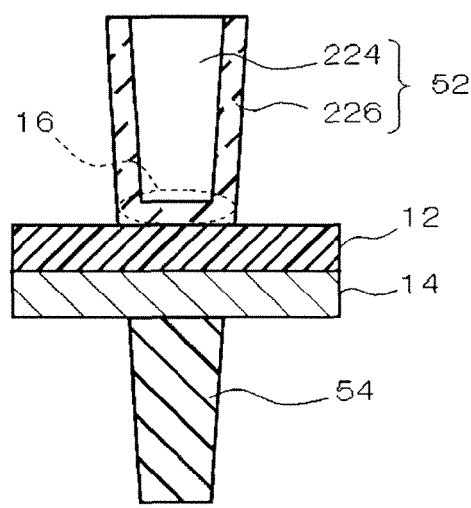
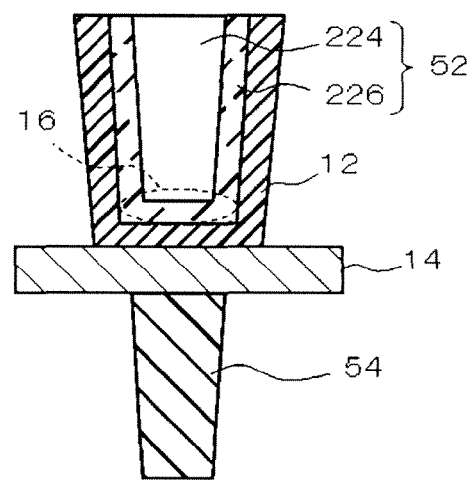

124

134

SEMICONDUCTOR DEVICE AND METHOD OF CONTROLLING SEMICONDUCTOR DEVICE

This application is based on Japanese patent application Nos. 2011-018703, 2011-125331, and 2011-237272, the contents of which are incorporated herein by reference.

BACKGROUND

1. Technical Field

The present invention relates to a semiconductor device and a method of controlling a semiconductor device.

2. Related Art

A variable resistance storage device (ReRAM: Resistance Random Access Memory) is one type of nonvolatile memory which utilize a change of resistance value of an insulating film provided between electrodes by the application of a voltage. As operation types of ReRAM, there are a unipolar type and a bipolar type. In the unipolar type, any of the state transitions of an increase in the resistance of an insulating film and a decrease in the resistance thereof occurs due to the application of a voltage in the same direction. On the other hand, in the bipolar type, an increase in the resistance of an insulating film occurs due to the application of a voltage in one direction, and a decrease in the resistance of an insulating film occurs due to the application of a voltage in the other direction.

A technique disclosed in Japanese Unexamined Patent Publication No. 2010-15662 relates to a bipolar type ReRAM. Specifically, when the standard electrode potential of an insulating film which is a variable resistance layer is set to Vt, and the standard electrode potentials of a first electrode and a second electrode provided above and below the insulating film are V1 and V2, respectively, the relationships of Vt<V2 and V1<V2 are satisfied. In this case, the above-mentioned technique discloses that the resistance of the insulating film is increased by applying a positive voltage to the second electrode, and the resistance thereof is decreased by applying a positive voltage to the first electrode. In addition, the technique also discloses that a readout operation is performed by applying a positive voltage to the second electrode at the time of readout.

FIG. 22 is a circuit diagram illustrating a typical configuration of a ReRAM cell. As shown in FIG. 22, the ReRAM cell includes a variable resistance device 97 and a selection transistor 98. Here, an upper electrode of the variable resistance device 97 is connected to an interconnect 90, and a lower electrode thereof is connected to an interconnect 94 through a selection transistor 98. When the bipolar type operation is performed, a positive voltage is applied to one electrode in the case of an increase in the resistance, and a positive voltage is applied to the other electrode in the case of a decrease in the resistance. For this reason, it is necessary to connect a switching high-voltage source to both the interconnects 90 and 94.

On the other hand, when the unipolar type operation is performed, both switching operations to decrease the resistance and to increase the resistance are performed by applying a positive voltage to only one of any of the electrodes. For this reason, it is enough to connect the high-voltage source to only either the interconnect 90 or the interconnect 94. Thereby, since a power-supply circuit can be simply designed, there is an advantage that a reduction in the entire area is facilitated at the time of the integration of a memory cell.

SUMMARY

"2010 Symposium on VLSI Technology Digest of Technical Papers, p 87" discloses a technique relating to a unipolar type ReRAM. According to this paper, a voltage is applied only to one electrode constituting a variable resistance device, thereby realizing both switching to decrease the resistance and to increase the resistance.

The unipolar type ReRAM shows the resistance change behavior in the insulating film which is a variable resistance layer without depending on the voltage application direction. In the unipolar type ReRAM, the absolute value of a voltage at which the resistance state of the insulating film changes in to a high-resistance state (OFF state) is lower than the absolute value of a voltage at which the resistance state of the insulating film changes in to a low-resistance state (ON state). For this reason, in order to prevent the resistance state from changing at the time of the readout operation, it is necessary to set the absolute value of an applied voltage to be smaller than the absolute value of a voltage at which the resistance state of the insulating film changes into a high-resistance state. In addition, there is a variation among devices in the absolute value of a voltage at which the resistance state of the insulating film changes into a high-resistance state. Therefore, the absolute value of a voltage to be applied at the time of the readout operation has to be set smaller than the absolute value of a voltage at which the resistance state of the insulating film changes into a high-resistance state, in consideration of at least the variation.

Further, even when the absolute value of a voltage to be applied at the time of readout is set lower than the absolute value of a voltage at which the transition to a high-resistance state is performed, there is also a problem of long-term reliability that the transition of the resistance state occurs by applying a readout voltage for a long period of time. For this reason, in order to assure the long-term reliability, it is necessary to decrease the absolute value of a voltage to be applied at the time of readout smaller than the absolute value of a voltage at which the transition to a high-resistance state is performed, in addition to the margin by the above-mentioned variation.

As stated above, it is necessary to lower a voltage applied at the time of the readout operation, in order to assure the reliability of the ReRAM. However, as the voltage applied at the time of the readout operation becomes lower, it takes more time to complete the readout operation. In this manner, in the unipolar type nonvolatile memory, it is difficult to realize the high-speed operation while assuring the reliability thereof.

In one embodiment, there is provided a semiconductor device including: a memory cell having a variable resistance device; and a control unit that controls a voltage applied to the memory cell, wherein the variable resistance device includes a first electrode containing a first metal material, a second electrode containing a second metal material, and an insulating film, provided between the first electrode and the second electrode, that contains a third metal material and oxygen, the first metal material has a normalized oxide formation energy higher than that of the second metal material, and the control unit applies a positive voltage to the second electrode at the time of an operation of increasing a resistance value of the insulating film and an operation of decreasing the resistance value thereof, and applies a positive voltage to the first electrode at the time of an operation of reading out the resistance value of the insulating film.

According to the invention, the first metal material constituting the first electrode has a normalized oxide formation energy higher than that of the second metal material constituting the second electrode. For this reason, even when a positive voltage is applied to the first electrode, the resistance state of the insulating film does not change into a high-resistance state. The control unit applies a positive voltage to the second electrode at the time of the operation of increasing the resistance value of the insulating film and the operation of decreasing the resistance value thereof, and applies a positive voltage to the first electrode at the time of the operation of reading out the resistance value of the insulating film. Therefore, it is possible to suppress the transition of the resistance state of the insulating film to a high-resistance state at the time of the readout operation. In addition, it is possible to perform the readout operation by a sufficiently high voltage. Consequently, it is possible to provide a semiconductor device capable of realizing the high-speed operation while assuring the reliability.

In another embodiment, a method is provided to control a semiconductor device including a first electrode containing a first metal material, a second electrode containing a second metal material, and an insulating film, provided between the first electrode and the second electrode, that contains a third metal material and oxygen, the first metal material having a normalized oxide formation energy higher than that of the second metal material, the method including: applying a positive voltage to the second electrode at the time of an operation of increasing a resistance value of the insulating film and an operation of decreasing the resistance value thereof, and applying a positive voltage to the first electrode at the time of an operation of reading out the resistance value of the insulating film.

According to the invention, it is possible to provide a semiconductor device with the high-speed operation while assuring the reliability.

BRIEF DESCRIPTION OF THE DRAWINGS

The above and other objects, advantages and features of the present invention will be more apparent from the following description of certain preferred embodiments taken in conjunction with the accompanying drawings, in which:

FIGS. 37A and 37B are cross-sectional views illustrating the variable resistance device shown in FIG. 36.

DETAILED DESCRIPTION

Figure 1:
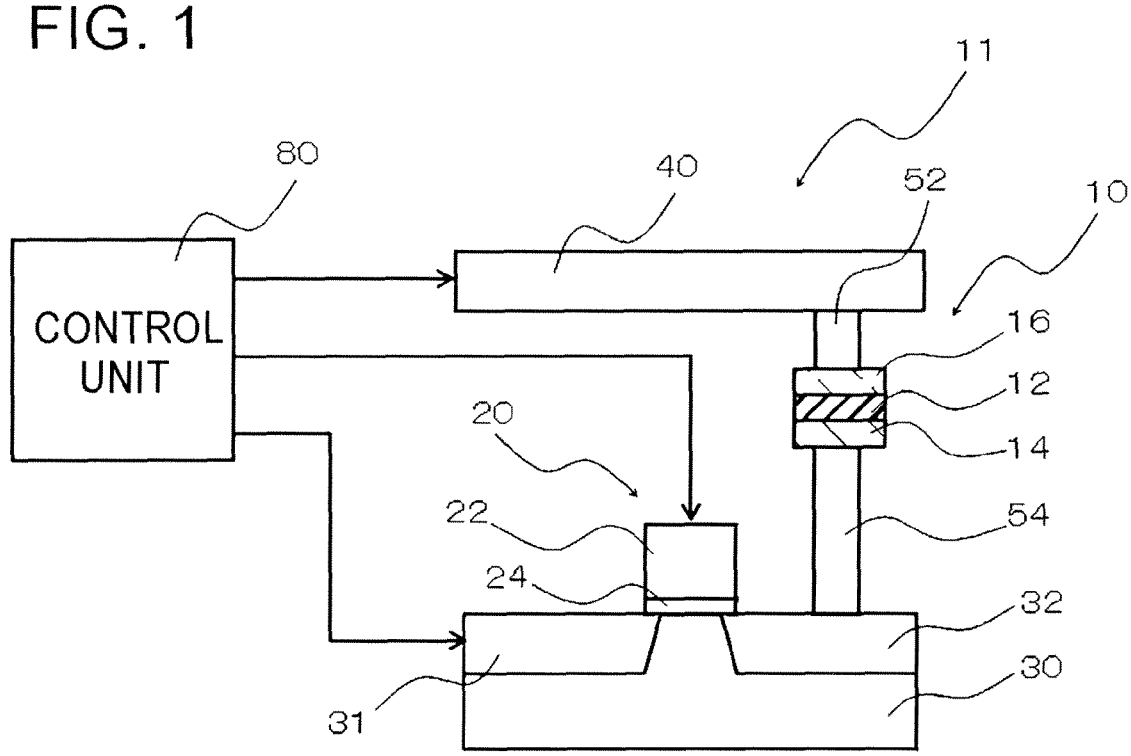
FIG. 1 is a cross-sectional view illustrating a nonvolatile memory according to a first embodiment.

The invention will be now described herein with reference to illustrative embodiments. Those skilled in the art will recognize that many alternative embodiments can be accomplished using the disclosures of the present invention and that the invention is not limited to the embodiments illustrated for explanatory purposes.

Hereinafter, the embodiment of the invention will be described with reference to the accompanying drawings. In all the drawings, like elements are referenced by like reference numerals and signs and descriptions thereof will not be repeated.

FIG. 1 is a cross-sectional view illustrating a nonvolatile memory 100 according to a first embodiment. The nonvolatile memory 100 according to the embodiment includes a memory cell 11 and a control unit 80. The memory cell 11 has a variable resistance device 10. The control unit 80 controls a voltage to be applied to the memory cell 11. The variable resistance device 10 is a unipolar type ReRAM, and can store data by switching between an ON state and an OFF state.

The nonvolatile memory 100 constitutes a semiconductor device, for example, together with other circuits.

The variable resistance device 10 includes a lower electrode 14, an upper electrode 16, and an insulating film 12. The lower electrode 14 contains a first metal material. The upper electrode 16 contains a second metal material. The insulating film 12 is provided between the lower electrode 14 and the upper electrode 16. In addition, the insulating film 12 contains a third metal material and oxygen. The first metal material has a normalized oxide formation energy higher than that of the second metal material. The control unit 80 applies a positive voltage to the upper electrode 16 at the time of the operation of increasing a resistance value of the insulating film 12 and the operation of decreasing the resistance value thereof, and applies a positive voltage to the lower electrode 14 at the time of the operation of reading out the resistance value of the insulating film 12. Hereinafter, the configuration of the nonvolatile memory 100 will be described in detail.

As shown in FIG. 1, the nonvolatile memory 100 further includes a selection transistor 20, and constitutes a 1T1R-type nonvolatile memory. The lower electrode 14 is connected to the selection transistor 20. The selection transistor 20 is composed of source/drain regions 31 and 32 formed in a substrate 30, a gate insulating film 24 provided on the substrate 30, and a gate electrode 22 provided on the gate insulating film 24. The selection transistor 20 is a field-effect transistor (FET) manufactured by a normal silicon technology. In this case, as a component of the selection transistor 20, for example, a Metal/High-k gate stack or a silicon-on-insulator (SOI) substrate can be used. In addition, as the selection transistor, a three-dimensional structure transistor (FinFET), a transistor within an interconnect and the like may be appropriately used. In order to supply a sufficient current which gives rise to high-resistance switching, the ON-state current of the selection transistor 20 is set to 100 µA or more, more preferably 500 µA or more.

Figure 2:
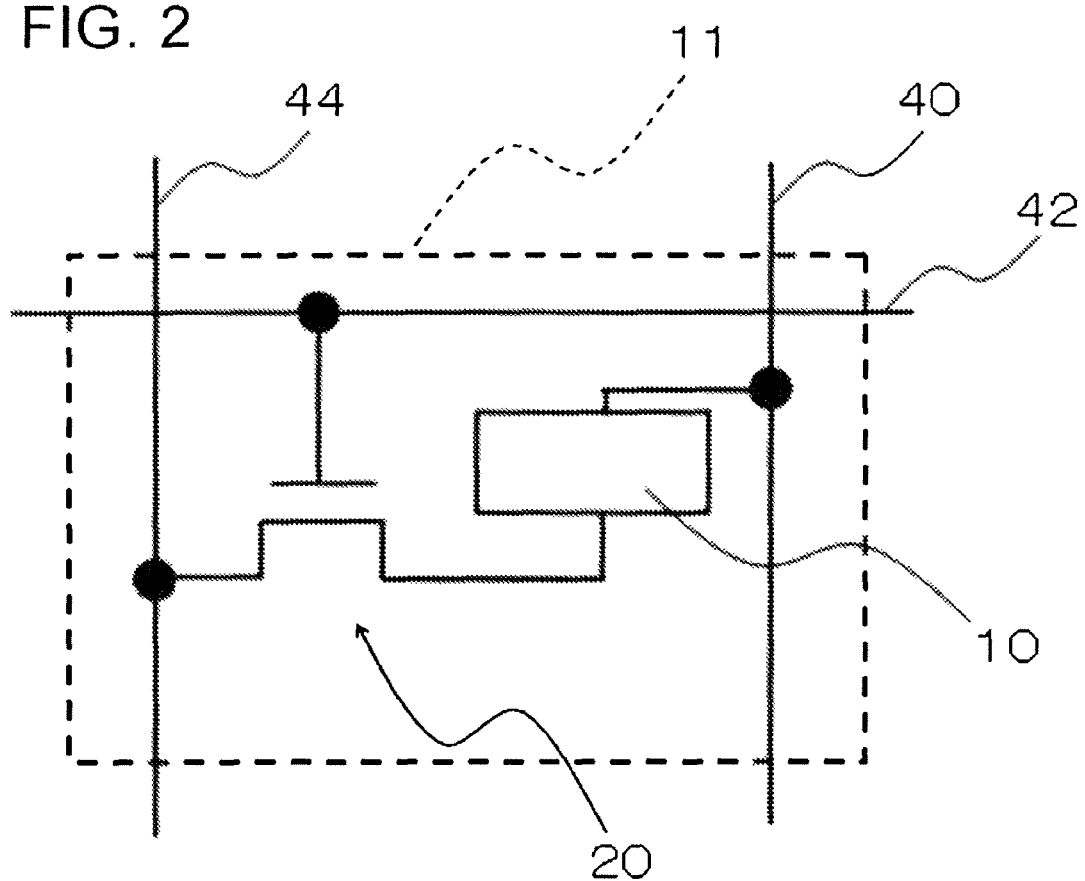
FIG. 2 is a circuit diagram illustrating the nonvolatile memory shown in FIG. 1.

FIG. 2 is a circuit diagram illustrating the nonvolatile memory 100 shown in FIG. 1. As shown in FIG. 2, the memory cell 11 is connected to a plate line 40, a word line 42, and a bit line 44. As shown in FIG. 1, the plate line 40 is connected to the upper electrode 16 through a plate contact 52. In addition, the lower electrode 14 is connected to the source/drain region 32 through a source/drain contact 54. The bit line 44 is connected to the source/drain region 31. The word line 42 is connected to the gate electrode 22. The control unit 80 is connected to the plate line 40, the word line 42, and the bit line 44, and controls a voltage to be applied to the variable resistance device 10 and the selection transistor 20 through the plate line 40, the word line 42, and the bit line 44.

The insulating film 12 constitutes a variable resistance layer in the variable resistance device 10. In the embodiment, the application of a positive voltage to the upper electrode 16 changes a resistance value of the insulating film 12 which is a variable resistance layer. The variable resistance device 10 becomes an ON state or an OFF state on the basis of the resistance value of the insulating film 12. In the embodiment, a case in which the resistance state of the insulating film 12 is in a high-resistance state is set to an OFF state, and a case in which the resistance state thereof is in a low-resistance state is set to an ON state.

The lower electrode 14 can be formed of, for example, W, Al, TiN, Ti, Ta, TaN, Hf, HfN, Zr, ZrN and the like, or an alloy thereof or silicide thereof. In the case of using $Ta_2O_5$ for the insulating film 12, when the normalized oxide formation energy of the first metal material constituting the lower electrode 14 is defined as $\Delta H_{f1}$, it is preferable that the relationship of $\Delta H_{f1} > 280$ kJ/mol is satisfied. When the relationship of $\Delta H_{f1} > 280$ kJ/mol is satisfied, a change of the resistance state of the insulating film 12 to the high-resistance state is suppressed at the time of applying a positive voltage to the lower electrode 14. Here, the normalized oxide formation energy indicates a value obtained by normalizing an oxide formation enthalpy which is the physical quantity corresponding to energy generated when a given material is oxidized, per oxygen atom of a formed metal oxide. It is indicated that the higher the normalized oxide formation energy of the material becomes, the more likely the oxygen atoms bond to metal, that is, ease of oxidation; the lower the normalized oxide formation energy of the material becomes, the less likely the oxidation occurs.

Further, the upper electrode 16 can be formed of, for example, Ru, $RuO_2$, Pt, Ir, Rh, Pd, Cu, or an alloy thereof. In the case of using $Ta_2O_5$ for the insulating film 12, when the normalized oxide formation energy of the second metal material constituting the upper electrode 16 is defined as $\Delta H_{f2}$, it is preferable that the relationship of $\Delta H_{f2} < 160$ kJ/mol is satisfied. When the relationship of $\Delta H_{f2} < 160$ kJ/mol is satisfied, it is easy to cause the transition of resistance state of the insulating film 12 to either the high-resistance state or the low resistance state, and to switch between the ON state and the OFF state of the variable resistance device 10, at the time of applying a positive voltage to the upper electrode 16.

The insulating film 12 can be formed of, for example, a laminated film of $Ta_2O_5$ and $TiO_2$, $ZrO_2$, a laminated film of $ZrO_2$ and $Ta_2O_5$, $SrTiO_3$, $SrRuO_3$, $Al_2O_3$, $La_2O_3$, $HfO_2$, $Y_2O_3$ or $V_2O_5$ and the like, other than $Ta_2O_5$. In this case, the range of preferred values required for the normalized oxide formation energies $\Delta H_{f1}$ and $\Delta H_{f2}$, the first metal material constituting the lower electrode 14 and the second metal material constituting the upper electrode 16, respectively, change depending on the material of the insulating film 12. When the normalized oxide formation energy of the third metal material constituting the insulating film 12 is defined as $\Delta H_{f3}$, it is preferable that $\Delta H_{f1}$ and $\Delta H_{f2}$ satisfy the following relationships.

$\Delta H_{f1} \geq \Delta H_{f3}/7 + 220$ (kJ/mol)

$\Delta H_{f2} \leq \Delta H_{f3}/7 + 100$ (kJ/mol)

When the above-mentioned expressions are satisfied, it is possible to reliably suppress the transition of the resistance state of the insulating film 12 to the high-resistance state at the time of applying a positive voltage to the lower electrode 14. In addition, it is possible to change the resistance state of the insulating film 12 into the high-resistance state or the low-resistance state at the time of applying a positive voltage to the upper electrode 16.

Meanwhile, the above-mentioned relationship may be satisfied by defining the normalized oxide formation energy of the first metal material constituting the lower electrode 14 as $\Delta H_{f2}$ and defining the normalized oxide formation energy of the second metal material constituting the upper electrode 16 as $\Delta H_{f1}$. In this case, the transition of the resistance state of the insulating film 12 to the high-resistance state is suppressed at the time of applying a positive voltage to the upper electrode 16. And, the resistance state of the insulating film 12 is caused to transition to the high-resistance state or the low-resistance state, at the time of applying a positive voltage to the lower electrode 14.

Here, an operating principle of the nonvolatile memory 100 according to the embodiment will be described. In the unipolar type ReRAM, a leak path forming process called "forming" is firstly performed after device manufacturing. It is considered that this process generates an oxygen vacancy and a defect level in the inside of the insulating film 12 by applying a voltage between the lower electrode 14 and the upper electrode 16, to thereby form a leak path in the insulating film 12. It is estimated that the resistance value of the insulating film 12 changes due to the connection and disconnection of this leak path. Although a part of the leak path is disconnected in the high-resistance state, the oxygen vacancy and the defect level are generated again in the disconnected part of the leak path by applying a voltage to the insulating film 12, and thus a decrease in the resistance occurs due to the connection of the leak path. On the other hand, it is considered that when the current is applied to the connected leak path, the vicinity thereof, particularly, the vicinity of an electrode on the side of high potential is locally heated, and the oxygen atoms in the insulating film 12 are thermally excited and thus move to a more stable position, which results in eliminating the oxygen vacancy. Thereby, it is considered that the leak path is disconnected, and an increase in the resistance occurs. In this manner, the direction of the current is not involved in the connection and disconnection of the leak path. For this reason, in the unipolar type ReRAM, the change in the resistance state of the insulating film 12 occurs in either voltage direction.

Figure 3:
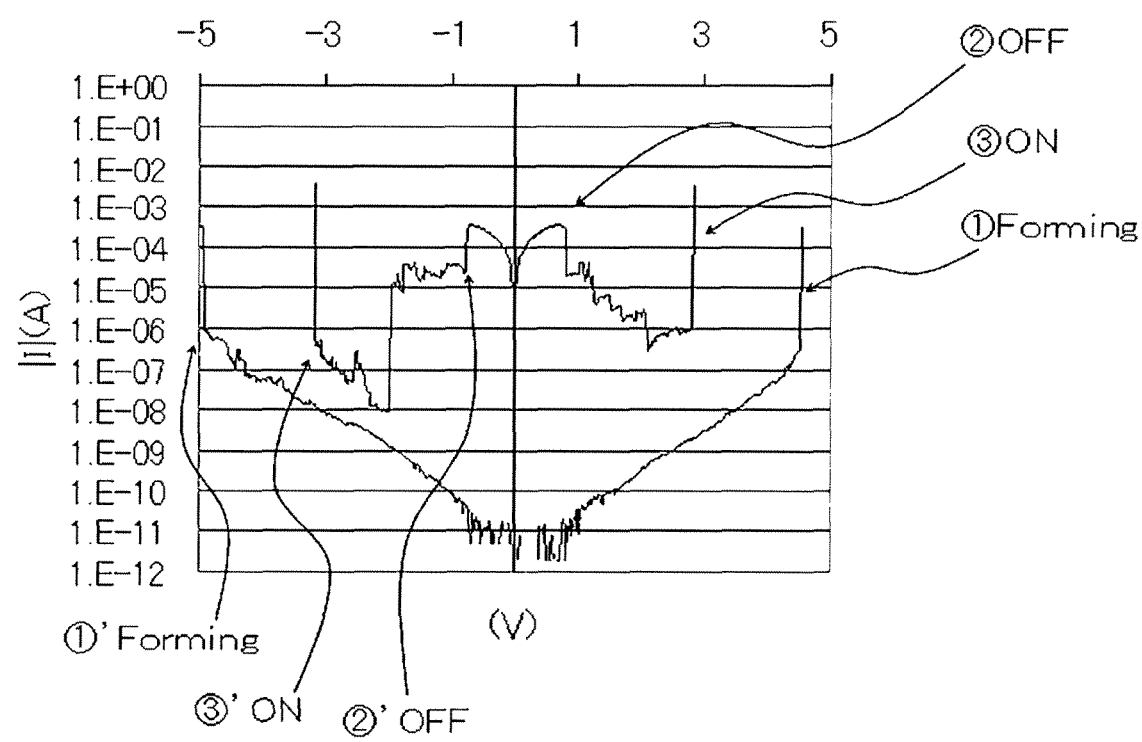
FIG. 3 is a graph illustrating operation behavior of a normal unipolar type ReRAM.

FIG. 3 is a graph illustrating operation behavior of a normal unipolar type ReRAM. As shown in FIG. 3, in the unipolar type ReRAM, firstly, the leak path is formed in the insulating film 12 by applying a voltage between the lower electrode 14 and the upper electrode 16 (Forming (1) and (1')). Thereafter, by controlling the voltage applied between the lower electrode 14 and the upper electrode 16, the resistance state of the insulating film 12 is changed (OFF (2) and (2'), and ON (3) and (3')). As described above, the direction of the current is not involved in the connection and disconnection of the leak path. For this reason, as shown in FIG. 3, the change in the resistance state of the insulating film 12 occurs under the both voltage directions. Since the increase in the resistance occurs near +0.8 V or near −0.8 V in the operation example shown herein, it is necessary that when a great number of devices are integrated, a readout voltage be set to a range of appropriately −0.5 to 0.5 V in consideration of a margin due to variation.

Figure 4:
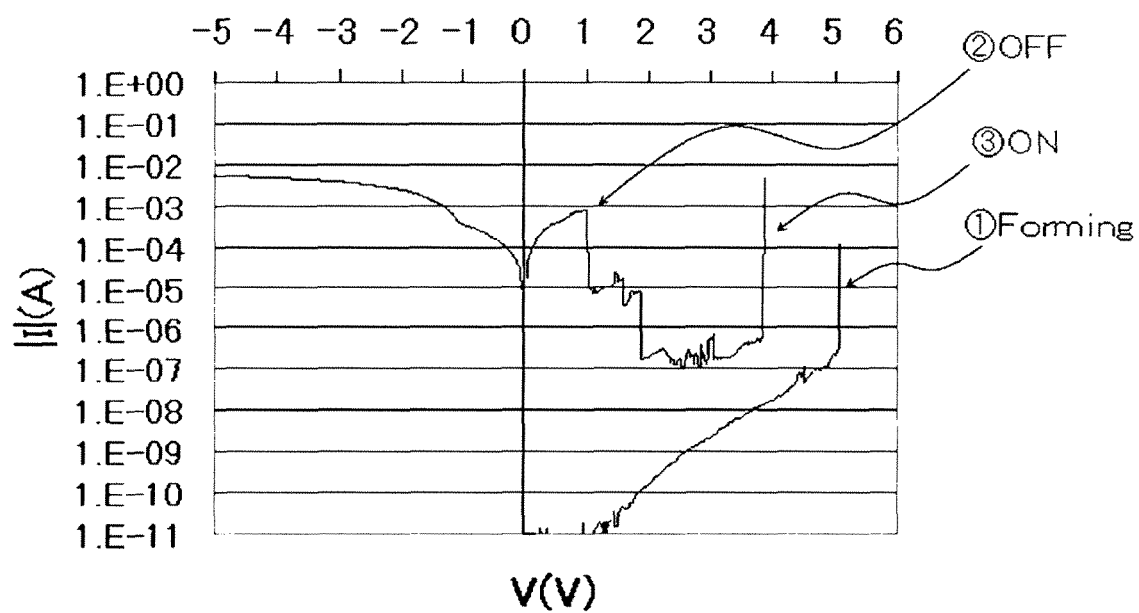
FIG. 4 is a graph illustrating operation behavior of the nonvolatile memory shown in FIG. 1.

FIG. 4 is a graph illustrating operation behavior of the nonvolatile memory 100 shown in FIG. 1. FIG. 4 shows a relationship between a voltage applied to the upper electrode 16 and a current through the variable resistance device 10. As shown in FIG. 4, in the nonvolatile memory 100 according to the embodiment, the change in the resistance state of the insulating film 12 occurs (OFF (2) and ON (3)) only when the positive voltage is applied to the upper electrode 16. On the other hand, when the positive voltage is applied to the lower electrode 14 (the negative voltage is applied to the upper electrode 16), the transition to the high-resistance state does not occur in the insulating film 12. It is considered that this is because the normalized oxide formation energy of the first metal material constituting the lower electrode 14 is high, and the oxygen atoms for eliminating the oxygen vacancy react with the lower electrode 14. That is, it is supposed that even when the oxygen atoms in the insulating film 12 are thermally excited, the oxygen atoms are stabilized by oxidation through bonding to the metal atoms of the lower electrode 14, and thus the elimination of the oxygen vacancy is obstructed. Thereby, even when the positive voltage is applied to the lower electrode 14, the leak path is not disconnected, and the transition to the high-resistance state is obstructed. Therefore, it is possible to apply, for example, the readout voltage of appropriately −1 V (+1 V to the lower electrode), and to perform readout at a higher speed maintaining the reliability. The transition to the high-resistance state at the time of applying the positive voltage to the upper electrode 16 occurs because the upper electrode is formed of a material which is not easily oxidized.

In this manner, in order to perform the resistance change operation and the high-speed and high reliability readout, the ease of electrode oxidation becomes an important parameter, and a value obtained by normalizing an oxide formation enthalpy of the electrode material with respect to the number of oxygen atoms of the oxide, that is the normalized oxide formation energy ($\Delta H_f$), can be an index of it. In the case where the insulating film 12 is $Ta_2O_5$, it is confirmed that the transition to the high-resistance state does not occur when the normalized oxide formation energy $\Delta H_{f1}$ of the lower electrode 14 exceeds 280 kJ/mol, and that the resistance change occurs when the normalized oxide formation energy $\Delta H_{f2}$ of the upper electrode 16 is less than 160 kJ/mol.

Other than $Ta_2O_5$, for example, a laminated film of $Ta_2O_5$ and $TiO_2$, $ZrO_2$, a laminated film of $ZrO_2$ and $Ta_2O_5$, NiO, $SrTiO_3$, $SrRiO_3$, $Al_2O_3$, $La_2O_3$, $HfO_2$, $Y_2O_3$ or $V_2O_5$ and the like can be used for the insulating film 12. In this case, since the degree of stabilization by eliminating the oxygen vacancy of the insulating film 12 is different from $Ta_2O_5$, the normalized oxide formation energy required for the materials of the upper electrode 16 and the lower electrode 14 also changes accordingly. As a result of performing examinations using various insulating film materials and electrode materials, it is found that the amount of the change depends on the normalized oxide formation energy $\Delta H_{f3}$ of metal elements constituting the insulating film 12, and the range of preferred values satisfies the following relationships.

$$\Delta H_{f1} \geq \Delta H_{f3}/7 + 220 \text{ (kJ/mol)}$$

$$\Delta H_{f2} \leq \Delta H_{f3}/7 + 100 \text{ (kJ/mol)}$$

In the nonvolatile memory 100 according to the embodiment, the positive voltage is applied to the lower electrode 14 at the time of the operation of reading out the resistance value of the insulating film 12.

As described above, when the positive voltage is applied to the lower electrode 14, the transition to the high-resistance state does not occur in the insulating film 12. Consequently, the transition of the resistance state of the insulating film 12 to the high-resistance state can be suppressed at the time of the readout operation.

At the time of the operation of increasing the resistance value of the insulating film 12 and the operation of decreasing the resistance value thereof, the positive voltage is applied to the upper electrode 16. As shown in FIG. 1, the upper electrode 16 is not connected to the selection transistor 20. Consequently, the resistance state of the insulating film 12 can be changed without being influenced by the variation in a threshold voltage of the selection transistor 20.

Figure 23A:
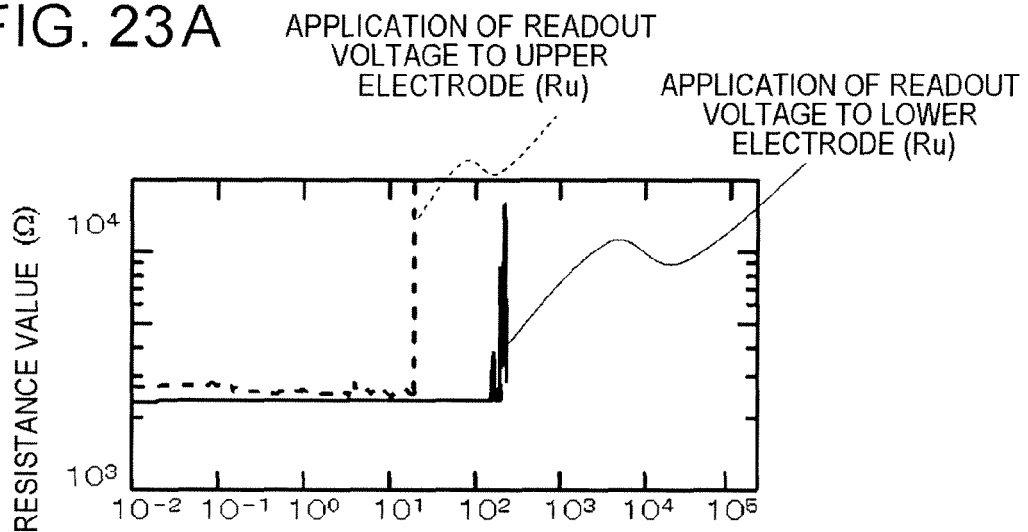
FIGS. 23A and 23B are graphs illustrating resistance changes when a readout voltage is applied to the nonvolatile memory in a low-resistance state for a long period of time.
Figure 23B:
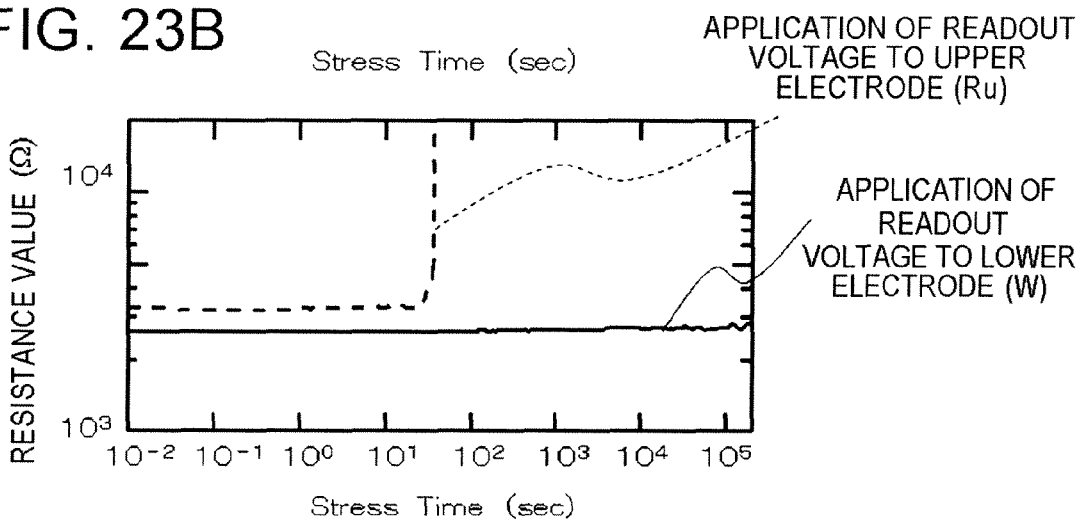

FIGS. 23A and 23B are graphs illustrating resistance changes when the readout voltage is applied to the variable resistance device in a low-resistance state for a long period of time. In FIGS. 23A and 23B, the solid lines correspond to the cases in which the readout voltage is applied to the lower electrode for a long period of time, and the dashed lines correspond to cases in which the readout voltage is applied to the upper electrode for a long period of time.

FIG. 23A shows a case in which the readout voltage is applied in the normal unipolar type ReRAM. In the ReRAM shown in FIG. 23A, the upper electrode and the lower electrode are formed of Ru, and the insulating film is formed of a laminated film in which $TiO_2$, $Ta_2O_5$, and $TiO_2$ are laminated in this order. Since the application of a voltage of approximately 1.0 V to the upper electrode or the lower electrode of the device gives rise to the increase in the resistance, the evaluation is performed by applying a voltage of 0.8 V, slightly lower than the above-mentioned voltage value, as the readout voltage. As shown in FIG. 23A, in the normal unipolar type ReRAM, even when the readout voltage is applied to any of the upper electrode and the lower electrode, the insulating film changes into the high-resistance state due to application for a long period of time, nevertheless the readout voltage is lower than the transition voltage to high-resistance state. In this manner, in the normal unipolar type ReRAM, there is a problem of long-term reliability that the transition of the resistance state occurs even under the readout voltage, which does not change the device to the high-resistance state in a short period of time, due to application for a long period of time. For this reason, in addition to the variation among device characteristic, it is necessary to set an absolute value of the readout voltage to be low enough from the viewpoint of assuring the long-term reliability. In order to guarantee the reliability over the product lifetime, even when the transition voltage to the high-resistance state is appropriately 1.0 V, it is necessary that the readout voltage be set to appropriately 0.2 to 0.3 V.

FIG. 23B shows a case in which the readout voltage is applied in the nonvolatile memory 100 according to the embodiment. In the nonvolatile memory 100 shown in FIG. 23B, the upper electrode 16 is formed of Ru, the lower electrode 14 is formed of W, and the insulating film is formed of a laminated film in which $TiO_2$, $Ta_2O_5$, and $TiO_2$ are laminated in this order. In this device, although the application of the positive voltage to the lower electrode does not give rise to the increase in the resistance, the application of a voltage of approximately 1.0 V to the upper electrode gives rise to the increase in the resistance, and thus the readout voltage of 0.8 V similar to the case of FIG. 23A is applied. As shown in FIG. 23B, in the nonvolatile memory 100, when the readout voltage is applied to the lower electrode 14 for a long period of time, the resistance state of the insulating film 12 does not change. That is, in this case, the readout voltage can be set to a voltage of 0.8 V or higher in the nonvolatile memory 100. In this manner, according to the nonvolatile memory 100 of the embodiment, it is possible to set a high readout voltage without degrading the long-term reliability of the nonvolatile memory and without considering the variation of characteristic among devices.

Figure 5:
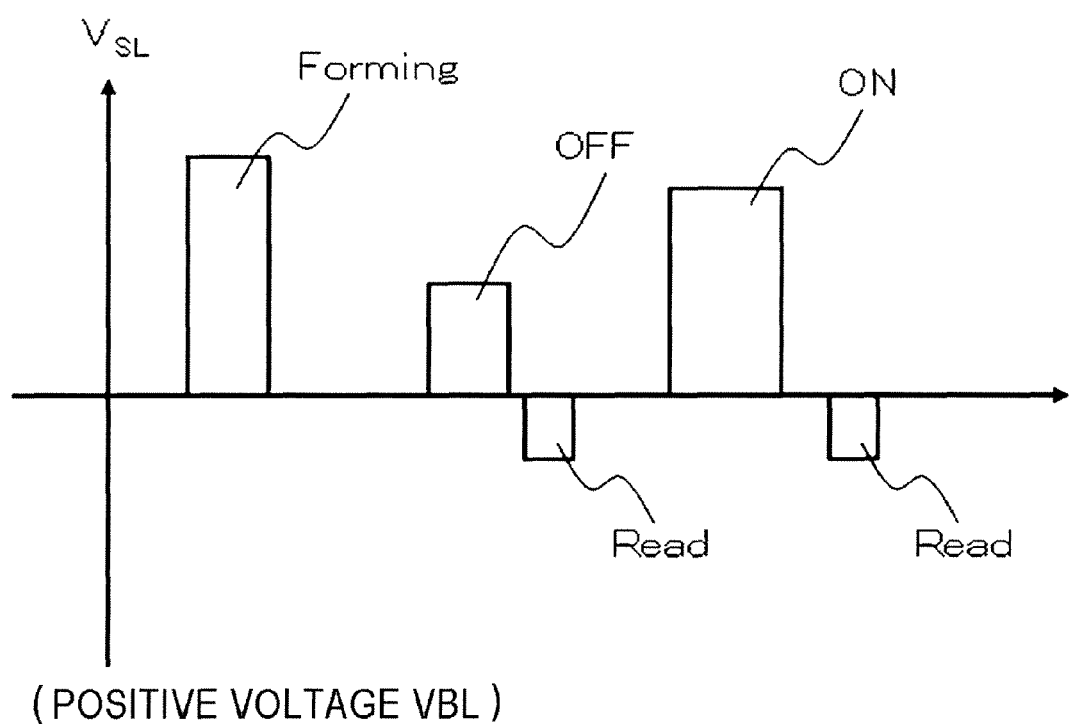
FIG. 5 is a graph illustrating a voltage to be applied at the time of an operation of the nonvolatile memory shown in FIG. 1.
Figure 6A:
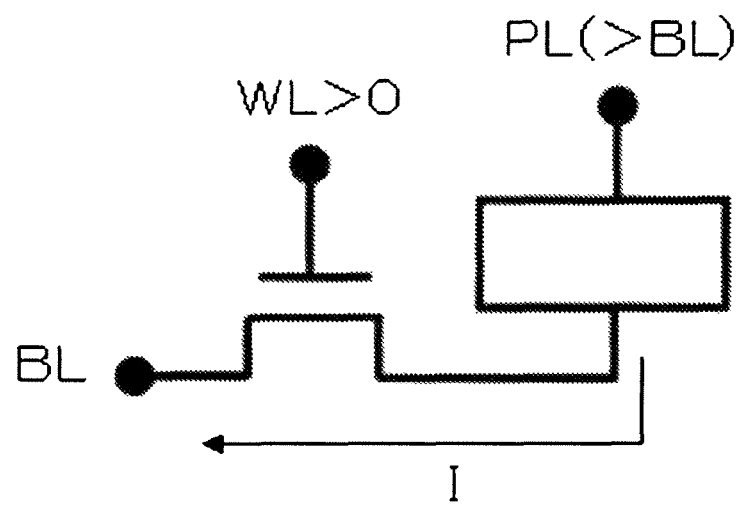
FIGS. 6A and 6B are circuit diagrams illustrating a direction of a current flowing at the time of the operation of the nonvolatile memory shown in FIG. 1.
Figure 6B:
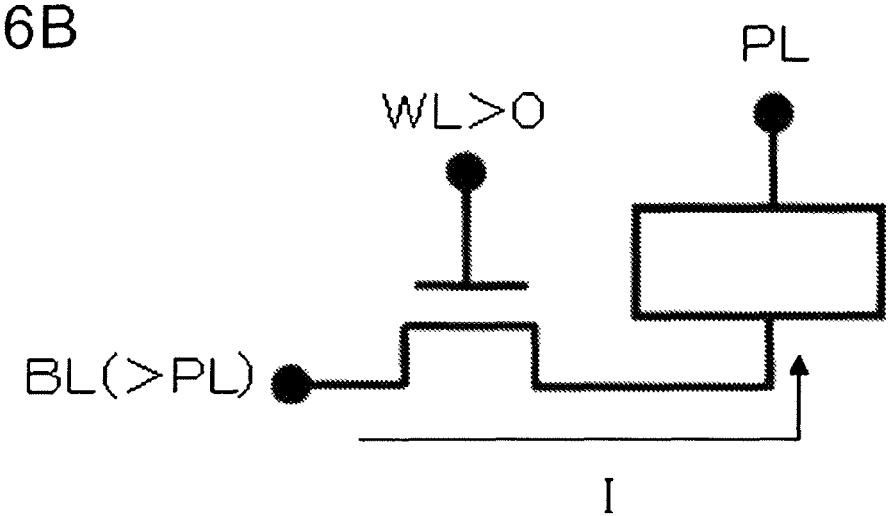

FIG. 5 is a graph illustrating a voltage to be applied at the time of the operations of the nonvolatile memory 100 shown in FIG. 1. FIGS. 6A and 6B are circuit diagrams illustrating a direction of a current flowing at the time of the operations of the nonvolatile memory 100 shown in FIG. 1. As shown in FIG. 5, in the embodiment, a positive voltage on the lower electrode 14 through the bit line 44 ($V_{BL}$) is applied at the time of the operation of reading out the resistance value of the insulating film 12. In this case, as shown in FIG. 6B, the current flows from the hit line 44 to the plate line 40. On the other hand, a positive voltage on the upper electrode 16 through the plate line 40 ($V_{PL}$) is applied at the time of the operation of increasing the resistance value of the insulating film 12 and the operation of decreasing the resistance value thereof. In this case, as shown in FIG. 6A, the current flows from the plate line 40 to the bit line 44.

Figures 7A, 7B, 7C:
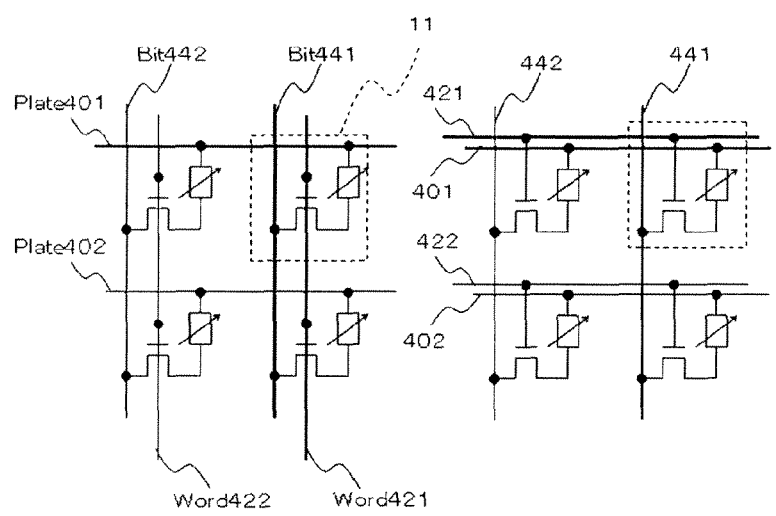
FIGS. 7A to 7C are circuit diagrams illustrating an interconnect scheme of the nonvolatile memory shown in FIG. 1.

FIGS. 7A to 7C are circuit diagrams illustrating various interconnect schemes of the nonvolatile memory 100 shown in FIG. 1. The nonvolatile memory 100 has, for example, a circuit shown in FIG. 7A. A voltage applied to a bit line 441 (44) is defined as $V_{B1}$, a voltage applied to a bit line 442 (44) is defined as $V_{B2}$, a voltage applied to a word line 421 (42) is defined as $V_{W1}$, a voltage applied to a word line 422 (42) is defined as $V_{W2}$, a voltage applied to a plate line 401 (40) is defined as $V_{P1}$, and a voltage applied to a plate line 402 (40) is defined as $V_{P2}$. The nonvolatile memory 100 according to the embodiment takes, for example, the following voltage values.

OFF state→ON state: $V_{B1}$=0 V, $V_{W1}$=~1 V, and
$V_{P1}$=~3 V

ON state→OFF state: $V_{B1}$=0 V, $V_{W1}$=~3 V, and
$V_{P1}$=~2 V

At the Time of Readout Operation: $V_{B1}$=1 V, $V_{W1}$=~1 V, and $V_{P1}$=0 V

Since the nonvolatile memory 100 is a unipolar type, the directions of the application of the voltage are the same as each other at the time of switching to an ON state and switching to an OFF state. For this reason, as seen in the above-mentioned voltage values, a high voltage applied at the time of switching between the ON state and the OFF state is applied only to the plate line 40. Therefore, a high voltage output is required only to the plate line 40 side.

On the other hand, the bipolar type ReRAM having a circuit shown in FIG. 7A takes, for example, the following voltage values.

OFF state→ON state: $V_{B1}$=0 V, $V_{W1}$=~1 V, and
$V_{P1}$=~3 V

ON state→OFF state: $V_{B1}$=~2 V, $V_{W1}$=~3 V, and
$V_{P1}$=0 V

At the Time of Readout Operation: $V_{B1}$=1 V, $V_{W1}$=~1 V, and $V_{P1}$=0 V

In the bipolar type ReRAM, the directions of the application of the voltage are different from each other at the time of switching to an ON state and switching to an OFF state. For this reason, as seen in the above-mentioned voltage values, a high voltage output is required in both the plate line 40 and the bit line 44.

In addition, the nonvolatile memory 100 may have a circuit of FIG. 7B or 7C. In the case of FIG. 7B, since the selection transistor of an adjacent cell also becomes an ON state by the voltage applied to the word line 42 when random writing is performed, there is concern that the resistance state of the cell may also change. In order to prevent this, it is necessary to apply a voltage to the bit line (bit line 442 (44) in FIG. 7B) connected to a cell of which the selection transistor changes to an ON state by applying a voltage to the word line 42, that is, all the bit lines except for that connected to a cell in which rewriting is performed. Since this causes a considerable increase in power consumption, the nonvolatile memory 100 in the embodiment preferably has a circuit of FIG. 7A or 7C.

Figure 8:
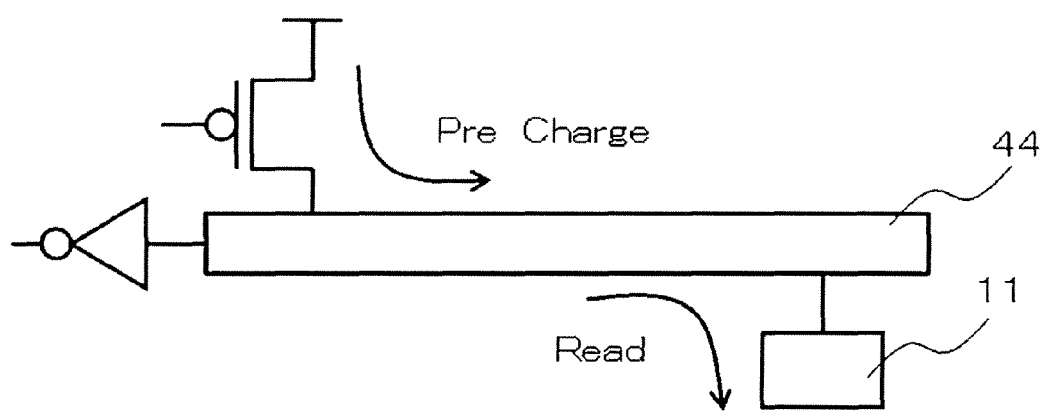
FIG. 8 is a circuit diagram illustrating a readout scheme of a resistance state of an insulating film according to the first embodiment.

FIG. 8 is a circuit diagram illustrating a readout scheme of the resistance state of the insulating film 12 according to the embodiment. As a scheme of reading out the resistance state of the variable resistance layer of the ReRAM, there are a current sensing scheme and a voltage sensing scheme. FIG. 8 shows a case in which the resistance state is read out by the voltage sensing scheme.

The current sensing scheme is a scheme of measuring the resistance value of the insulating film 12 by measuring the magnitude of a current flowing when a voltage is applied between the lower electrode 14 and the upper electrode 16.

On the other hand, the voltage sensing scheme is a scheme of precharging charges by applying a voltage to the plate line 40 or the bit line 44, and then measuring the fluctuation in the potential in the plate line 40 or the bit line 44 after the positive voltage is applied to the selection transistor 20 to thereby emit the charges. As the resistance value of the insulating film 12 becomes higher, a potential drop after a given period of time becomes smaller. Thereby, the high-resistance state and the low-resistance state can be read out.

In the nonvolatile memory 100 according to the embodiment, the readout operation may be performed by applying any of the current sensing scheme and the voltage sensing scheme.

In the nonvolatile memory 100 according to the embodiment, a case in which the readout operation is performed by the voltage sensing scheme will be described in detail. First, as shown in FIG. 8, precharge is performed by applying a voltage to the bit line 44 which is connected to the lower electrode 14 through the selection transistor 20. Next, the application of the voltage to the bit line 44 is stopped. The voltage to be applied to the bit line 44 is, for example, 0.3 V. In addition, the parasitic capacitance of the bit line 44 is, for example, 300 µF. Then, the precharged charges are emitted by applying a positive voltage to the selection transistor 20 of the nonvolatile memory 100. The fluctuation in the potential in the bit line 44 after the positive voltage is applied to the selection transistor 20 is measured.

Figure 9:
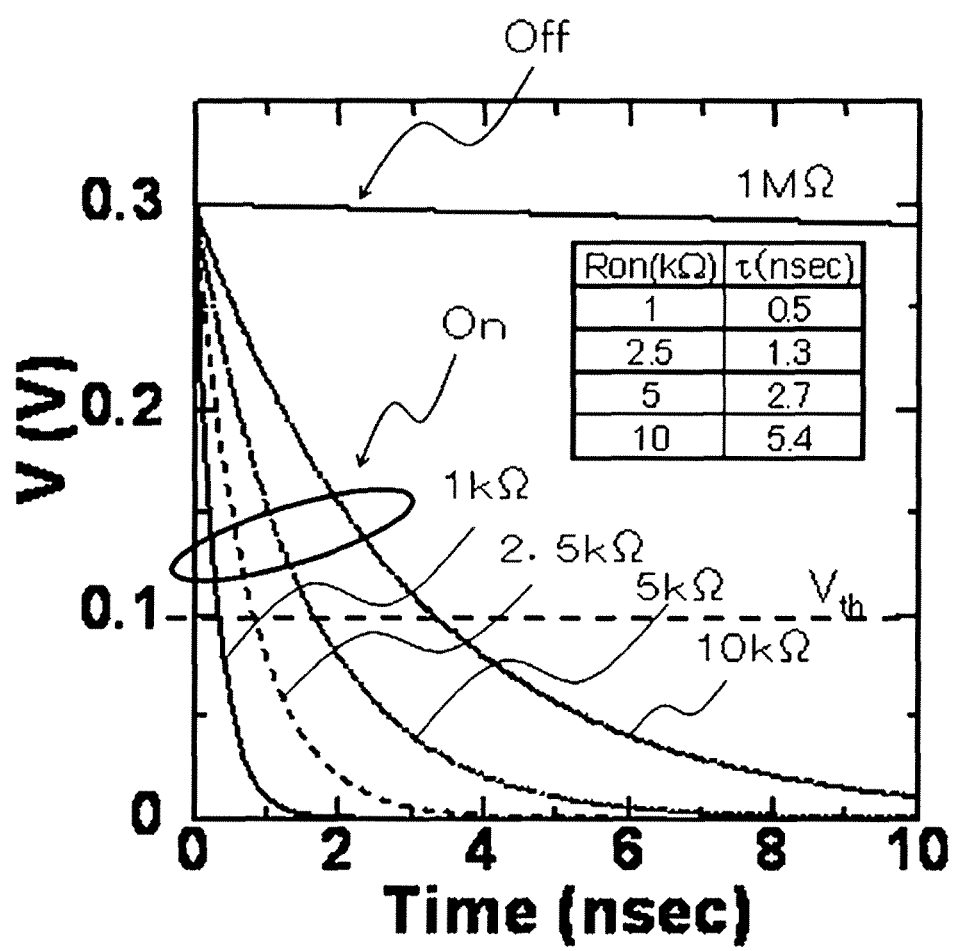
FIG. 9 is a graph illustrating behavior of a fluctuation in the potential when readout is performed by a voltage sensing scheme in the first embodiment.

FIG. 9 is a graph illustrating behavior of the decay in the potential when readout is performed by the voltage sensing scheme, in the embodiment. FIG. 9 shows the decay in the potential when the resistance values of the insulating film 12 are 1 kΩ, 2.5 kΩ, 5 kΩ, 10 kΩ, and 1 MΩ. Here, the state in which the resistance values of the insulating film 12 are 1 kΩ, 2.5 kΩ, 5 kΩ, and 10 kΩ is a low resistance state, that is, an ON state. On the other hand, the state in which the resistance value is 1 MΩ is a high-resistance state, that is, an OFF state. In this manner, since the resistance values in the OFF state is 100 times or more as high as the resistance values in the ON state in the nonvolatile memory 100 according to the embodiment, the behavior of the decay in the potential in the bit line 44 is extremely different in the ON state and the OFF state. Therefore, in the nonvolatile memory 100 according to the embodiment, it is easy to apply the voltage sensing scheme at the time of the readout operation.

As shown in FIG. 9, in any of the ON states, the potential of the bit line 44 drops to 0.05 V or lower which is a reference potential at the transition time of less than 6 nsec. On the other hand, FIG. 9 describes that in the OFF state, there is little change in the potential within 10 nsec, and the sufficient readout margin is obtained. For this reason, readout operation of which the speed is 100 MHz or more (operation period of 10 nsec) can be performed even in consideration of the time required for the determination whether the potential is 0.05 V or lower or appropriately 0.3 V. Therefore, when the voltage sensing scheme is applied to the nonvolatile memory 100 according to the embodiment, it is possible to easily realize high-speed readout.

The case in which the readout voltage is 0.3 V has been described above. Generally, determination of a voltage is performed based on whether the voltage is higher or lower than the threshold voltage of a sensing transistor, and the transistor having the threshold voltage of the half of voltage to be determined is used. For this reason, when the readout voltage is low, it is necessary to use a transistor with a low threshold voltage. When a transistor having an extremely low threshold voltage is used, the transistor property is easily influenced by the variation in the threshold or the long-term reliability of the threshold. In addition, the leakage current in an OFF state also increases, which causes an increase in power consumption. Therefore, it is preferable to perform the determination at a certain level of high voltage, that is, a voltage of appropriately 0.5 V or higher, more preferably 0.8 V or higher.

When the readout voltage is raised, the time required for the potential to reach 0.05 V or lower may lengthen in the case of the ON state. However, since the reference potential can be set high, the time taken to reach the reference potential does not change or can be further shortened. Moreover, as the readout potential increases, the ON current of the sensing transistor used in the determination also increases. Therefore, the time required for the determination is shortened, and higher-speed readout can be realized.

Since the problem of the long-term reliability or the device variation occurs in the unipolar type ReRAM of the related art, it is difficult to raise the readout voltage. However, in the nonvolatile memory 100 related to the embodiment, the readout voltage can be set higher. For example, as shown in FIGS. 23A and 23B, when the readout voltage is set to 0.8 V in the ReRAM of the related art, the long-term reliability cannot be assured. However, in the nonvolatile memory 100 related to the embodiment, the readout at a voltage of 0.8 V can be performed with no problem.

Figure 10:
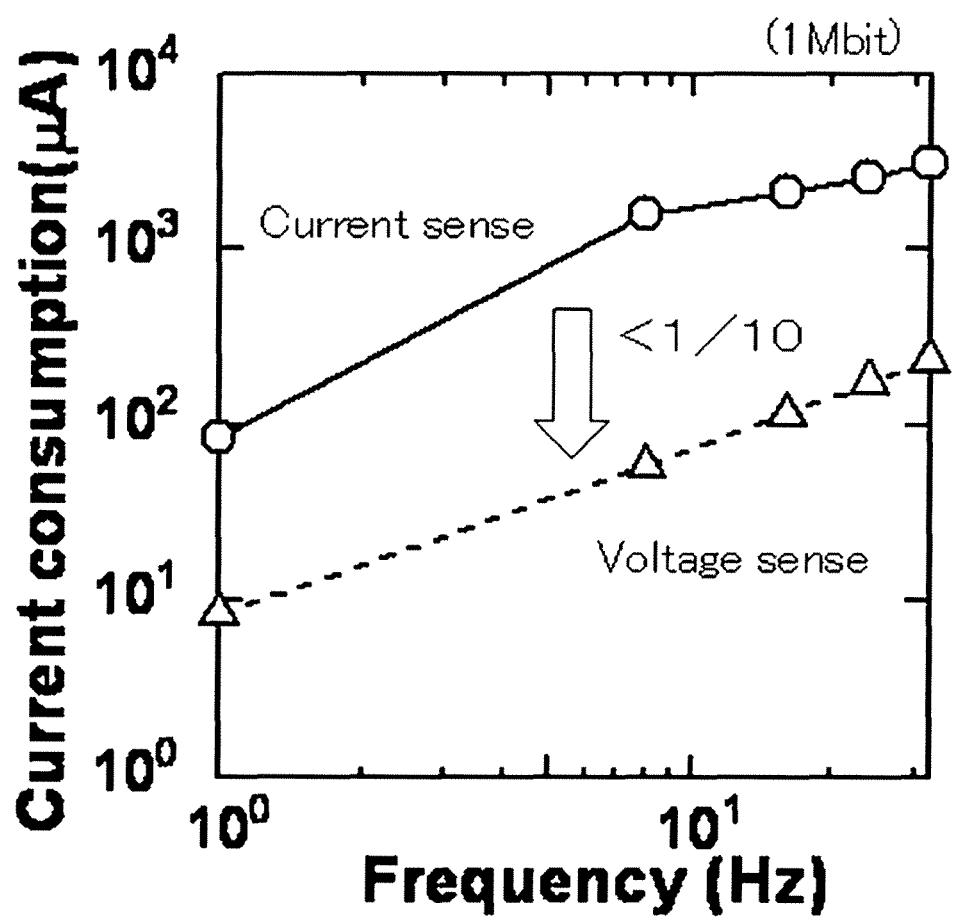
FIG. 10 is a graph illustrating dependence on the operation speed of current consumption when readout is performed by a current sensing scheme and a voltage sensing scheme in the first embodiment.

FIG. 10 is a graph illustrating dependences on the operation speed of current consumption when readout is performed by the current sensing scheme and the voltage sensing scheme, in the embodiment. As shown in FIG. 10, in the current sensing scheme, since a current is caused to flow for a given period of time at the time of the readout operation, current consumption is high. On the other hand, in the voltage sensing scheme, only precharged charge to the bit line 44 is discharged at the time of the readout operation. Consequently, in the nonvolatile memory 100 according to the embodiment, when the voltage sensing scheme is applied, it is possible to reduce current consumption at the time of the readout operation under any operating frequency.

In this manner, in the nonvolatile memory 100 according to the embodiment, it is preferable to apply the voltage sensing scheme.

However, in the nonvolatile memory 100 according to the embodiment, it is also possible to perform the readout operation by the current sensing scheme. When the readout operation is performed by the current sensing scheme, the time required to sense a current generally depends on the amount of the flowing current. For this reason, as the current flowing to the ReRAM is larger, the sensing time is shortened.

According to the normal unipolar type ReRAM, it is necessary to prevent the resistance state of the variable resistance device from changing. For this reason, the absolute value of the readout voltage has to be set to be smaller than the absolute value of the voltage which changes the device into the high-resistance state. Thereby, since the amount of the current flowing to the ReRAM also decreases, it takes time to sense the current.

On the other hand, according to the nonvolatile memory 100 according to the embodiment, the transition to the high-resistance state in the insulating film 12 does not occur at the time of the readout operation. For this reason, the readout voltage can be set to be high. Thereby, the amount of the current flowing to the ReRAM increases, and high-speed sensing of the current is facilitated.

In this manner, even when the readout operation is performed by the current sensing scheme, it is confirmed that the configuration of the nonvolatile memory 100 according to the embodiment is preferably used.

Figure 11A:
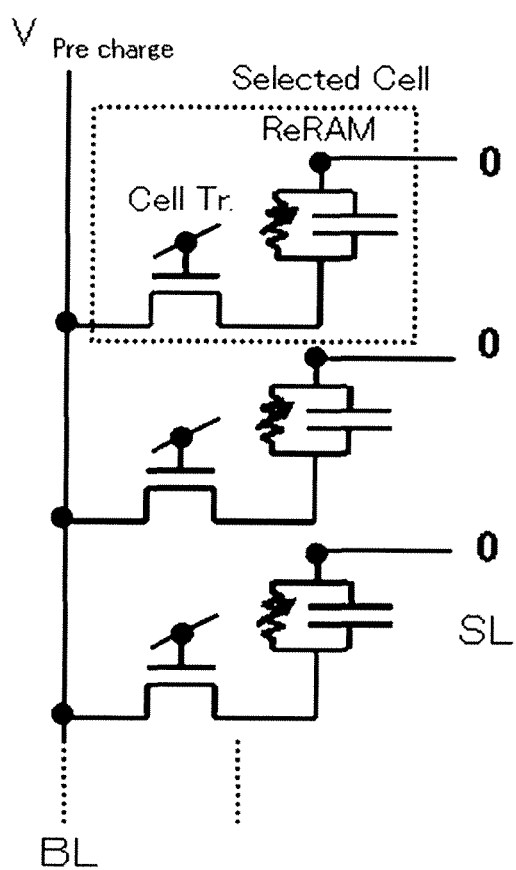
FIGS. 11A and 11B are circuit diagrams for explaining a readout operation in the first embodiment.
Figure 11B:
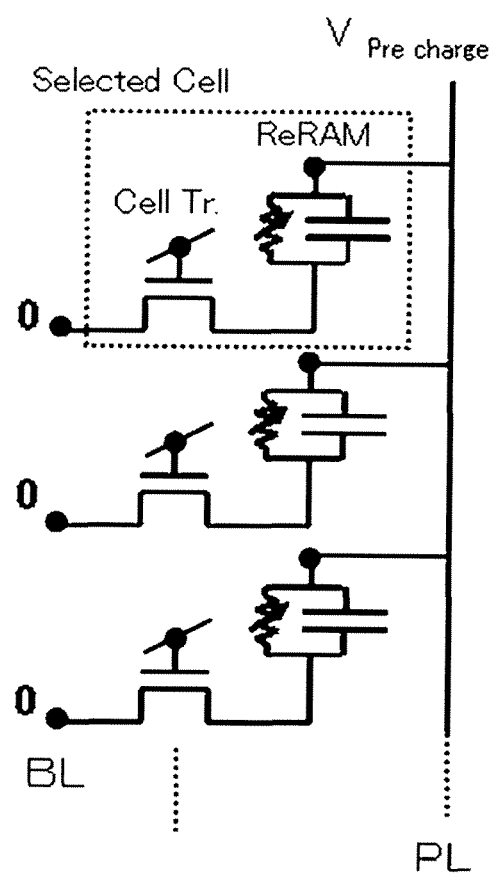

FIGS. 11A and 11B are circuit diagrams for explaining the readout operation according to the embodiment. FIG. 11A shows a case in which a positive voltage is applied to the lower electrode 14 connected to the bit line 44 through the selection transistor 20 at the time of the readout operation. In this case, the relationship of the normalized oxide formation energy between the lower electrode 14 and the upper electrode 16 satisfies a condition according to the embodiment. On the other hand, FIG. 11B shows a case in which a positive voltage is applied to the upper electrode 16 connected to the plate line 40 without using the selection transistor 20 at the time of the readout operation. In this case, the relationship of the normalized oxide formation energy between the lower electrode 14 and the upper electrode 16 satisfies a reverse condition according to the embodiment.

The parasitic capacitance arises in the area except for the area where the leak path is formed, within the insulating film 12. In the configuration shown in FIG. 11B, the case may be possible in which when precharge to the plate line 40 is performed at the time of the readout operation, the potential difference due to the parasitic capacitance generated in the insulating film 12 occurs between the lower electrode 14 and the upper electrode 16 for a non-selected cell. In this case, there is concern that the resistance state of the insulating film 12 may change. In addition, the time required to precharge to the plate line 40 lengthens due to the parasitic capacitance generated in the insulating film 12. In this case, the speed of the readout operation decreases.

In the configuration shown in FIG. 11A, the selection transistor 20 exists between the bit line 44 to which a voltage is applied at the time of precharge and the lower electrode 14. For this reason, when precharge to the bit line 44 is performed for the purpose of the readout operation, a stress voltage is not applied to the lower electrode 14 and the upper electrode 16 for a non-selected cell. Thereby, the potential difference due to the parasitic capacitance is not generated between the lower electrode 14 and the upper electrode 16 at the time of precharge. Therefore, it is possible to suppress the change in the resistance state of the insulating film 12, and to improve the reliability of the nonvolatile memory 100.

In addition, the time required to precharge to the bit line 44 does not lengthen due to the parasitic capacitance generated in the insulating film 12. Therefore, it is also possible to suppress the decrease in the speed of the readout operation.

In this manner, in the nonvolatile memory 100 according to the embodiment, it is confirmed that the positive voltage is preferably applied to the lower electrode 14 connected to the selection transistor 20 at the time of the readout operation.

Figure 12A:
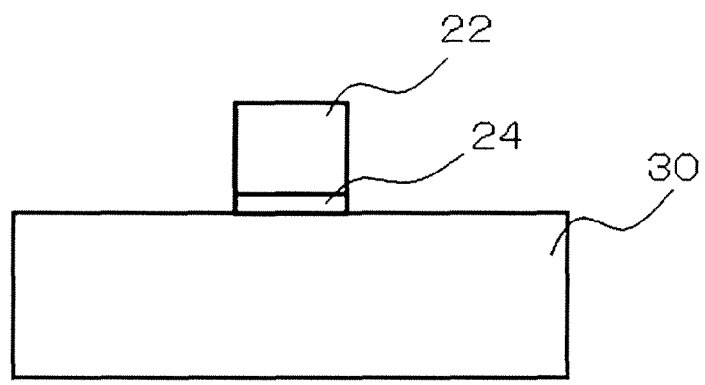
FIGS. 12A to 12C are cross-sectional views illustrating a method of manufacturing the nonvolatile memory shown in FIG. 1.

Next, a method of manufacturing the nonvolatile memory 100 according to the embodiment will be described. FIG. 12A to FIG. 14B are cross-sectional views illustrating a method of manufacturing the nonvolatile memory 100 shown in FIG. 1. First, as shown in FIG. 12A, the gate insulating film 24 and the gate electrode 22 are formed on the substrate 30. The gate insulating film 24 and the gate electrode 22 are formed, for example, by depositing a silicon oxide film and a polysilicon film with added phosphorus on the substrate 30 in this order, and patterning them using an exposure process and a dry etching process.

Figure 12B:
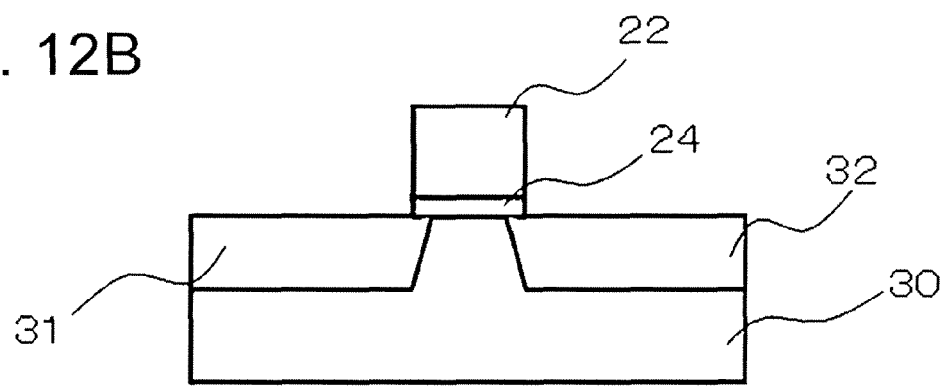
Figure 12C:
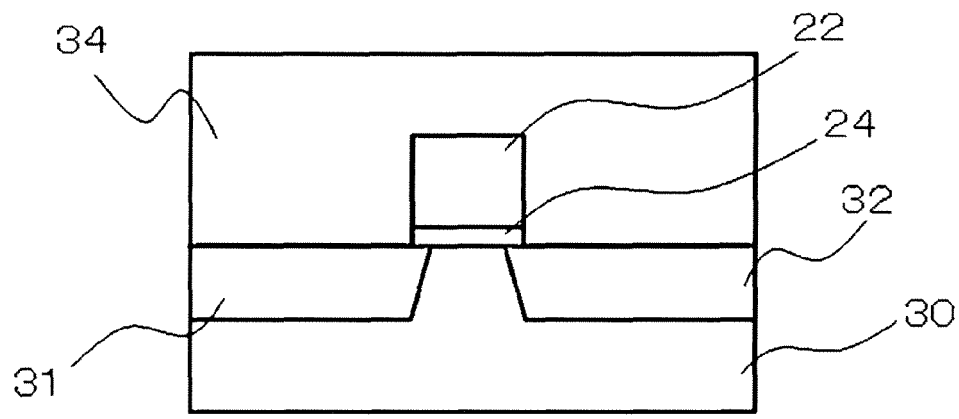

Next, as shown in FIG. 12B, the source/drain region 31 and the source/drain region 32 are formed on the substrate 30. The source/drain region 31 and the source/drain region 32 are formed, for example, by performing phosphorus implantation of the dose amount of $2 E+15 \text{ cm}^{-2}$ using the gate electrode 22 as a mask. Next, as shown in FIG. 12C, an insulating interlayer 34 is deposited on the substrate 30 and the gate electrode 22, and is planarized by a CMP method. The insulating interlayer 34 is formed of, for example, an oxide film such as a silicon oxide film.

Figure 13A:
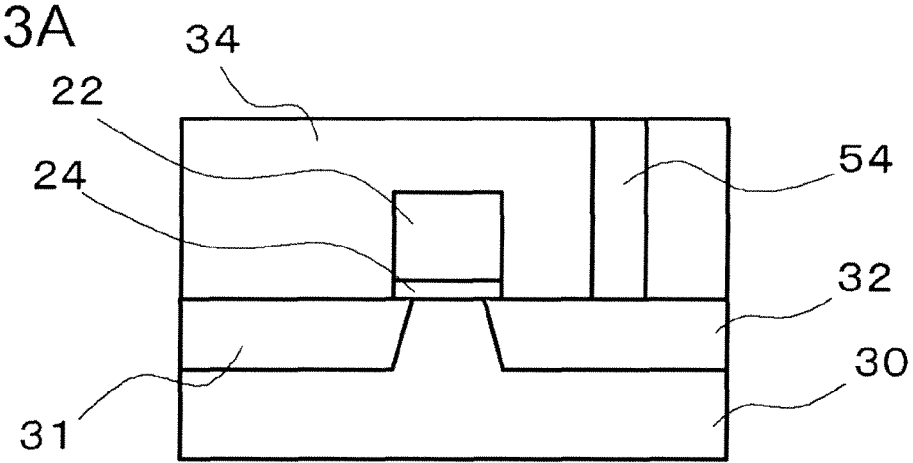
FIGS. 13A to 13C are cross-sectional views illustrating the method of manufacturing the nonvolatile memory shown in FIG. 1.

Next, as shown in FIG. 13A, the source/drain contact 54 connected to the source/drain region 32 is formed in the insulating interlayer 34. The source/drain contact 54 is formed, for example, as follows. First, a contact hole is opened in the insulating interlayer 34 using an exposure process and a dry etching process. Next, TiN and W are deposited within this contact hole. The source/drain contact 54 is formed by removing TiN and W deposited in the portion other than the inside of the contact hole by a CMP method.

Figure 13B:
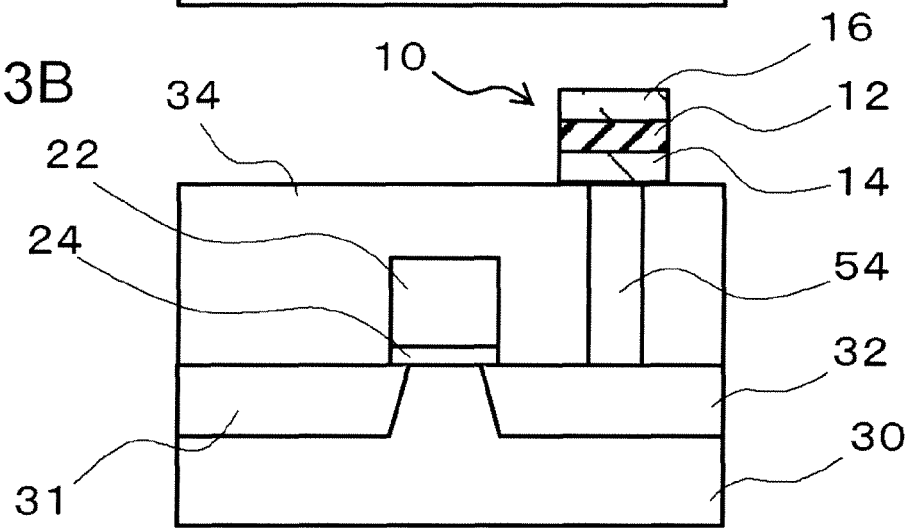

Next, as shown in FIG. 13B, the lower electrode 14, the insulating film 12 and the upper electrode 16 are formed in this order. In this case, the lower electrode 14 is formed so as to be connected to the source/drain contact 54. The lower electrode 14, the insulating film 12 and the upper electrode 16 are formed, for example, by performing an exposure process and a dry etching process on a laminated film in which W of 10 nm, $TiO_2$ of 3 nm, $Ta_2O_5$ of 10 nm, and Ru of 10 nm are laminated in this order on the insulating interlayer 34 and the source/drain contact 54. Thereby, the variable resistance device 10 is formed.

Figure 13C:
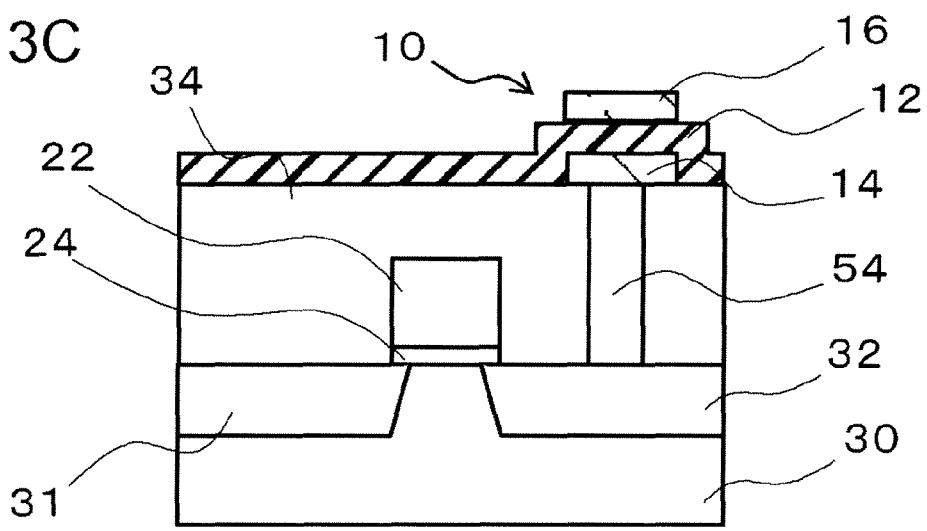

Meanwhile, the insulating film 12 does not necessarily have to be patterned. As shown in FIG. 13C, for example, the insulating film may be provided over the entire surface on the insulating interlayer 34 so as to cover the patterned lower electrode 14. That is, the insulating film 12 provided outside of the upper portion of the lower electrode 14 may remain integrally with the insulating interlayer 34. In this case, the variable resistance device 10 is constituted by the patterned lower electrode 14 and upper electrode 16, and the portion interposed between the lower electrode 14 and the upper electrode 16 in the insulating film 12.

Figure 14A:
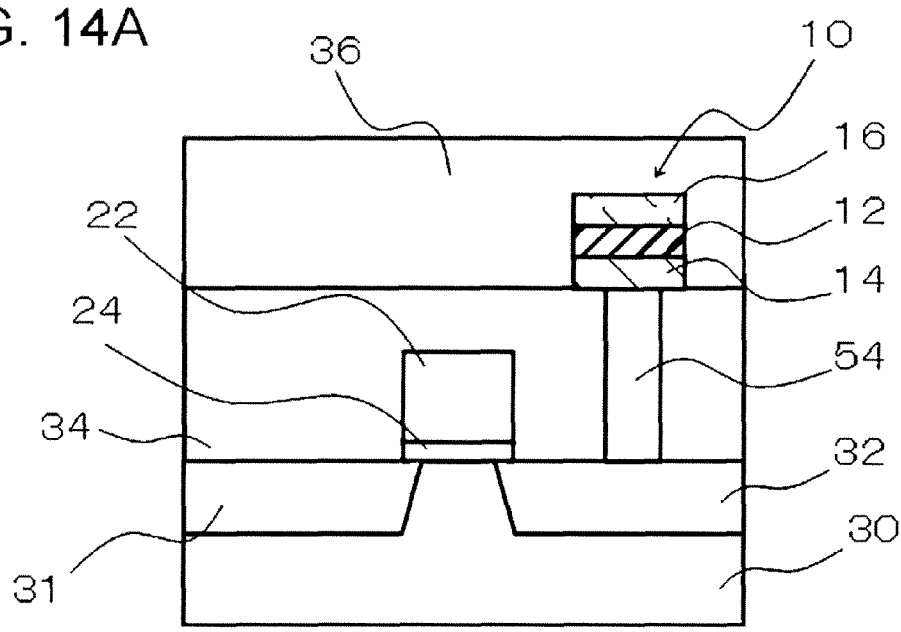
FIGS. 14A and 14B are cross-sectional views illustrating the method of manufacturing the nonvolatile memory shown in FIG. 1.
Figure 14B:
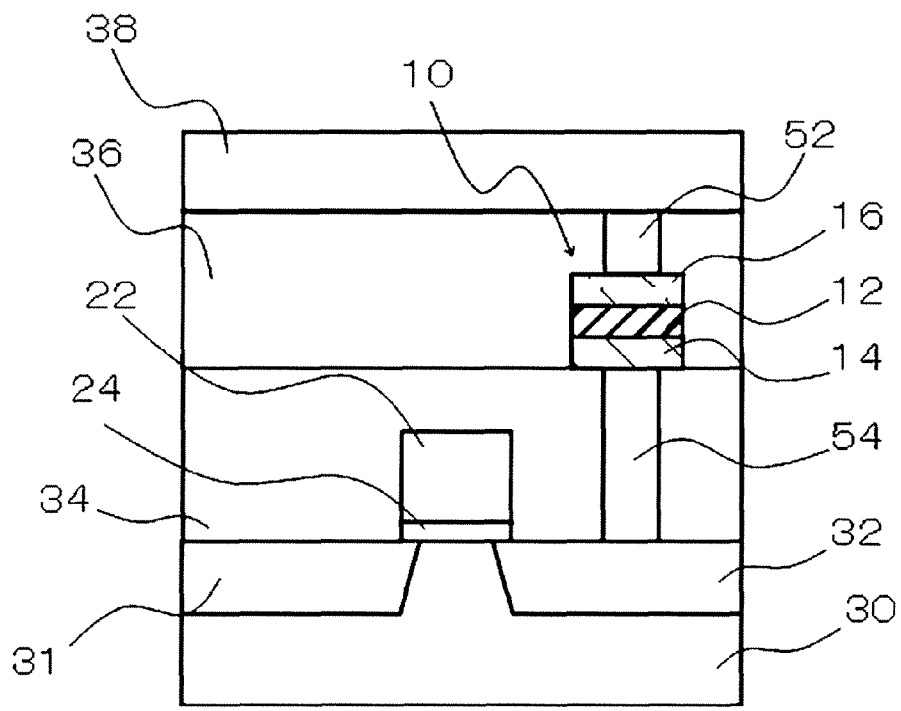

Next, as shown in FIG. 14A, an insulating interlayer 36 is deposited on the insulating interlayer 34 and the upper electrode 16, and is planarized by a CMP method. The insulating interlayer 36 is formed of, for example, an oxide film such as a silicon oxide film. Next, as shown in FIG. 14B, the plate contact 52 connected to the upper electrode 16 is formed within the insulating interlayer 36. The plate contact 52 is formed, for example, as follows. First, a contact hole is opened in the insulating interlayer 36 using an exposure process and a dry etching process. Next, TiN and W is deposited within this contact hole. The plate contact 52 is formed by removing TiN and W deposited in the portion other than the inside of the contact hole by a CMP method.

Next, as shown in FIG. 14B, an interconnect layer 38 is formed on the insulating interlayer 36 and the plate contact 52. The interconnect layer 38 is formed, for example, by patterning TiN and Al deposited on the insulating interlayer 36 and the plate contact 52 in this order using an exposure process and a dry etching process. In this manner, the nonvolatile memory 100 according to the embodiment is obtained.

Figure 29:
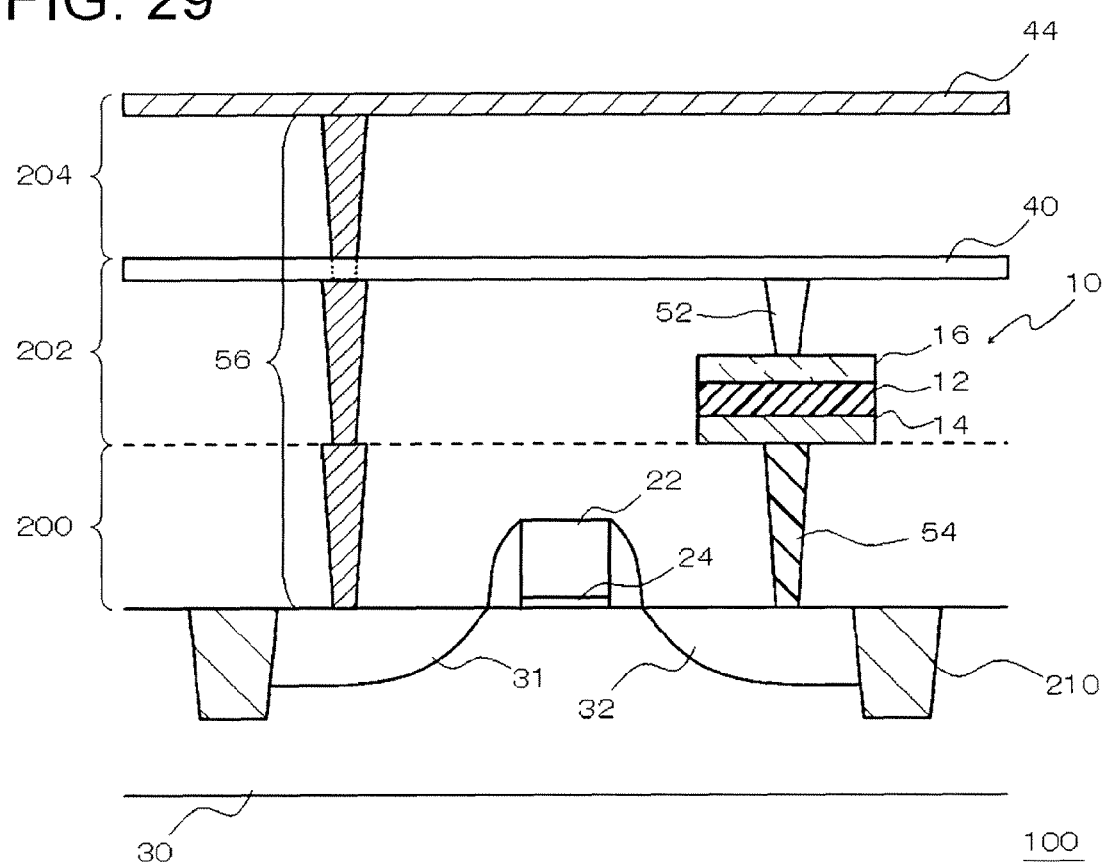
FIG. 29 is a side view illustrating the nonvolatile memory shown in FIG. 1.
Figure 30:
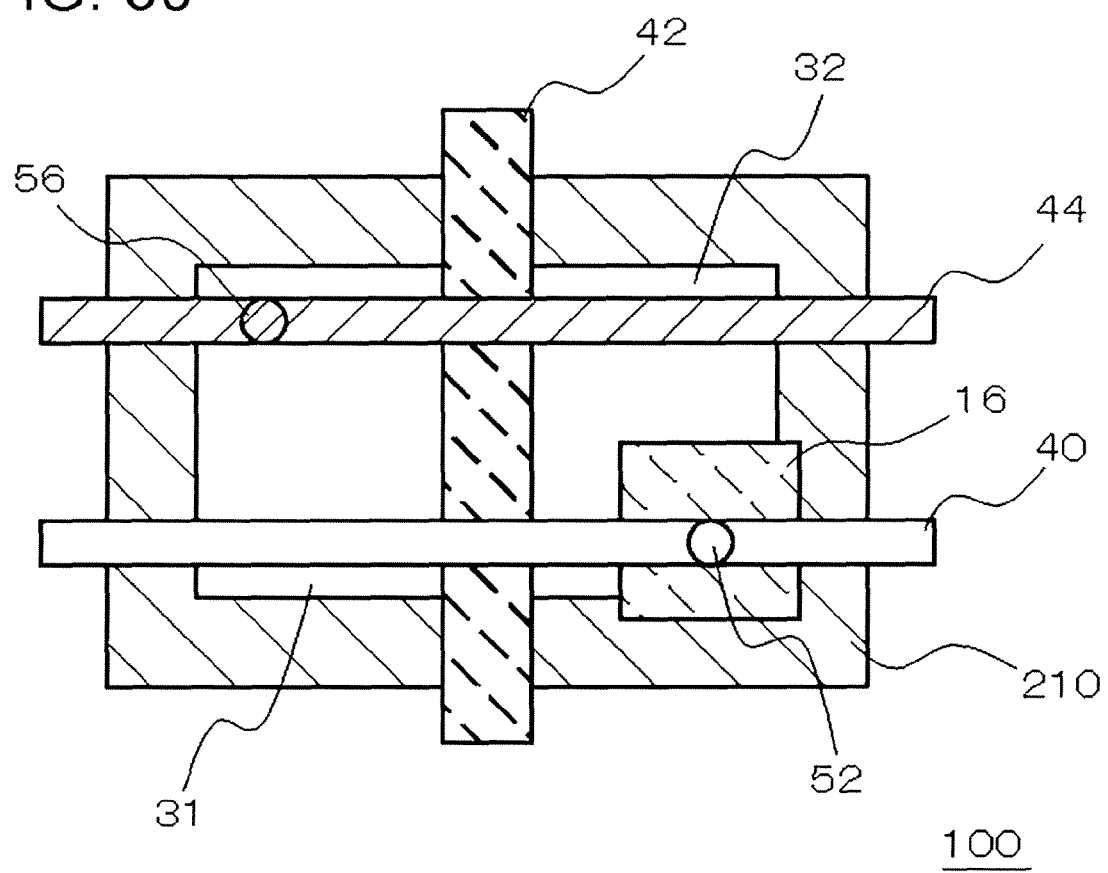
FIG. 30 is a top view illustrating the nonvolatile memory shown in FIG. 29.

FIG. 29 is a side view illustrating the nonvolatile memory 100 shown in FIG. 1. FIG. 30 is a top view illustrating the nonvolatile memory 100 shown in FIG. 29. FIG. 30 shows a structure when FIG. 29 is seen from the upper side in the drawing.

As shown in FIG. 29, the nonvolatile memory 100 includes the plate line 40 provided on the memory cell 11. In addition, the nonvolatile memory 100 includes the bit line 44 provided on the memory cell 11.

As shown in FIG. 30, the plate line 40 and the bit line 44 are provided, for example, so as to be parallel to each other. In addition, the word line 42 is provided, for example, so as to extend in the direction perpendicular to the plate line 40 and the bit line 44 in the plane horizontal to the planar surface of the substrate 30. Meanwhile, in the embodiment, the word line 42 functions as the gate electrode 22 shown in FIG. 29.

The upper electrode 16 is connected to the plate line 40 through the plate contact 52 provided on the upper electrode 16. The lower electrode 14 is connected to the source/drain region 32 through the source/drain contact 54 provided on the source/drain region 32. The source/drain region 31 is connected to the bit line 44 through a bit contact 56 provided on a source/drain region 31. The bit contact 56 in the embodiment is constituted, for example, by a plurality of contacts provided in each of the interconnect layers so as to be connected to each other, in the source/drain region 31.

As shown in FIG. 29, the nonvolatile memory 100 has a multilayer interconnect structure. Each of the interconnect layers includes, for example, an insulating interlayer formed of $SiO_2$ and the like. The variable resistance device 10 is disposed on a first interconnect layer 200 provided on the substrate 30.

In the multilayer interconnect structure, the design dimensions such as the line width or pitch of the interconnect increase as it goes to the top. For this reason, when the variable resistance device 10 is disposed in the upper layer of the multilayer connect structure, it is necessary to expand the layout of the variable resistance device 10 in accordance with the design dimensions of the upper-layer interconnect, which leads to being unsuitable for high integration of the variable resistance device 10 and eventually the nonvolatile memory 100. In order to dispose the variable resistance device 10 in the highest density, it is required to use the design dimensions used in a third interconnect layer 204 or the lower layer thereof. For this reason, the variable resistance device 10, the plate line 40, and the bit line 44 are preferably formed in a region of the substrate 30 side rather than the third interconnect layer 204.

According to the structure shown in FIG. 29, the variable resistance device 10 is disposed on the first interconnect layer 200, the plate line 40 is disposed on a second interconnect layer 202, and the bit line 44 is disposed on the third interconnect layer 204. For this reason, it is possible to achieve a high density of the variable resistance device 10 and eventually the nonvolatile memory 100.

In addition, the variable resistance device 10 is disposed on the first interconnect layer 200, thereby allowing the interconnect layer after the first interconnect layer 200 to be formed using a normal process of an LSI.

Unlike the structure shown in FIG. 29, the plate line 40 may be provided on the third interconnect layer 204, or the bit line 44 may be provided on the second interconnect layer 202. However, as shown in FIG. 29, it is more preferable that the plate line 40 is provided on the second interconnect layer 202, and the bit line 44 is provided on the third interconnect layer 204. This is because the bit line 44 is provided on the third interconnect layer 204 separated from the first interconnect layer 200, thereby allowing the bit line 44 to be separated from the variable resistance device 10 provided on the first interconnect layer 200. Thereby, it is possible to suppress the generation of a problem due to an increase in the parasitic capacitance between the bit line 44 and the variable resistance device 10, such as the obstruction of the detection of a tiny change in the potential in the variable resistance device.

Meanwhile, the plate line 40 is connected to a constant-voltage source. For this reason, even when the plate line 40 is provided on the second interconnect layer 202 adjacent to the first interconnect layer 200, a problem due to an increase in the parasitic capacitance does not occur.

Figure 31:
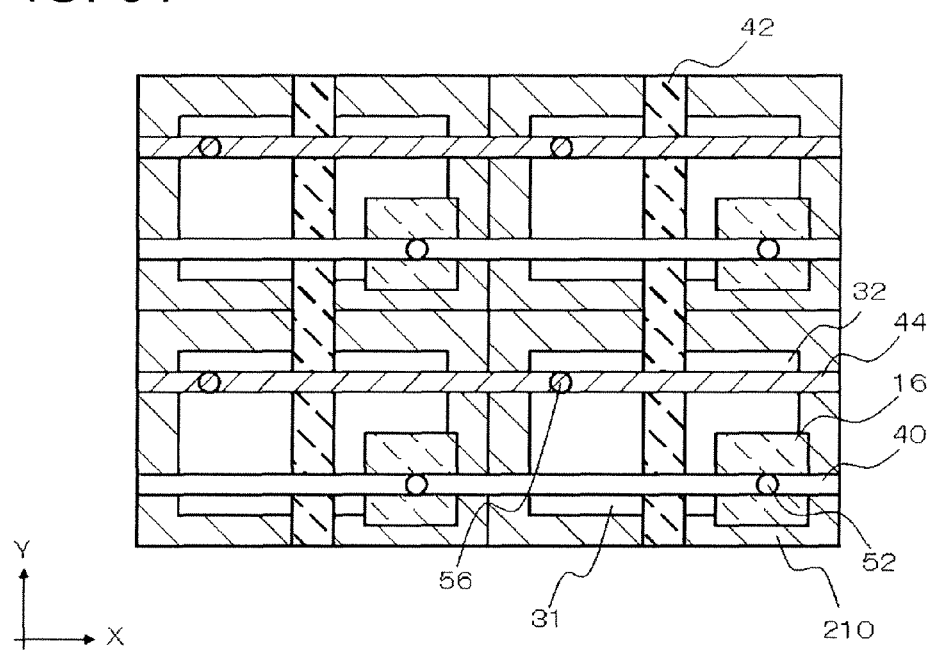
FIG. 31 is a top view illustrating a cell array structure constituting the nonvolatile memory according to the first embodiment.
Figure 32:
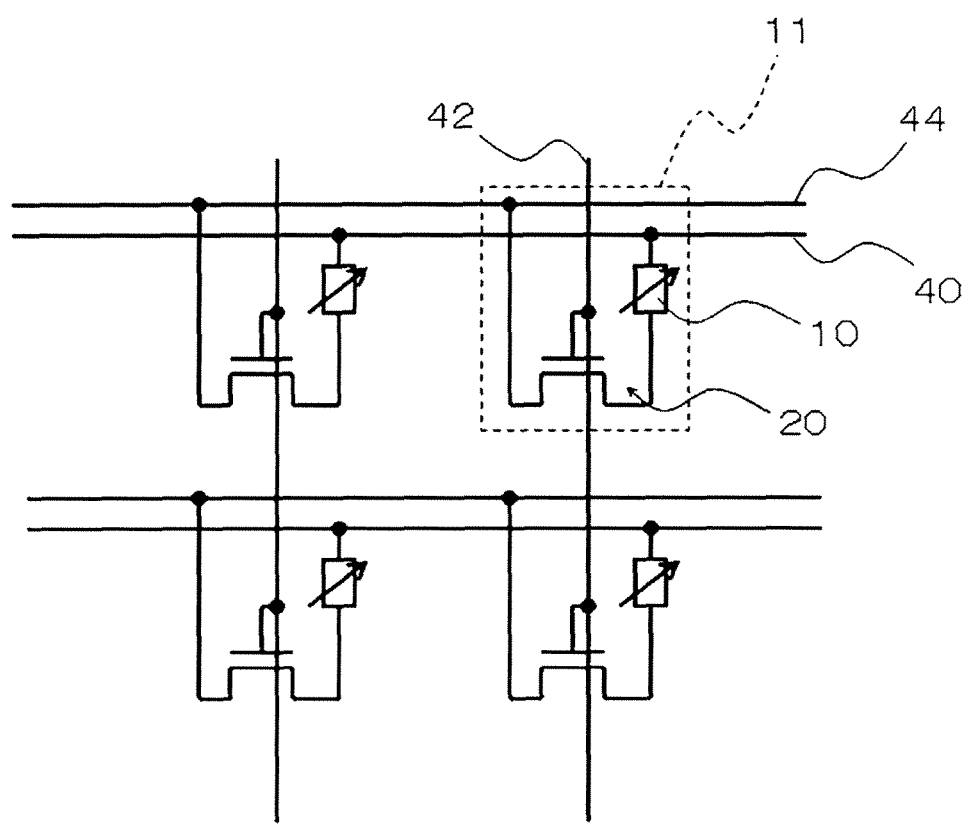
FIG. 32 is a circuit diagram illustrating the cell array structure shown in FIG. 31.

FIG. 31 is a top view illustrating a cell array structure constituting the nonvolatile memory 100 according to the embodiment, and shows a portion of the cell array structure. FIG. 32 is a circuit diagram illustrating the cell array structure shown in FIG. 31.

As shown in FIG. 31, the nonvolatile memory 100 according to the embodiment has a configuration in which a plurality of memory cells 11 is arranged in an array. A plurality of memory cells 11 is arranged, for example, in the X direction and the Y direction in the drawing. Meanwhile, the direction in which a plurality of memory cells 11 is arranged is not limited to the direction shown in FIG. 31.

As shown in FIGS. 31 and 32, the nonvolatile memory 100 includes a plurality of plate lines 40. The plate line 40 extends, for example, in the X direction in FIG. 31. In this case, the upper electrodes 16 included in each of a plurality of memory cells 11 arranged in the X direction in FIG. 31 are connected to the common plate line 40.

In addition, as shown in FIGS. 31 and 32, the nonvolatile memory 100 includes a plurality of bit lines 44. The bit line 44 extends, for example, in the X direction in FIG. 31. In this case, the source/drain regions 31 included in each of a plurality of memory cells 11 arranged in the X direction in FIG. 31 are connected to the common bit line 44.

Further, as shown in FIGS. 31 and 32, the nonvolatile memory 100 includes a plurality of word lines 42. The word line 42 extends, for example, in the Y direction in FIG. 31. In this case, the gate electrodes 22 included in each of a plurality of memory cells 11 arranged in the Y direction in FIG. 31 are connected to the common word line 42.

In the nonvolatile memory 100 according to the embodiment, the writing operation or the readout operation can be performed selectively on the specific memory cell 11 by selecting the specific word line 42, the specific bit line 44, and the specific plate line 40.

Figure 15:
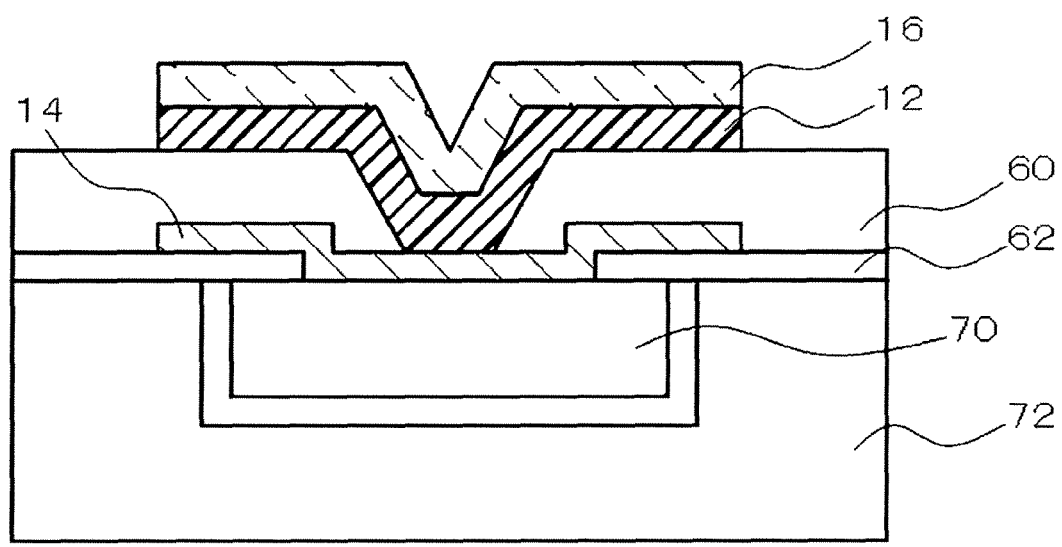
FIG. 15 is a cross-sectional view illustrating an example of a variable resistance device in the first embodiment.

FIG. 15 is a cross-sectional view illustrating an example of the variable resistance device 10 according to the embodiment. The variable resistance device 10 may have, for example, a structure shown in FIG. 15. The variable resistance device 10 shown in FIG. 15 is formed as follows. First, an insulating interlayer 62 is formed on an insulating interlayer 72, and on an interconnect 70 formed in the insulating interlayer 72. Next, an opening connected to the interconnect 70 is formed in the insulating interlayer 62. Next, the lower electrode 14 is formed on the insulating interlayer 62, and in the opening formed in the insulating interlayer 62. The lower electrode 14 is formed by performing an exposure process and a dry etching process on a metal film which is deposited on the insulating interlayer 62 and in the opening formed in the insulating interlayer 62. Next, an insulating interlayer 60 is formed on the insulating interlayer 62 and the lower electrode 14.

Next, an opening connected to the lower electrode 14 is formed in the insulating interlayer 60. The insulating film 12 and the upper electrode 16 are formed, in this order, on the insulating interlayer 60 and in the opening formed in the insulating interlayer 60. The insulating film 12 and the upper electrode 16 are formed by performing an exposure process and a dry etching process on an insulating film and a metal film which are deposited, in this order, on the insulating interlayer 60 and in the opening formed in the insulating interlayer 60. Thereby, the configuration shown in FIG. 15 is obtained. According to the configuration shown in FIG. 15, the insulating interlayer 62 is formed below the lower electrode 14, and the insulating interlayer 60 is formed below the insulating film 12 and the upper electrode 16. Consequently, in the process of forming the lower electrode 14, the insulating film 12 and the upper electrode 16, it is possible to suppress damage to the lower-layer structure by dry etching.

Figure 33:
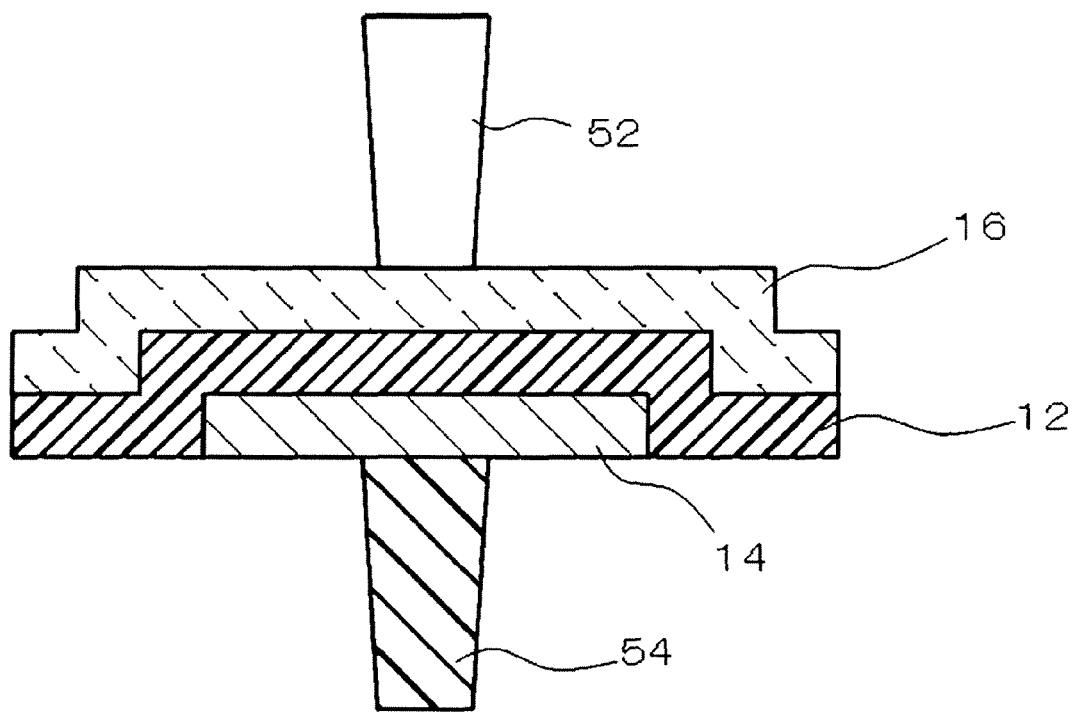
FIG. 33 is a cross-sectional view illustrating an example of the variable resistance device according to the embodiment.

FIG. 33 is a cross-sectional view illustrating an example of the variable resistance device 10 according to the embodiment, and shows an example different from FIG. 15. The variable resistance device 10 may have, for example, a structure shown in FIG. 33.

In the variable resistance device 10 shown in FIG. 33, the insulating film 12 is larger than the lower electrode 14 when seen in a plan view. As shown in FIG. 33, the insulating film 12 is provided so as to cover the upper surface and the lateral side of the lower electrode 14.

The variable resistance device 10 shown in FIG. 33 is formed, for example, as follows. First, the lower electrode 14 is formed on an interconnect layer having the source/drain contact 54. The lower electrode 14 is formed by patterning a metal film provided on the interconnect layer. Next, the insulating film 12 and the upper electrode 16 larger than the lower electrode 14 when seen in a plan view are formed on the lower electrode 14. The insulating film 12 and the upper electrode 16 are formed by patterning the insulating film and the metal film which are laminated on the above-mentioned interconnect layer in this order so as to cover the lower electrode 14.

According to the structure shown in FIG. 33, the insulating film 12 is provided so as to cover the upper surface and the lateral side of the lower electrode 14. For this reason, it is possible to suppress the occurrence of short-circuiting between the upper electrode 16 and the lower electrode 14. Therefore, it is possible to improve a yield ratio in manufacturing the nonvolatile memory.

Next, an effect of the embodiment will be described. In the nonvolatile memory 100 according to the embodiment, the first metal material constituting the lower electrode 14 has a normalized oxide formation energy higher than that of the second metal material constituting the upper electrode 16. For this reason, even when a positive voltage is applied to the lower electrode 14, the resistance state of the insulating film 12 does not change into the high-resistance state. In addition, the control unit 80 applies a positive voltage to the upper electrode 16 at the time of the operation of increasing the resistance value of the insulating film 12 and the operation of decreasing the resistance value thereof, and applies a positive voltage to the lower electrode 14 at the time of the operation of reading out the resistance value of the insulating film 12.

Therefore, it is possible to suppress the transition of the resistance state of the insulating film 12 to the high-resistance state at the time of the readout operation. For this reason, the readout operation can be performed using a sufficiently high voltage. Consequently, it is possible to provide a nonvolatile memory capable of realizing a high-speed operation while assuring the reliability.

Figure 24:
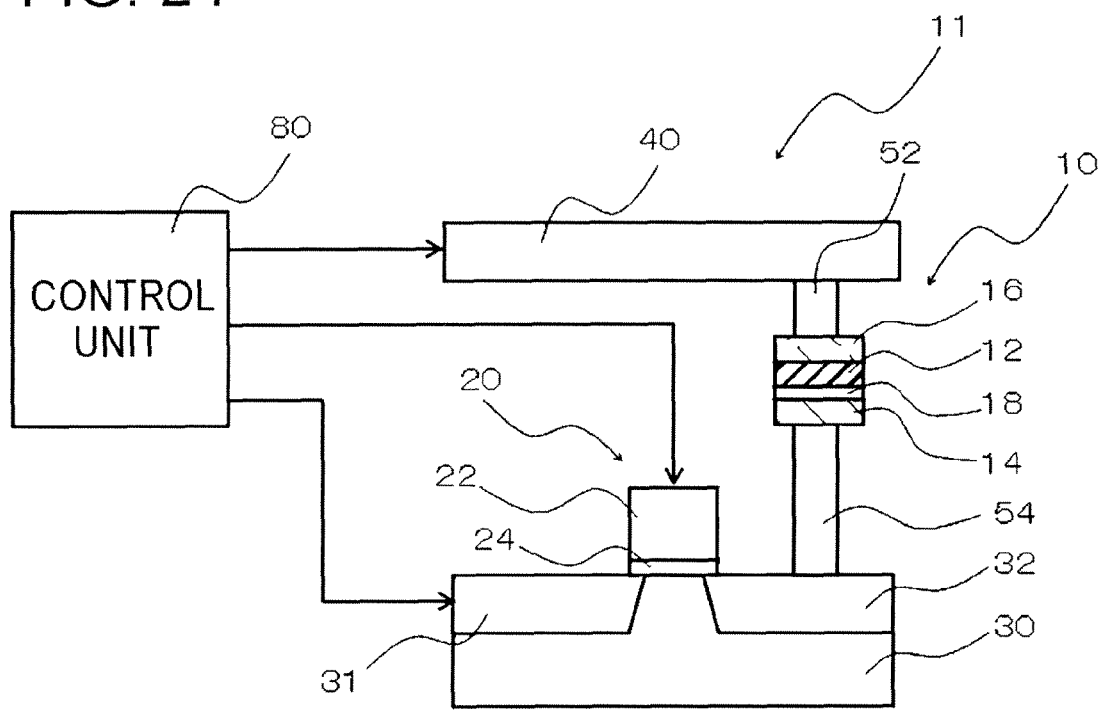
FIG. 24 is a cross-sectional view illustrating the nonvolatile memory according to a second embodiment.

FIG. 24 is a cross-sectional view illustrating a nonvolatile memory 102 according to a second embodiment, and corresponds to FIG. 1 in the first embodiment. The nonvolatile memory 102 according to the second embodiment has the same configuration as that of the nonvolatile memory 100 according to the first embodiment, except that the variable resistance device 10 includes an interfacial layer 18.

The interfacial layer 18 is provided between the lower electrode 14 and the insulating film 12. The stoichiometric composition of the interfacial layer 18 is expressed by $M_xO_y$, (M: metal element), whereas its composition ratio of oxygen to the metal element M which is smaller than y/x. For this reason, a great number of oxygen deficiencies exist in the interfacial layer 18. The interfacial layer 18 constitutes a variable resistance layer together with the insulating film 12.

For example, when tantalum oxide is used in the interfacial layer 18, the stoichiometric composition thereof is $Ta_2O_5$. In this case, in the interfacial layer 18, the composition ratio of oxygen to the metal element Ta is smaller than 5/2.

The thickness of the interfacial layer 18 is, for example, 1 to 3 nm. The interfacial layer 18 plays a role in suppressing OFF switching in the readout operation as described below, and preferably has a film thickness of appropriately 1 nm or more in order to exert an effect sufficiently. In addition, when the thickness of the interfacial layer 18 is excessively large, a problem occurs that the thickness of the entire variable resistance layer increases, and thus a forming voltage becomes excessively high. For this reason, when the thickness of the interfacial layer 18 is 1 to 3 nm, it is possible to suppress the influence of the interfacial layer 18 on the resistance change behavior of the nonvolatile memory 102.

Figure 25:
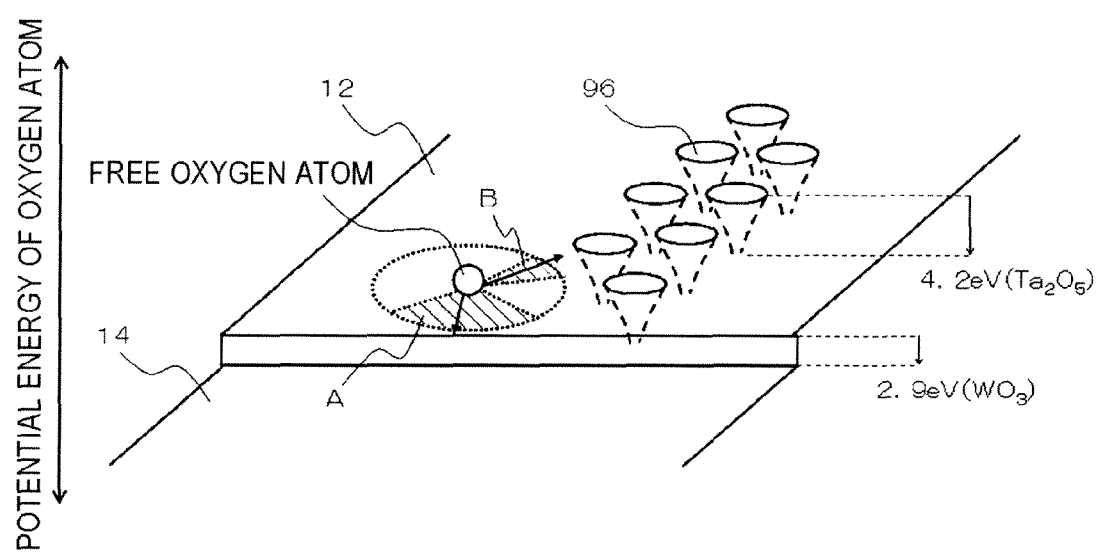
FIG. 25 is a schematic diagram for explaining behavior of oxygen atoms at the time of the readout operation.
Figure 26:
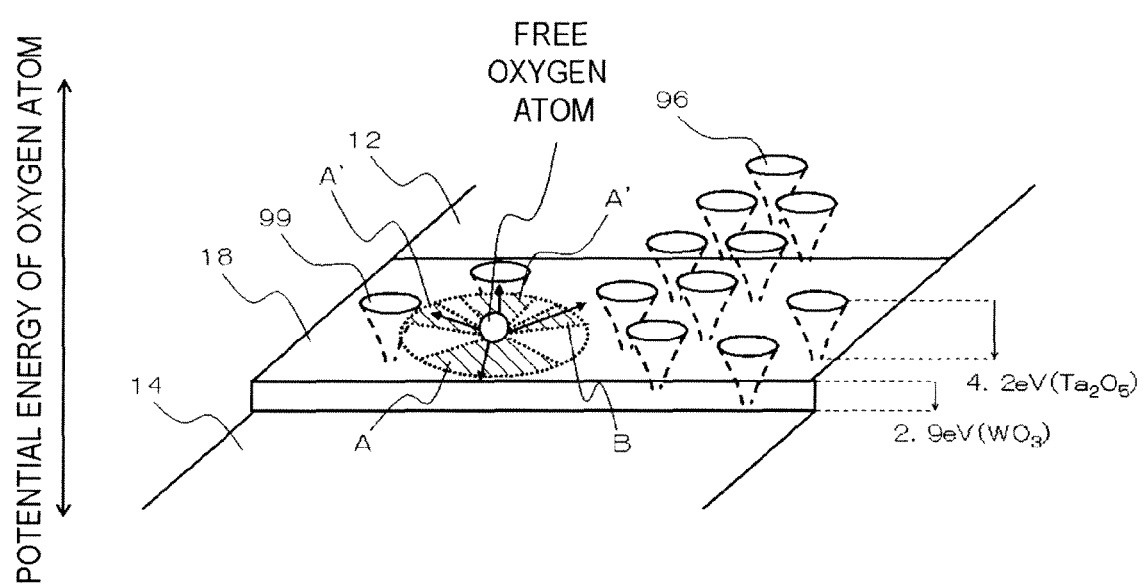
FIG. 26 is a schematic diagram for explaining the behavior of the oxygen atoms at the time of the readout operation.

FIGS. 25 and 26 are schematic diagrams for explaining behavior of oxygen atoms at the time of the readout operation, and show the behavior of oxygen atoms when the nonvolatile memory is in an ON state. In the structures shown in FIGS. 25 and 26, the insulating film 12 is $Ta_2O_5$, and the lower electrode 14 is W. In addition, in the structure shown in FIG. 26, the interfacial layer 18 is $Ta_2O_5$ having an oxygen composition ratio smaller than that of the stoichiometric composition.

In the nonvolatile memory in an ON state, the leak path including oxygen deficiencies is formed in the variable resistance layer. When the positive voltage is applied to the lower electrode at the time of the readout operation, the oxygen atoms located in the vicinity of the lower electrode in the variable resistance layer are thermally excited, and free oxygen atoms are generated in the variable resistance layer. When the free oxygen atoms reach the oxygen deficiencies which form the leak path, the oxygen deficiencies are eliminated, and the leak path is disconnected. In this case, the variable resistance layer becomes a high-resistance state. That is, the nonvolatile memory changes from an ON state to an OFF state.

In FIGS. 25 and 26, the vertical axes of the drawings denote potential energy of an oxygen atom, and show that the oxygen atom is in a high-energy state when it is located upward. When the free oxygen atom moves to a certain location of the oxygen vacancy and causes a reaction of compensating for the vacancy by oxidizing at the location, the oxygen atom is stabilized by the bond energy (4.2 eV) to a metal element constituting the variable resistance layer. Similarly, when the oxygen atom moves to the lower electrode 14 and causes a reaction of oxidizing an electrode material in the lower electrode, the oxygen atom is stabilized by the bond energy (2.9 eV) to a metal element constituting the lower electrode 14. For this reason, the free oxygen atom in the variable resistance layer moves to the more stable oxygen vacancy or the lower electrode 14.

In FIG. 25, the shaded portion A shows a path in which the free oxygen atom can reach the lower electrode 14. In addition, the shaded portion B shows a path in which the free oxygen atom can reach oxygen deficiencies 96 which form the leak path. In addition, in FIG. 26, the shaded portion A' shows a path in which the free oxygen atom can reach oxygen deficiencies 99 which do not concern the leak path.

In the nonvolatile memory shown in FIG. 25, since the free oxygen atom in the insulating film 12 is considered to move randomly, the probability of the oxygen atom moving to the lower electrode is proportional to the area of the shaded portion A of FIG. 25, and the probability of the oxygen atom moving the nearest oxygen vacancy 96 constituting the leak path is proportional to the area of the shaded portion B of FIG. 25. As shown in FIG. 25, the area of the shaded portion A is larger than the area of the shaded portion B. For this reason, free oxygen generated in the vicinity of the lower electrode 14 has higher probability to move toward the lower electrode 14 than that toward the oxygen deficiencies 96 which form the leak path. Further, the probability of causing an oxidation reaction at the movement destination becomes higher as the energy obtained at the time of stabilization increases. For this reason, as obtained in paragraph 0031, as the oxide formation energy of the lower electrode increases the possibility of the free oxygen causing the oxidation reaction in the lower electrode becomes higher, and as a result the probability of eliminating the oxygen vacancy becomes lower. However, since the complete exclusion of the probability of causing the reaction by the movement of free oxygen to the oxygen deficiencies 96 which form the leak path may not be possible, there is concern that the leak path may be disconnected by the oxygen atoms free in the insulating film 12. In this case, the resistance state of the nonvolatile memory changes at the time of the readout operation.

FIG. 26 shows the nonvolatile memory 102 according to the embodiment. According to the embodiment, the nonvolatile memory 102 includes the interfacial layer 18 having many oxygen deficiencies between the lower electrode 14 and the insulating film 12. In this case, in the nonvolatile memory 102 of an ON state, a great number of oxygen deficiencies 99 which do not form the leak path exist in the interfacial layer 18. For this reason, the probability of a free oxygen atom in the variable resistance layer moving to the oxygen deficiencies 99 which do not form the leak path occurs. Here, the probability of the oxygen atom moving to the oxygen deficiencies 99 which do not form the leak path is proportional to the area of the shaded portion A' in FIG. 26.

In this manner, according to the embodiment, the oxygen atom free in the variable resistance layer can sufficiently lower the probability of the movement to the oxygen deficiencies 96 which form the leak path. Therefore, it is possible to suppress the transition of the resistance state of the variable resistance layer at the time of the readout operation.

In addition, according to the nonvolatile memory of the embodiment, the interfacial layer whose stoichiometric composition is expressed by $M_xO_y$, (M: metal element) has a composition ratio of oxygen to the metal element M which is smaller than y/x. For this reason, it is possible to reduce the number of free oxygen in the variable resistance layer generated in the vicinity of the lower electrode 14. Thereby, it is possible to further suppress the transition of the resistance state of the variable resistance layer at the time of the readout operation.

Figure 27A:
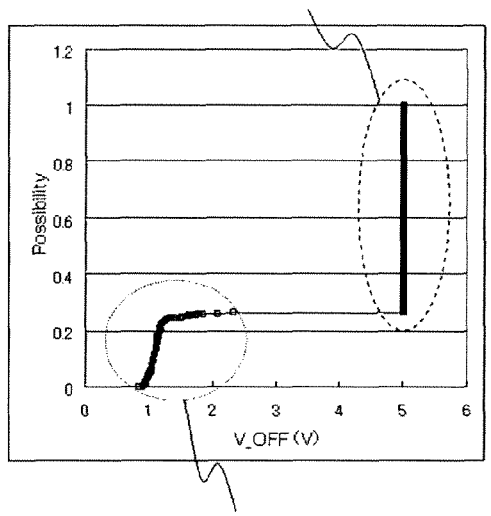
FIGS. 27A and 27B are graphs illustrating the rate of the occurrence of the transition to an OFF state at the time of the readout operation.
Figure 27B:
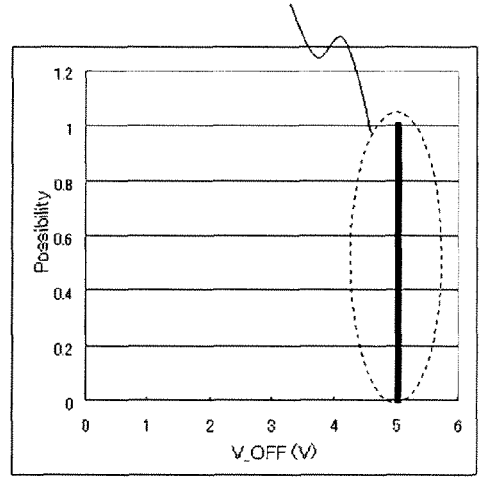

FIGS. 27A and 27B are graphs illustrating the rate of the occurrence of the transition to an OFF state at the time of the readout operation. FIG. 27A shows a case in which there is no interfacial layer 18. And, FIG. 27B shows a case in which there is the interfacial layer 18. In FIGS. 27A and 27B, the nonvolatile memory is used in which Ru is used in the upper electrode 16, $Ta_2O_5$ is used in the insulating film 12, and W is used in the lower electrode 14. The horizontal axes thereof show readout voltage V_OFF at which the transition to an OFF state is observed, and the vertical axes show the rate at which the transition to an OFF state is observed when the readout voltage is applied to the lower electrode 14 of the nonvolatile memory in an ON state.

In FIGS. 27A and 27B, readout voltages V_OFF at which the transition to an OFF state is observed are respectively plotted for all the measured devices (1000 pieces). Meanwhile, the plotted point whose V_OFF is 5 V indicates the transition to an OFF state is not observed even when the readout voltage is applied up to 5 V.

As shown in FIGS. 27A and 27B, when there is no interfacial layer 18, approximately 20 percent of the nonvolatile memory shows the transition to an OFF state by the readout voltage of around 1 V. On the other hand, when there is the interfacial layer 18, the transition to an OFF state is not observed even in the case where the readout voltage is applied up to 5 V.

The nonvolatile memory according to a third embodiment has the same configuration as that of the nonvolatile memory 102 according to the second embodiment, except that the material of the interfacial layer 18 is different.

In the embodiment, the interfacial layer 18 is made of a metal oxide of which the electronic density of states at the conduction band minimum is equal to or smaller than the electronic density of states at the valence band maximum.

In the metal oxide, generally, the valence band is formed of a 2p orbital of the oxygen atom, and the conduction band is formed of an outermost orbital of the metal element. For this reason, as the interfacial layer 18, it is preferable to use a material in which the conduction band is formed of an s orbital or a p orbital. In this case, the interfacial layer 18 is formed of a metal oxide of which the electronic density of states at the conduction band minimum is equal to or smaller than the electronic density of states at the valence band maximum.

The interfacial layer 18 is, for example, a layer formed of MgO, CaO, $Al_2O_3$, $Ga_2O_3$, or $SiO_2$, or a layer including at least one of MgO, CaO, $Al_2O_3$, $Ga_2O_3$, and $SiO_2$.

According to the embodiment, the interfacial layer 18 is a metal oxide of which the electronic density of states at the conduction band minimum is the same as or smaller than the electronic density of states at the valence band maximum. Generally, the Fermi level of an insulating film has a property in which it leans toward either the valence band or the conduction band having the smaller electronic density of states. For this reason, the Fermi level of the variable resistance layer according to the embodiment leans toward the conduction band side.

When the Fermi level of the variable resistance layer leans toward the conduction band side, the variable resistance layer tends to show an n-type property. That is, the variable resistance layer is in a state where electrons are supplied easily to the periphery thereof. For this reason, free oxygen generated when the Fermi level of the variable resistance layer leans toward the conduction band side tends to be negatively charged by receiving electrons from the variable resistance layer.

Figure 28:
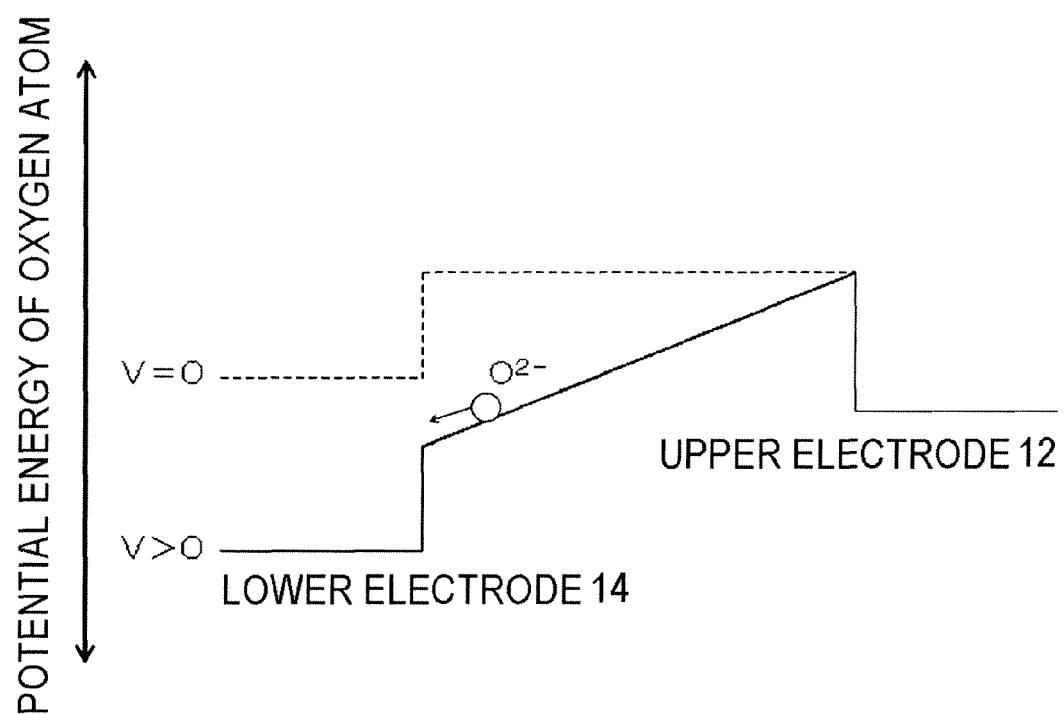
FIG. 28 is a diagram for explaining behavior of negatively-charged free oxygen.

FIG. 28 is a diagram for explaining behavior of negatively-charged free oxygen. The vertical axis of FIG. 28 denotes potential energy of an oxygen atom, and shows that the oxygen atom is in a high-energy state as it is located upward. Here, V in FIG. 28 denotes a voltage to be applied to the lower electrode 14.

As shown in FIG. 28, when the positive voltage is applied to the lower electrode 14, the potential energy of the negatively-charged free oxygen decreases in the lower electrode 14 side. For this reason, at the time of the readout operation of applying the positive voltage to the lower electrode 14, different from those of the first and second embodiments, the negatively-charged free oxygen atom is attracted to the lower electrode 14 side having a low potential energy without moving in the random direction. Thereby, the elimination of the oxygen vacancy 96 which form the leak path by the free oxygen atom in the variable resistance layer is suppressed. Therefore, it is possible to suppress the transition of the resistance state of the variable resistance layer at the time of the readout operation.

In addition, similarly to the second embodiment, the interfacial layer 18 may be configured to have a composition expressed by $M_xO_y$ (M: metal element) as a stoichiometric composition, and have a composition ratio of oxygen to the metal element M which is smaller than y/x. When the interfacial layer 18 has $Al_2O_3$ as a stoichiometric composition, the composition ratio of oxygen to the metal element Al becomes smaller than 3/2. Thereby, it is possible to obtain the same effect as that of the second embodiment.

The nonvolatile memory according to a fourth embodiment has the same configuration as the nonvolatile memory according to the second embodiment, except that the material of the interfacial layer 18 is different.

In the embodiment, the interfacial layer 18 is formed of an oxide of the metal material having a valence lower than that of the metal material constituting the insulating film 12. That is, when the insulating film 12 is a metal oxide having a trivalent metal such as $Al_2O_3$, $Y_2O_3$, and $La_2O_3$, the interfacial layer 18 can be formed of, for example, a metal oxide having a divalent or lower metal such as MgO or CaO. In this case, the interfacial layer 18 is a layer formed of MgO or CaO, or a layer including at least one of MgO and CaO.

When the insulating film 12 is a metal oxide having a quadrivalent metal such as $TiO_2$, $ZrO_2$, and $HfO_2$, the interfacial layer 18 can be formed of, for example, a metal oxide having a trivalent or lower metal such as MgO, CaO, $Al_2O_3$, $Y_2O_3$, or $La_2O_3$. In this case, the interfacial layer 18 is a layer formed of MgO, CaO, $Al_2O_3$, $Y_2O_3$, or $La_2O_3$, or a layer including at least one of MgO, CaO, $Al_2O_3$, $Y_2O_3$, and $La_2O_3$.

Further, when the insulating film 12 is a metal oxide having a pentavalent metal such as $V_2O_5$ and $Ta_2O_5$, the interfacial layer 18 can be formed of, for example, a metal oxide having a quadrivalent or lower metal such as MgO, CaO, $Al_2O_3$, $Y_2O_3$, $La_2O_3$, $TiO_2$, $ZrO_2$, and $HfO_2$. In this case, the interfacial layer 18 is a layer formed of MgO, CaO, $Al_2O$, $Y_2O_3$, $La_2O_3$, $TiO_2$, $ZrO_2$, or $HfO_2$, or a layer including at least one of MgO, CaO, $Al_2O_3$, $Y_2O_3$, $La_2O_3$, $TiO_2$, $ZrO_2$, and $HfO_2$.

According to the embodiment, the interfacial layer 18 is formed of an oxide of the metal material having a valence lower than that of the metal material constituting the insulating film 12. For this reason, when the metal material constituting the insulating film 12 is mixed with the interfacial layer 18, the metal material constituting the insulating film 12 behaves as a donor. In this case, the Fermi level of the variable resistance layer comes close to the donor level. That is, the Fermi level of the variable resistance layer leans toward the conduction band side. In this case, free oxygen in the variable resistance layer tends to be negatively charged for the same reason as explained in the third embodiment.

At the time of the readout operation of applying a positive voltage to the lower electrode 14, the negatively-charged free oxygen atom is attracted to the lower electrode 14. Thereby, the elimination of the oxygen vacancy forming the leak path by the free oxygen atom in the variable resistance layer is suppressed. Therefore, it is possible to suppress the transition of the resistance state of the variable resistance layer at the time of the readout operation.

And similarly to the second embodiment, the interfacial layer 18 whose stoichiometric composition is expressed by $M_xO_y$, metal element) may be configured to have a composition ratio oxygen to the metal element M which is smaller than y/x. When the stoichiometric composition of interfacial layer 18 is $TiO_2$, the composition ratio of oxygen to the metal element Ti becomes smaller than 2. Thereby, it is possible to obtain the same effect as that of the second embodiment.

The nonvolatile memory according to a fifth embodiment has the same configuration as that of the nonvolatile memory according to the second embodiment, except that the material of the interfacial layer 18 is different.

In the embodiment, the interfacial layer 18 has an impurity functioning as a donor. When the interfacial layer 18 is formed of for example $TiO_2$, pentavalent Ta or V, or hexavalent W and the like having a valence higher than that of quadrivalent Ti are added to the interfacial layer 18, thereby allowing the interfacial layer 18 having an impurity functioning as a donor to be realized.

The interfacial layer 18 can be formed of, for example, the same material as that of the insulating film 12. In addition, the interfacial layer 18 may be formed of a material different from that of the insulating film 12. Further, the impurity functioning as a donor may be the same or different from the material constituting the insulating film 12.

The interfacial layer 18 is formed of, for example, a portion of the insulating film 12 to which the impurity functioning as a donor is added. Or, the interfacial layer 18 may be provided by forming a film on the lower electrode 14.

According to the embodiment, the Fermi level of the variable resistance layer in the vicinity of the lower electrode 14 leans toward the conduction band side due to the added donor. In this case, similarly to the fourth embodiment, the free oxygen in the variable resistance layer tends to be negatively charged. Thereby, at the time of the readout operation of applying a positive voltage to the lower electrode 14, the negatively-charged free oxygen atom is attracted to the lower electrode 14. For this reason, the elimination of the oxygen vacancy forming the leak path by the free oxygen atom in the variable resistance layer is suppressed. Therefore, it is possible to suppress the transition of the resistance state of the variable resistance layer at the time of the readout operation.

Figure 34:
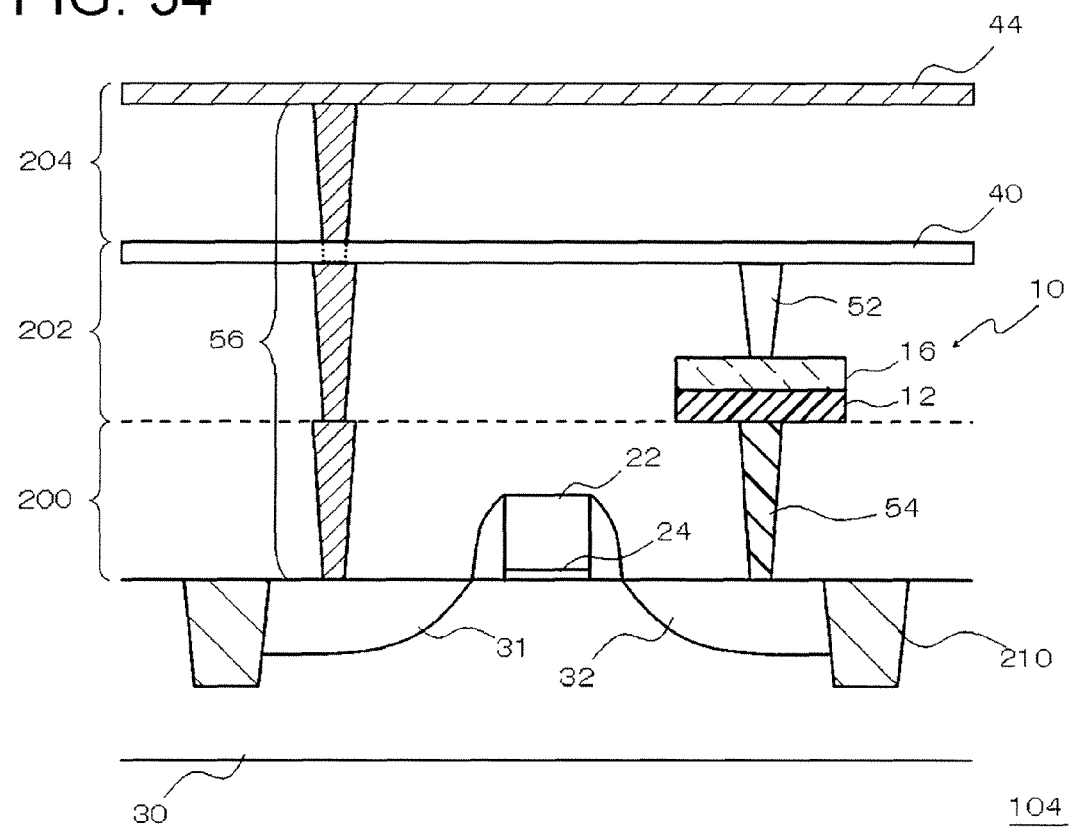
FIG. 34 is a side view illustrating the nonvolatile memory according to a sixth embodiment.

FIG. 34 is a side view illustrating a nonvolatile memory 104 according to a sixth embodiment, and corresponds to FIG. 29 according to the first embodiment. The nonvolatile memory 104 according to the embodiment has the same configuration as that of the nonvolatile memory 100 according to the first embodiment, except for the configuration of the variable resistance device 10.

In the embodiment, the lower electrode of the variable resistance device 10 is constituted by the source/drain contact 54 that connects the insulating film 12 and the source/drain region 32.

As shown in FIG. 34, the nonvolatile memory 104 according to the embodiment does not have the lower electrode 14. In addition, the insulating film 12 which is a variable resistance layer is directly connected to the source/drain contact 54 provided in the first interconnect layer 200. In the embodiment, the upper end of the source/drain contact 54 is set to function as the lower electrode of the variable resistance device 10. That is, the variable resistance device 10 is constituted by the source/drain contact 54, the insulating film 12 and the upper electrode 16.

In the embodiment, the source/drain contact 54 constituting the lower electrode is smaller than the upper electrode 16 when seen in a plan view.

Figure 35:
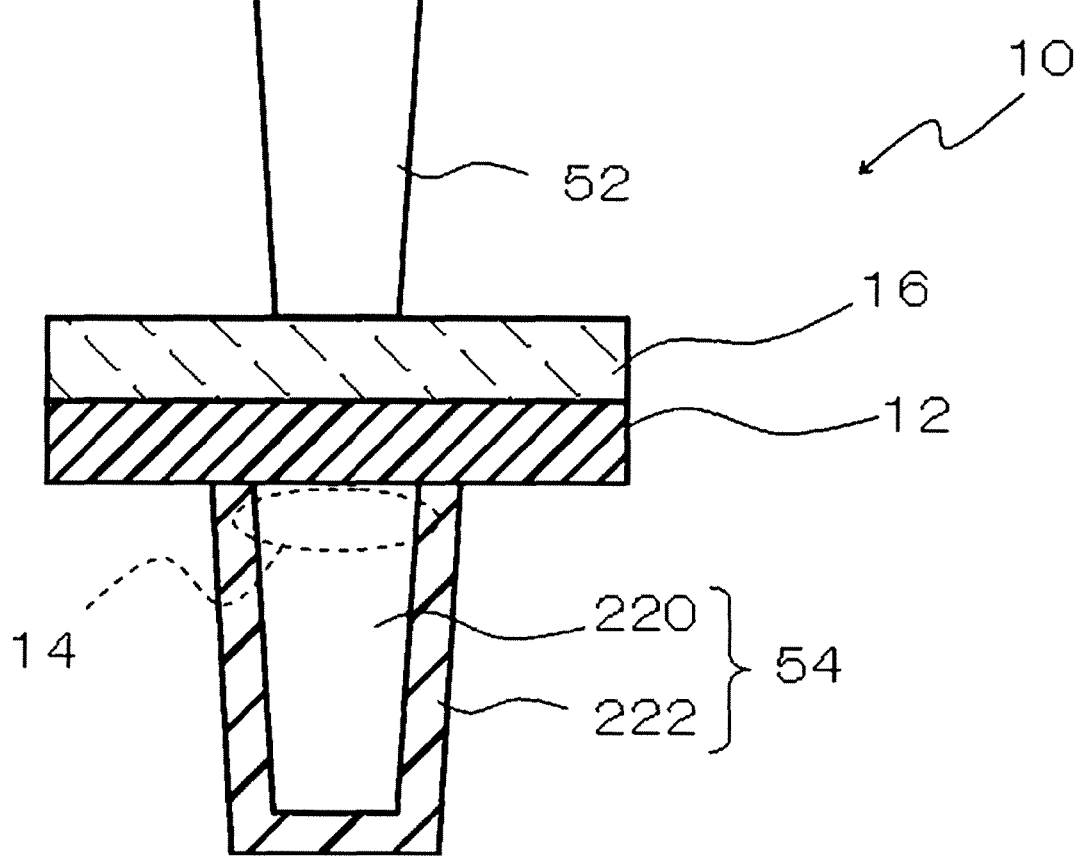
FIG. 35 is a cross-sectional view illustrating the variable resistance device shown in FIG. 34.

FIG. 35 is a cross-sectional view illustrating the variable resistance device 10 shown in FIG. 34. As shown in FIG. 35, the source/drain contact 54 is constituted by a metal film 220, and a barrier metal film 222 provided so as to cover the lateral side and the lower surface of the metal film 220. The source/drain contact 54 is formed within, for example, an opening provided in the first interconnect layer 200.

As shown in FIG. 35, in the embodiment, the upper end of the source/drain contact 54 constituted by the metal film 220 and the barrier metal film 222 functions as the lower electrode 14 in the first embodiment.

In the embodiment, the metal film 220 is formed of, for example, W or Cu and the like, and the barrier metal film 222 is formed of, for example, TiN and the like. Meanwhile, the material of the source/drain contact 54 can be appropriately selected in consideration of the relationship of the normalized oxide formation energy between the upper electrode and the lower electrode as mentioned in the first embodiment.

In the embodiment, it is also possible to obtain the same effect as that of the first embodiment.

In addition, according to the embodiment, there is no lower electrode 14. For this reason, the process of forming the lower electrode 14 can be omitted. Therefore, the nonvolatile memory is easily manufactured.

When the lower electrode 14 is separately formed on the source/drain contact 54, it is necessary to make the size of the lower electrode 14 larger than the diameter of the source/drain contact 54, in order to avoid a problem such as the variation in the dimensions or the alignment dislocation. In addition, it is necessary to make the areas of the upper electrode 16 and the insulating film 12 larger than that of the lower electrode 14, for example, as shown in FIG. 33, in order to prevent short-circuiting between the upper and lower electrodes. In such a case, the entire area of the variable resistance device 10 increases.

On the other hand, according to the embodiment, the lower electrode of the variable resistance device 10 is constituted by the source/drain contact 54. For this reason, by making the insulating film 12 and the upper electrode 16 slightly larger than that of the source/drain contact 54, it is possible to avoid a problem such as the variation in the dimensions or the alignment dislocation, and to prevent short-circuiting between the upper and lower electrodes. In this case, the area of the variable resistance device 10 is specified by the upper electrode 16 having an area slightly larger than the diameter of the source/drain contact 54. Therefore, the variable resistance device and the memory cell can be miniaturized. In addition, it is possible to prevent short-circuiting between the upper and lower electrodes without a complicated process.

Figure 68A:
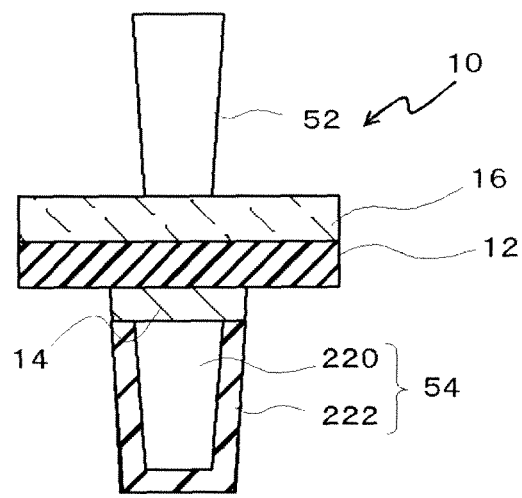
FIGS. 68A and 68B are cross-sectional views illustrating a modified example of the variable resistance device shown in FIG. 35.
Figure 68B:
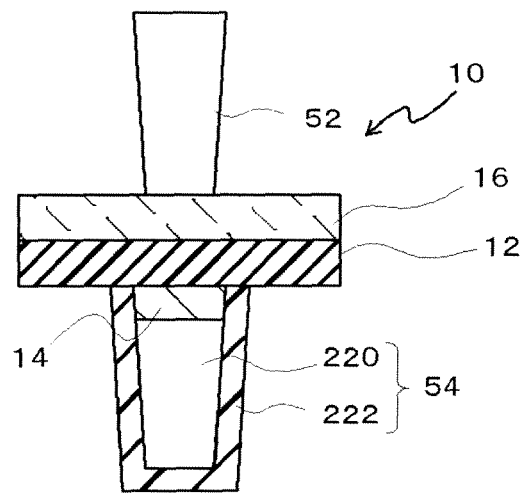

FIGS. 68A and 68B are cross-sectional views illustrating a modified example of the variable resistance device 10 shown in FIG. 35. As shown in FIGS. 68A and 68B, the variable resistance device 10 according to the embodiment may a configuration in which the lower electrode 14 is buried in the upper end of a contact hole for burying the source/drain contact 54. In this case, the source/drain contact is constituted by the metal film 220, the barrier metal film 222, and the lower electrode 14.

The variable resistance device 10 according to the modified example shown in FIG. 68A is formed as follows. That is, after the source/drain contact 54 is formed, the portion of metal film 220 and the barrier metal film 222 which are located at the upper end of the contact hole are etched back. Next, the lower electrode 14 is buried within the concave portion formed by the etching process.

And the variable resistance device 10 according to the modified example shown in FIG. 68B is formed as follows. That is, after the source/drain contact 54 is formed, only the portion of the metal film 220 located at the upper end of the contact hole is etched back. Next, the lower electrode 14 is buried within the concave portion formed by the etching process. In this case, the barrier metal film 222 remains around the lower electrode 14.

According to the structure of the modified example, an arbitrary material can be selected as the lower electrode 14. For this reason, even when the material of the metal film constituting the contact is limited, a suitable material can be selected as the lower electrode. Moreover, in this case, the effect in the sixth embodiment is also obtained.

Figure 36:
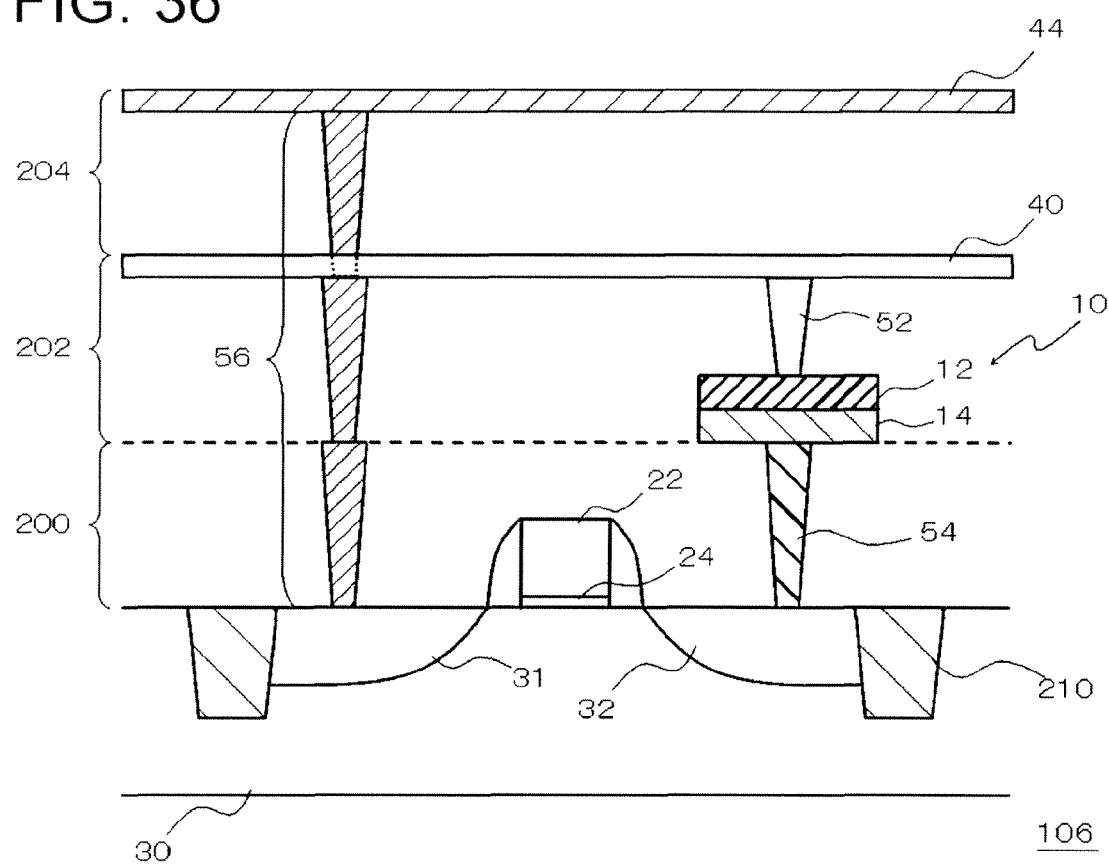
FIG. 36 is a side view illustrating the nonvolatile memory according to a seventh embodiment.

FIG. 36 is a side view illustrating a nonvolatile memory 106 according to a seventh embodiment, and corresponds to FIG. 29 according to the first embodiment. The nonvolatile memory 106 according to the embodiment has the same configuration as the nonvolatile memory 100 according to the first embodiment, except for the configuration of the variable resistance device 10.

In the embodiment, the upper electrode of the variable resistance device 10 is constituted by the plate contact 52 that connects the plate line 40 and the insulating film 12.

As shown in FIG. 36, the nonvolatile memory 106 according to the embodiment does not have the upper electrode 16 shown in the first embodiment. And the insulating film 12 which is a variable resistance layer is directly connected to the plate contact 52 provided in the second interconnect layer 202. In the embodiment, the lower end of the plate contact 52 is set to function as the upper electrode of the variable resistance device 10. That is, the variable resistance device 10 is constituted by the lower electrode 14, the insulating film 12 and the plate contact 52.

Meanwhile, the plate contact 52 constituting the upper electrode is smaller than the lower electrode 14 when seen in a plan view.

FIGS. 37A and 37B are cross-sectional views illustrating the variable resistance device 10 shown in FIG. 36. As shown in FIGS. 37A and 37B, the plate contact 52 is constituted by a metal film 224, and a barrier metal film 226 provided so as to cover the lateral side and the lower surface of the metal film 224. The plate contact 52 is formed within, for example, an opening provided in the second interconnect layer 202.

As shown in FIG. 37A and FIG. 37B, the lower end of the plate contact 52 constituted by the metal film 224 and the barrier metal film 226 functions as the upper electrode 16 in the first embodiment. The metal film 224 is formed of, for example, Al, Cu, or W and the like. In addition, the barrier metal film 226 is formed of, for example, TiN, TaN, HfN, ZrN, or Ru and the like. Meanwhile, the material of the plate contact 52 can be appropriately selected in consideration of the relationship of the normalized oxide formation energy between the upper electrode and the lower electrode as mentioned in the first embodiment.

In addition, as shown in FIG. 37B, the insulating film 12 may be provided, for example, so as to cover the lateral side and the lower surface of the plate contact 52. In this case, the insulating film 12 is formed within an opening for burying the plate contact 52 which is provided in the second interconnect layer 202.

In the structure shown in FIG. 37B, the insulating film 12 and the plate contact 52 are formed, for example, as follows. First, an insulating material and a metal material are deposited, in this order, on an insulating interlayer constituting the second interconnect layer 202 and within an opening provided in the insulating interlayer. Next, the portion of the deposited insulating material and the metal material other than the inside of the opening are removed by a CMP method and the like. Thereby, the insulating film 12 and the plate contact 52 are formed within an opening provided in the insulating interlayer. In this case, a process of patterning the insulating film 12 by dry etching and the like can be omitted. Therefore, the nonvolatile memory is easily manufactured.

Figure 69A:
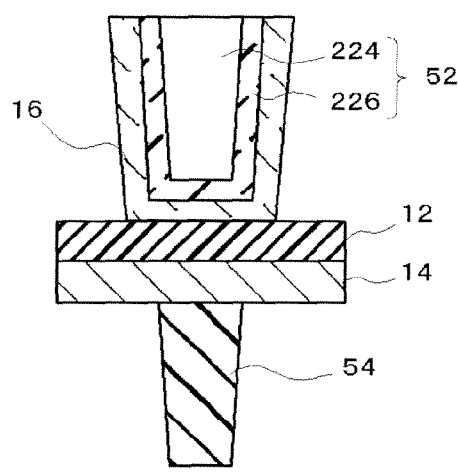
FIGS. 69A and 69B are cross-sectional views illustrating a modified example of the variable resistance device shown in FIGS. 37A and 37B.
Figure 69B:
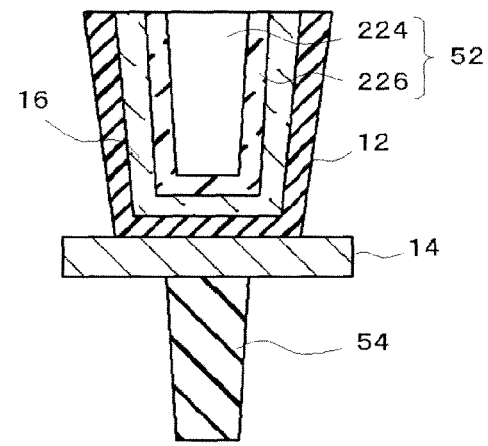

FIGS. 69A and 69B are cross-sectional views illustrating a modified example of the variable resistance device 10 shown in FIG. 37. As shown in FIGS. 69A and 69B, in the variable resistance device 10 according to the embodiment, the upper electrode 16 may be provided so as to cover the lateral side and the lower surface of the plate contact 52. In this case, a plate contact is constituted by the metal film 224, the barrier metal film 226, and the upper electrode 16.

In the variable resistance device 10 according to the modified example shown in FIG. 69A, the upper electrode 16 is provided so as to cover the lateral side and the lower surface of the plate contact 52. In this case, the upper electrode 16 is formed within an opening for burying the plate contact 52 which is provided in the second interconnect layer 202. Meanwhile, in the modified example shown in FIG. 69A, the insulating film 12 is provided below the opening for burying the plate contact 52.

In the variable resistance device 10 according to the modified example shown in FIG. 69B, the upper electrode 16 and the insulating film 12 may be provided so as to cover the lateral side and the lower surface of the plate contact 52. In this case, the insulating film 12 covers the lateral side and the lower surface of the plate contact 52 through the upper electrode 16. And the upper electrode 16 and the insulating film 12 are formed within the opening for burying the plate contact 52 which is provided in the second interconnect layer 202.

In the embodiment, it is also possible to obtain the same effect as that of the first embodiment.

In addition, according to the embodiment, there is no upper electrode 16. For this reason, a process of forming the upper electrode will be omitted. Therefore, the nonvolatile memory is easily manufactured.

When the upper electrode 16 is separately formed below the plate contact 52, it is necessary to make the areas of the upper electrode 16 and the insulating film 12 larger than the lower electrode 14, for example, as shown in FIG. 33, in order to prevent short-circuiting between the upper and lower electrodes with avoiding a problem such as the variation in the dimensions or the stitch dislocation. This causes the device area to be increased. Further, since the lower electrode 14 is required to be made larger than the source/drain contact 54 having the same level of the diameter as that of the plate contact 52, the entire area of the variable resistance device 10 further increases.

On the other hand, according to the embodiment, the upper electrode of the variable resistance device 10 is constituted by the plate contact 52. For this reason, the areas of the lower electrode 16 and the insulating film 12 are provided slightly larger than that of the plate contact 52, which enables to avoid a problem such as the variation in the dimensions or the alignment dislocation, and to prevent short-circuiting between the upper and lower electrodes. In this case, the area of the variable resistance device 10 is specified by the lower electrode 16 and the insulating film 12 having an area slightly larger than the diameter of the plate contact 52. Therefore, the variable resistance device and the memory cell can be miniaturized. In addition, it is possible to prevent short-circuiting between the upper and lower electrodes without a complicated process.

Figure 38:
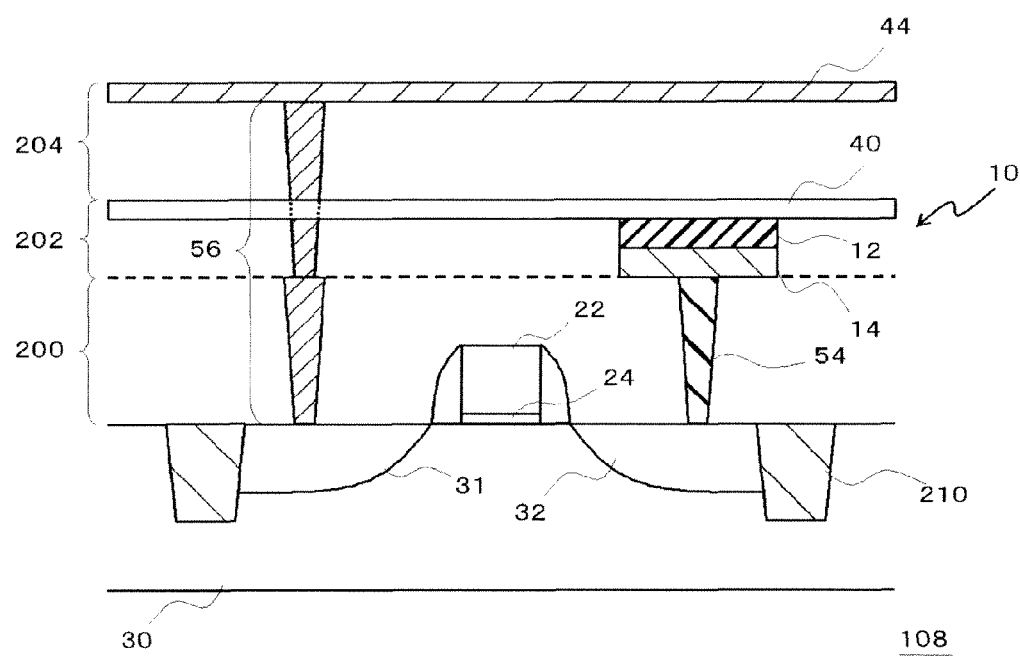
FIG. 38 is a side view illustrating the nonvolatile memory according to an eighth embodiment.

FIG. 38 is a side view illustrating a nonvolatile memory 108 according to an eighth embodiment, and corresponds to FIG. 29 in the first embodiment. The nonvolatile memory 108 according to the embodiment has the same configuration as that of the nonvolatile memory 100 according to the first embodiment, except for the configuration of the variable resistance device 10.

In the embodiment, the upper electrode of the variable resistance device 10 is constituted by the plate line 40.

As shown in FIG. 38, the nonvolatile memory 108 according to the embodiment does not include the upper electrode 16 and the plate contact 52 shown in the first embodiment. In addition, the insulating film 12 which is a variable resistance layer comes into direct contact with the plate line 40 provided in the second interconnect layer 202. In the embodiment, the portion which is the lower end of the plate line 40 and comes into contact with the insulating film 12 is set to function as the upper electrode of the variable resistance device 10. That is, the variable resistance device 10 is constituted by the lower electrode 14, the insulating film 12 and the plate line 40.

Figure 39A:
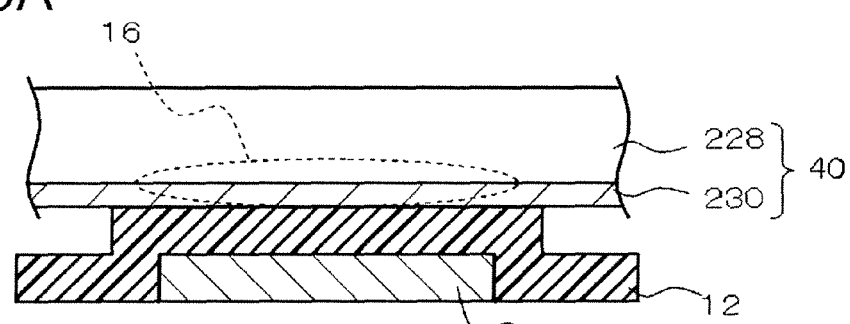
FIGS. 39A and 39B are cross-sectional views illustrating an example of the variable resistance device shown in FIG. 38.
Figure 39B:
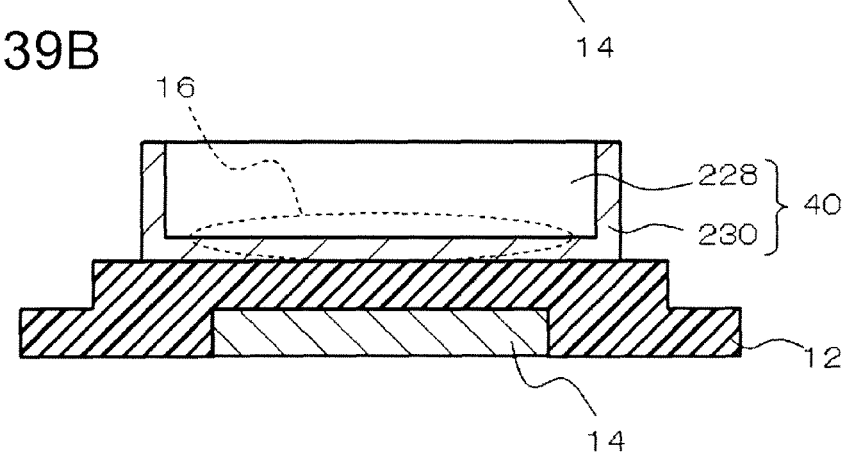

FIGS. 39A and 39B are cross-sectional views illustrating an example of the variable resistance device 10 shown in FIG. 38. FIG. 39A shows the cross-section of the variable resistance device 10 when FIG. 38 is seen from the front thereof. FIG. 39B shows the cross-section of the variable resistance device 10 when FIG. 38 is seen from the side thereof.

As shown in FIGS. 39A and 39B, the plate line 40 is constituted by a metal film 228, and a barrier metal film 230 provided so as to cover the lateral side and the lower surface of the metal film 228. The plate line 40 is buried in, for example, the second interconnect layer 202.

As shown in FIGS. 39A and 39B, the lower end of the plate line 40 constituted by the metal film 228 and the barrier metal film 230 functions as the upper electrode 16 in the first embodiment. The metal film 228 is formed of, for example, Al or Cu and the like. In addition, the barrier metal film 230 is formed of, for example, TiN, TaN, HfN, ZrN, or Ru and the like. Meanwhile, the material of the plate line 40 can be appropriately selected in consideration of the relationship of the normalized oxide formation energy between the upper electrode and the lower electrode as mentioned in the first embodiment.

As shown in FIGS. 39A and 39B, insulating film 12 is provided so as to be larger than the lower electrode 14 when seen in a plan view, for example. In this case, the insulating film 12 is provided, for example, so as to cover the upper surface and the lateral side of the lower electrode 14.

In the embodiment, the insulating film 12 is provided so as to cover the upper surface and the lateral side of the lower electrode 14. For this reason, when a groove for burying the plate line 40 in the insulating interlayer is formed, it is possible to prevent the lower electrode 14 from being exposed even if the insulating interlayer in the vicinity of the insulating film 12 is removed, for example, due to mask misalignment and the like. Thereby, it is possible to prevent short-circuiting between the plate line 40 constituting the upper electrode of the variable resistance device 10, and the lower electrode 14.

Figure 40:
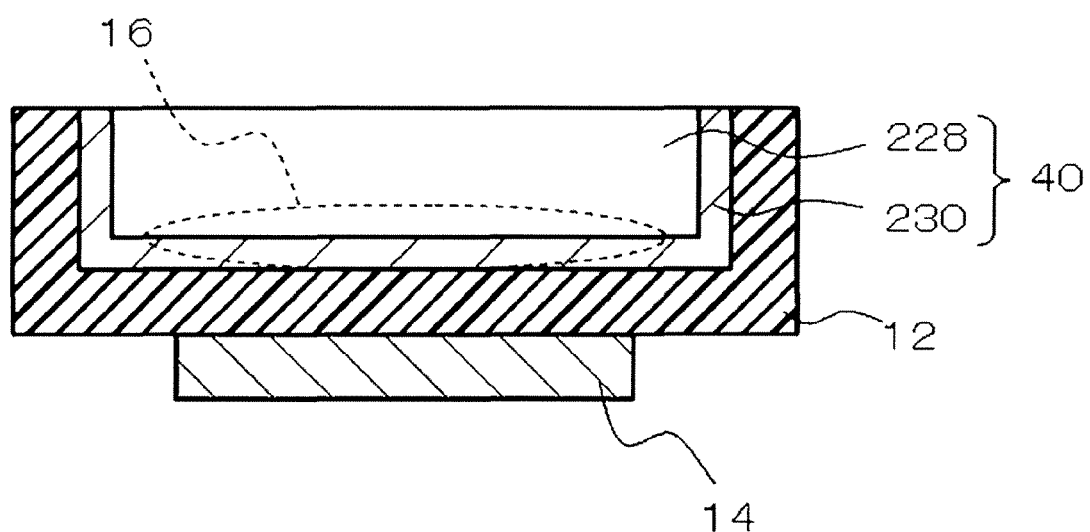
FIG. 40 is a cross-sectional view illustrating an example of the variable resistance device shown in FIG. 38.

FIG. 40 is a cross-sectional view illustrating an example of the variable resistance device 10 shown in FIG. 38, and shows an example different from that of FIG. 39. FIG. 40 shows the cross-section of the variable resistance device 10 when FIG. 38 is seen from the side thereof.

As shown in FIG. 40, the insulating film 12 may be provided, for example, so as to cover the lateral side and the lower surface of the plate line 40. In this case, the insulating film 12 is formed within the groove for burying the plate line 40 which is provided in the second interconnect layer 202.

In the example shown in FIG. 40, after the groove for burying the plate line 40 is formed on the lower electrode 14, the insulating film 12 is formed. For this reason, when the plate line 40 is formed, the exposure of the lower electrode 14 is suppressed. Therefore, it is possible to prevent short-circuiting between the plate line 49 constituting the upper electrode of the variable resistance device 10, and the lower electrode 14.

Figure 70A:
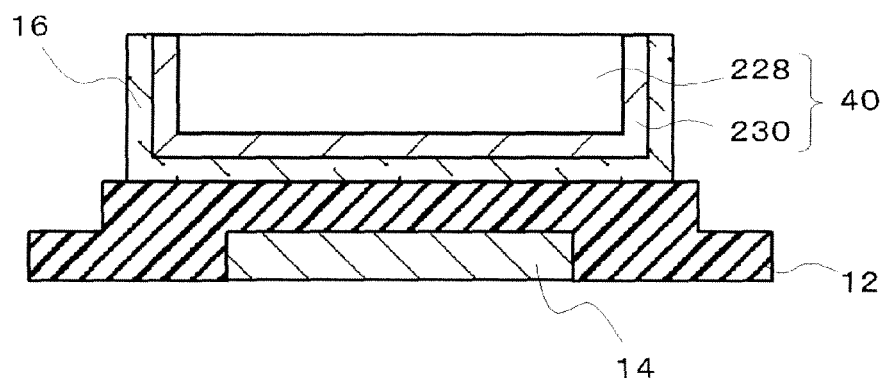
FIGS. 70A and 70B are cross-sectional views illustrating a modified example of the variable resistance device shown in FIGS. 39A and 39B and FIG. 40.
Figure 70B:
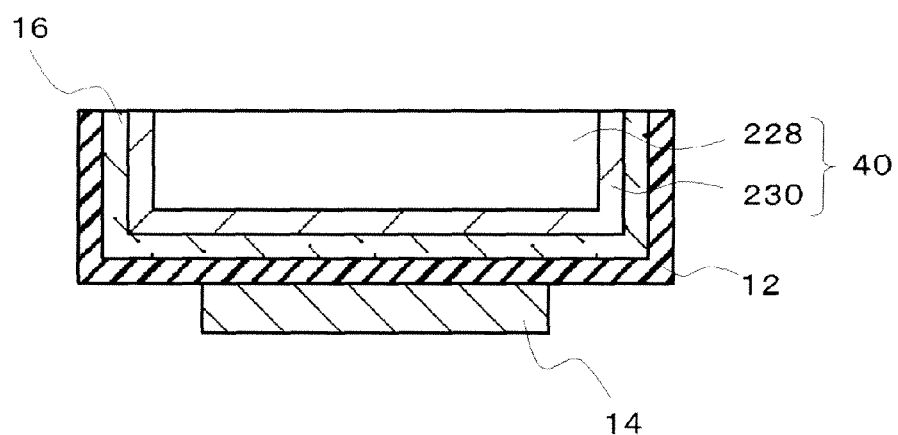

FIGS. 70A and 70B are cross-sectional views illustrating a modified example of the variable resistance device 10 shown in FIGS. 39A and 39B and FIG. 40. FIG. 70A shows a modified example of the variable resistance device 10 shown in FIGS. 39A and 39B. FIG. 70B shows a modified example of the variable resistance device 10 shown in FIG. 40. As shown in FIGS. 70A and 70B, in the variable resistance device 10 according to the embodiment, the upper electrode 16 may be provided so as to cover the lateral side and the lower surface of the plate line 40. In this case, the plate line is constituted by the metal film 228, the barrier metal film 230, and the upper electrode 16.

In the structure according to the modified example shown in FIG. 70A, the upper electrode 16 is provided so as to cover the lateral side and the lower surface of the plate line 40. In this case, the upper electrode 16 is provided within the groove for burying the plate line 40. The insulating film 12 is provided below the groove for burying the plate line 40.

In the structure according to modified example shown in FIG. 70B, the upper electrode 16 and insulating film 12 are provided so as to cover the lateral side and the lower surface of the plate line 40. In this case, the insulating film 12 covers the lateral side and the lower surface of the plate line 40 through the upper electrode 16. In addition, the upper electrode 16 and the insulating film 12 are provided within the groove for burying the plate line 40.

In the embodiment, it is also possible to obtain the same effect as that of the first embodiment.

In addition, according to the embodiment, there are no upper electrode 16 and the plate contact 52. Therefore, processes of forming the upper electrode 16 and the plate contact 52 can be omitted. Therefore, the nonvolatile memory is easily manufactured.

In the existing LSI process in which the variable resistance device 10 is not provided, the plate line 40 is formed in, for example, the first interconnect layer 200. According to the embodiment, since the plate contact 52 is not provide, the position of the plate line 40 provided in the second interconnect layer 202 can be brought close to the first interconnect layer 200. Therefore, it is possible to enhance compatibility between the process of manufacturing a nonvolatile memory according to the embodiment and the existing LSI process.

Figure 41:
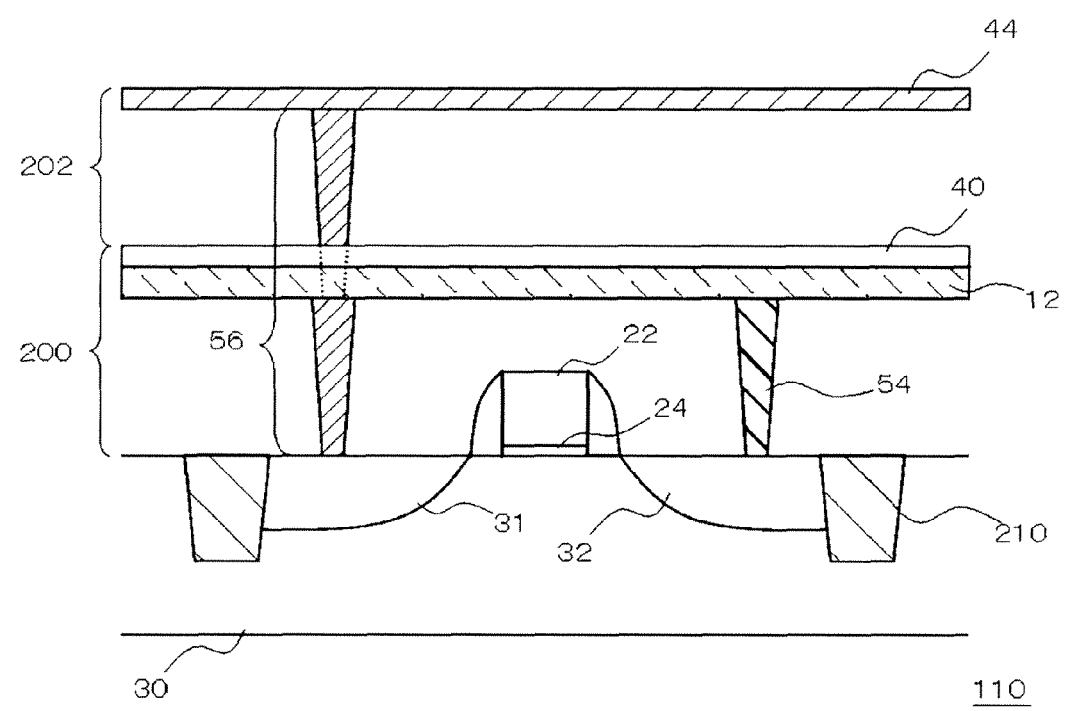
FIG. 41 is a side view illustrating the nonvolatile memory according to a ninth embodiment.

FIG. 41 is a side view illustrating a nonvolatile memory 110 according to a ninth embodiment, and corresponds to FIG. 29 in the first embodiment. The nonvolatile memory 110 according to the embodiment has the same configuration as that of the nonvolatile memory 100 according to the first embodiment, except for the configuration of the variable resistance device 10.

In the embodiment, the lower electrode of the variable resistance device 10 is constituted by the source/drain contact 54. In addition, the upper electrode of the variable resistance device 10 is constituted by the plate line 40.

As shown in FIG. 41, the nonvolatile memory 110 according to the embodiment does not include the lower electrode 14, the upper electrode 16 and the plate contact 52 which are shown in the first embodiment. The plate line 40 is provided in the first interconnect layer 200, and comes into direct contact with the insulating film 12 which is a variable resistance layer. In addition, the insulating film 12 which is a variable resistance layer is directly connected to the source/drain contact 54 provided in the first interconnect layer 200.

In the embodiment, the portion which is the lower end of the plate line 40 and overlaps the source/drain contact 54 when seen in a plan view is caused to function as the upper electrode of the variable resistance device 10. In addition, the upper end of the source/drain contact 54 is caused to function as the lower electrode of the variable resistance device 10. That is, the variable resistance device 10 is constituted by the source/drain contact 54, the insulating film 12 and the plate line 40.

Figure 42:
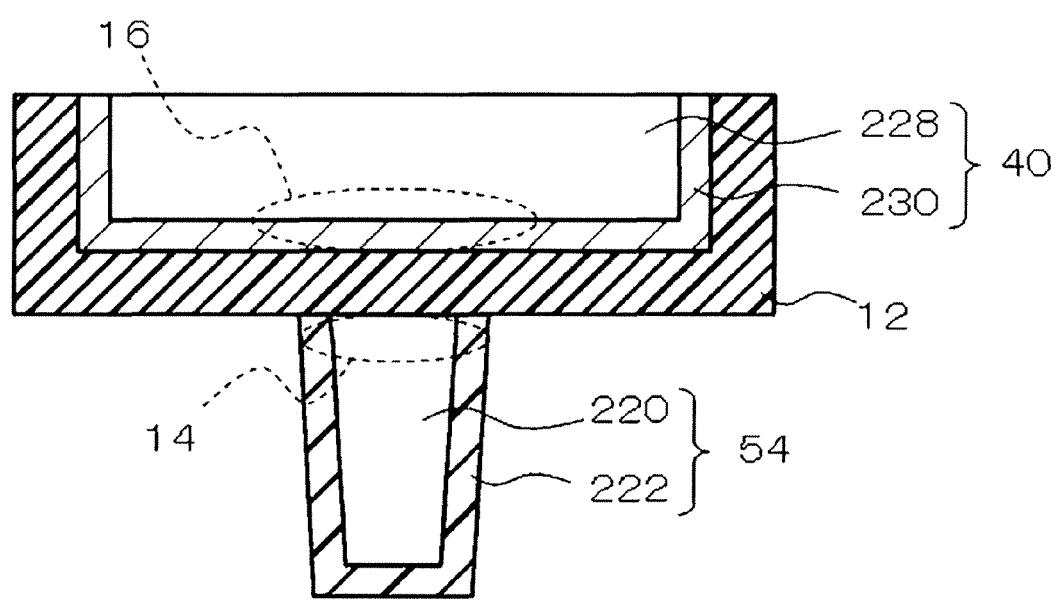
FIG. 42 is a cross-sectional view illustrating the variable resistance device shown in FIG. 41.

FIG. 42 is a cross-sectional view illustrating the variable resistance device 10 shown in FIG. 41.

As shown in FIG. 42, the plate line 40 is constituted by the metal film 228, and the barrier metal film 230 provided so as to cover the lateral side and the lower surface of the metal film 228. The plate line 40 is buried in, for example, the first interconnect layer 200. And as shown in FIG. 42, the source/drain contact 54 is constituted by the metal film 220, and the barrier metal film 222 provided so as to cover the lateral side and the lower surface of the metal film 220.

As shown in FIG. 42, the lower end of the plate line 40 functions as the upper electrode 16 in the first embodiment, and the upper end of the source/drain contact 54 functions as the lower electrode 14 in the first embodiment.

The materials of the metal film 228, the barrier metal film 230, the metal film 220 and the barrier metal film 222 can be appropriately selected in consideration of the relationship of the normalized oxide formation energy between the upper electrode and the lower electrode as shown in first embodiment.

As shown in FIG. 42, the insulating film 12 is provided, for example, so as to cover the lateral side and the lower surface of the plate line 40. In this case, the insulating film 12 is formed within the groove for burying the plate line 40 which is provided in the first interconnect layer 200.

In the embodiment, it is possible to obtain the same effect as that of the first embodiment.

In addition, processes of forming the lower electrode 14, the upper electrode 16 and the source/drain contact 54 can be omitted. For this reason, the nonvolatile memory can be easily manufactured.

Further, since the lower electrode 14 and the upper electrode 16 are not provided, it is possible to exclude the cause for lowering of the yield ratio such as the alignment dislocation or incomplete etching, occurring at the time of forming the lower electrode 14 and the upper electrode 16. Therefore, it is possible to improve the yield ratio in manufacturing a nonvolatile memory.

Figure 43:
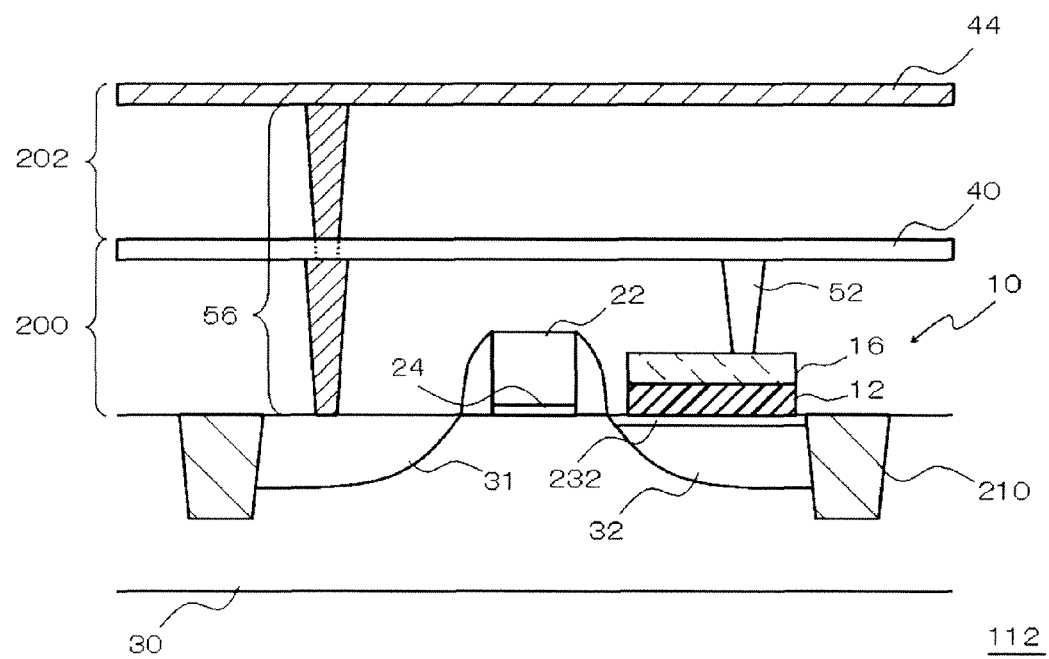
FIG. 43 is a side view illustrating the nonvolatile memory according to a tenth embodiment.

FIG. 43 is a side view illustrating a nonvolatile memory 112 according to a tenth embodiment, and corresponds to FIG. 29 in the first embodiment. The nonvolatile memory 112 according to the embodiment has the same configuration as that of the nonvolatile memory 100 according to the first embodiment, except for the configuration of the variable resistance device 10.

As shown in FIG. 43, the nonvolatile memory 112 includes a suicide layer 232 formed on the surface of the source/drain region 32. In the embodiment, the lower electrode of the variable resistance device 10 is constituted by the silicide layer 232.

As shown in FIG. 43, the nonvolatile memory 112 according to the embodiment does not have the source/drain contact 54 and lower electrode 14 which are shown in the first embodiment. The insulating film 12 which is a variable resistance layer is provided on the silicide layer 232 so as to come into direct contact with the silicide layer 232.

In the embodiment, the silicide layer 232 is set to function as the lower electrode of the variable resistance device 10. That is, the variable resistance device 10 is constituted by the silicide layer 232, the insulating film 12 and the upper electrode 16.

In the embodiment, the insulating film 12 and the upper electrode 16 are laminated on the silicide layer 232 which is provided in the substrate 30. That is, the insulating film 12 and the upper electrode 16 are provided in the first interconnect layer 200. In addition, the plate line 40 is buried in the first interconnect layer 200.

The silicide layer 232 is formed, for example, by silicidize the surface of the source/drain region 32 using TiSi, $CoSi_2$, NiSi, or PtSi, or an alloy thereof and the like. Meanwhile, the material of the silicide layer 232 can be appropriately selected in consideration of the relationship of the normalized oxide formation energy between the upper electrode and the lower electrode as mentioned in the first embodiment.

In the embodiment, it is also possible to obtain the same effect as that of the first embodiment.

In addition, according to the embodiment, the variable resistance device 10 is provided on the silicide layer 232 which is provided in the substrate 30. The plate line 40 located on the variable resistance device 10 is buried in the first interconnect layer 200. For this reason, the multilayered interconnect layer provided on the substrate can be formed by a normal LSI process in which the variable resistance device is not provided. Therefore, the nonvolatile memory can be easily manufactured.

Figure 44:
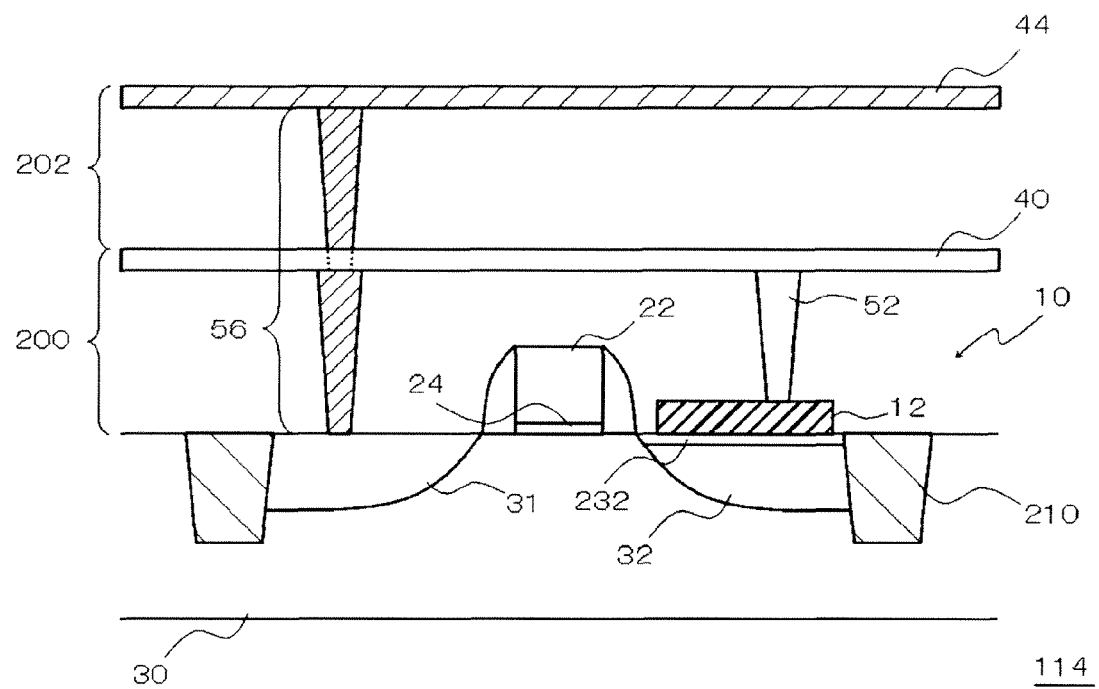
FIG. 44 is a side view illustrating the nonvolatile memory according to an eleventh embodiment.

FIG. 44 is a side view illustrating a nonvolatile memory 114 according to an eleventh embodiment, and corresponds to FIG. 29 in the first embodiment. The nonvolatile memory 114 according to the embodiment has the same configuration as that of the nonvolatile memory 100 according to the first embodiment, except for the configuration of the variable resistance device 10.

As shown in FIG. 44, the nonvolatile memory 114 includes the silicide layer 232. In the embodiment, the lower electrode of the variable resistance device 10 is constituted by the silicide layer 232, and the upper electrode of the variable resistance device 10 is constituted by the plate contact 52.

As shown in FIG. 44, the nonvolatile memory 114 according to the embodiment does not include the source/drain contact 54, the upper electrode 16 and the lower electrode 14 which are shown in the first embodiment. The insulating film 12 which is a variable resistance layer is provided on the silicide layer 232 so as to come into direct contact with the silicide layer 232. In addition, the insulating film 12 comes into direct contact with the plate contact 52 provided on the insulating film 12.

In the embodiment, the silicide layer 232 is caused to function as the lower electrode of the variable resistance device 10. In addition, the plate contact 52 is caused to function as the upper electrode of the variable resistance device 10. That is, the variable resistance device 10 is constituted by the silicide layer 232, the insulating film 12 and the plate contact 52.

The silicide layer 232 has, for example the same configuration as that of the tenth embodiment. In addition, the plate contact 52 has, for example, the same configuration as according to the seventh embodiment.

Figure 45:
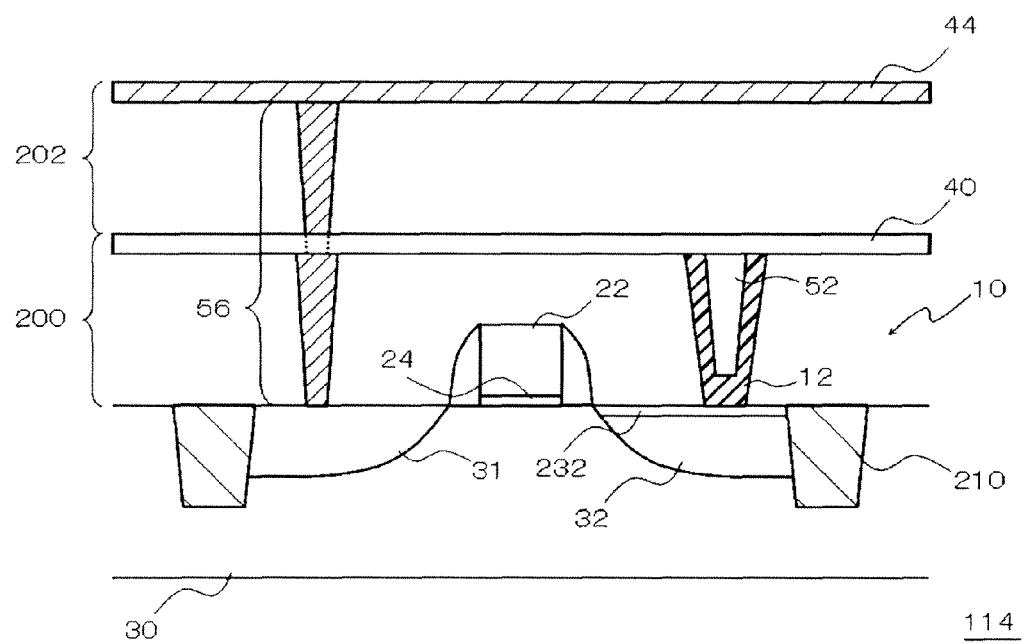
FIG. 45 is a side view illustrating a modified example of the nonvolatile memory shown in FIG. 44.

FIG. 45 is a schematic cross-sectional view illustrating a modified example of the nonvolatile memory 114 shown in FIG. 44. As shown in FIG. 45, the insulating film 12 of the nonvolatile memory 114 may be provided, for example, so as to cover the lateral side and the lower surface of the plate contact 52. In this case, the insulating film 12 is provided within an opening for forming the plate contact 52 which is provided in the first interconnect layer 200.

In the embodiment, the insulating film 12 and the plate contact 52 are formed, for example, as follows. First, an insulating material and a metal material are deposited, in this order, on an insulating interlayer constituting the second interconnect layer 202 and within an opening provided in the insulating interlayer. Next, the insulating material and the metal material deposited in the portion other than the inside of the opening are removed by a CMP method and the like. Thereby, the insulating film 12 and the plate contact 52 are formed within an opening provided in the insulating interlayer. In this case, a process of patterning the insulating film 12 by dry etching and the like can be omitted. Therefore, the nonvolatile memory is easily manufactured.

In the embodiment, it is also possible to obtain the same effect as that of the first embodiment.

In addition, the variable resistance device 10 according to the embodiment is realized by forming the insulating film 12 between the source/drain region 32, and the plate contact 52 that connects the source/drain region 32 and the plate line 40. Therefore, it is possible to form the nonvolatile memory, with little change of the existing LSI process in which the nonvolatile memory is not formed. Thereby, the nonvolatile memory can be easily manufactured.

Figure 46:
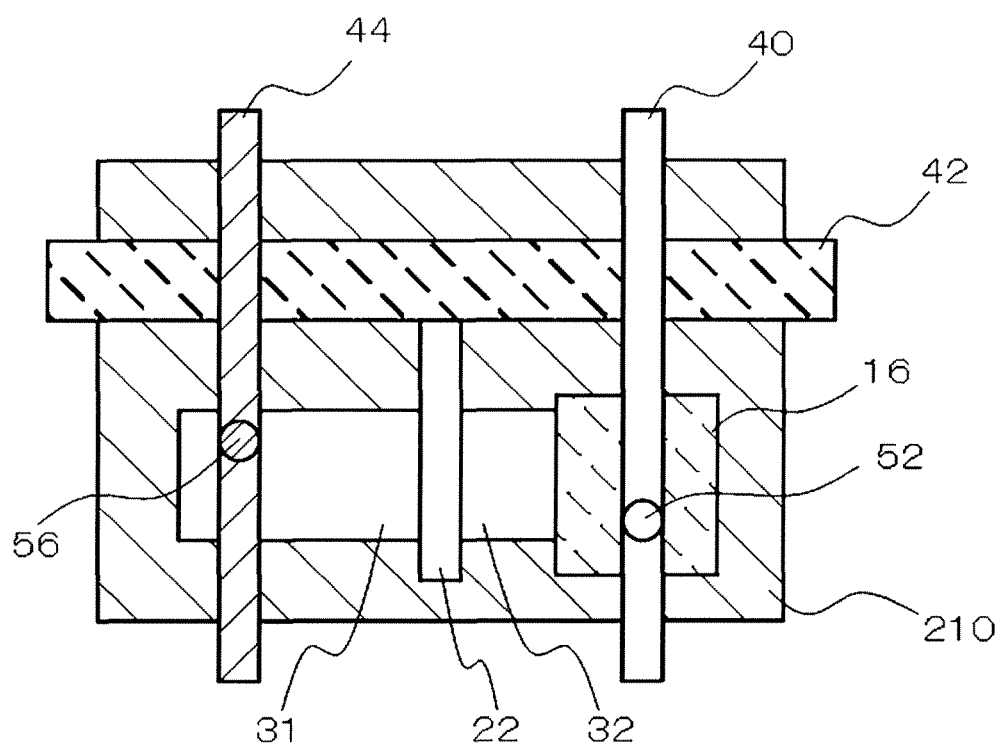
FIG. 46 is a top view illustrating the nonvolatile memory according to a twelfth embodiment.

FIG. 46 is a top view illustrating a nonvolatile memory 116 according to a twelfth embodiment, and corresponds to FIG. 30 according to the first embodiment. The nonvolatile memory 116 according to the embodiment has the same configuration as that of the nonvolatile memory 100 according to the first embodiment, except for the configuration of the plate line 40, the word line 42 and the bit line 44.

As shown in FIG. 46, the nonvolatile memory 116 according to the embodiment, the word line 42 is provided perpendicular to the gate electrode 22, within the plane horizontal to the planar surface of the substrate 30. In addition, the word line 42 is connected to the gate electrode 22. In this case, the word line 42 does not function as the gate electrode 22.

In addition, the plate line 40 and the bit line 44 are provided so as to extend in the direction perpendicular to the word line 42, within the plane horizontal to the planar surface of the substrate 30. That is, the plate line 40 and the bit line 44 are provided parallel to the gate electrode 22.

In the embodiment, it is also possible to obtain the same effect as that of the first embodiment.

The plate line 40 is connected to the source/drain region 32, and the bit line 44 is connected to the source/drain region 31. For this reason, when the plate line 40 and the bit line 44 are provided perpendicular to the gate electrode 22 as in the first embodiment, a gate width by which the plate line 40 and the bit line 44 are provided parallel to each other is required.

On the other hand, in the embodiment, the plate line 40 and the bit line 44 are provided parallel to the gate electrode 22.

For this reason, it is possible to provide the plate line 40 and the bit line 44 parallel to each other regardless of the gate width of the selection transistor 20.

In addition, according to the embodiment, the word line 42 does not function as the gate electrode 22. For this reason, the width of the word line 42 can be designed regardless of the gate length of the selection transistor 20. For this reason, it is possible to achieve a decrease in the resistance of the word line while forming a high-performance and fine selection transistor with a small gate length.

Figure 47:
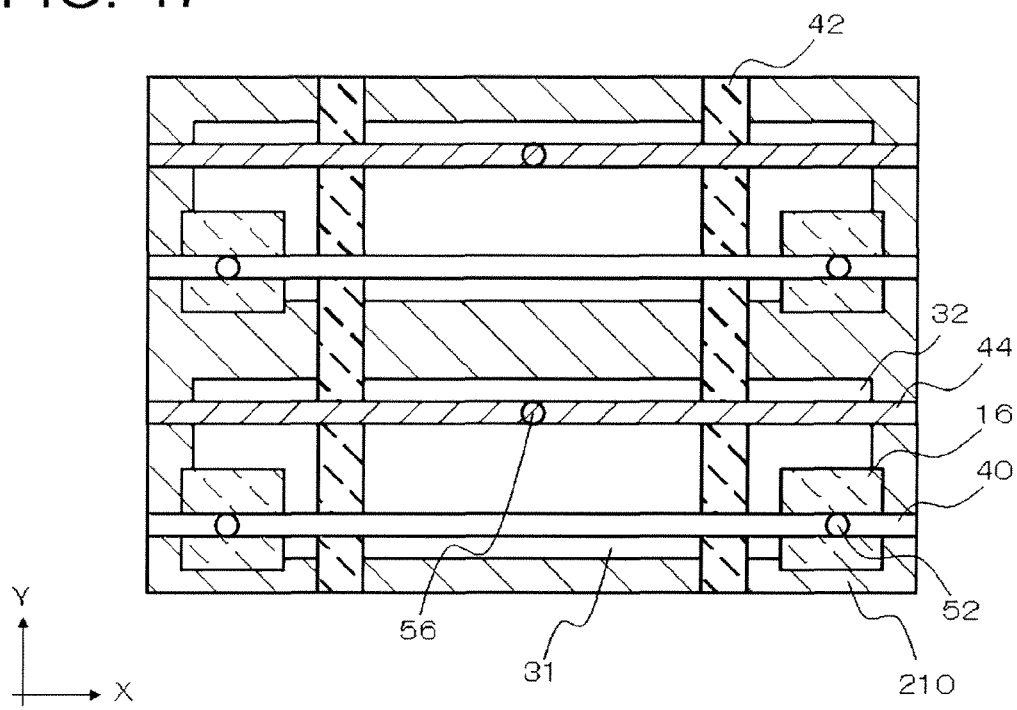
FIG. 47 is a top view illustrating the cell array structure constituting the nonvolatile memory according to a thirteenth embodiment.
Figure 48:
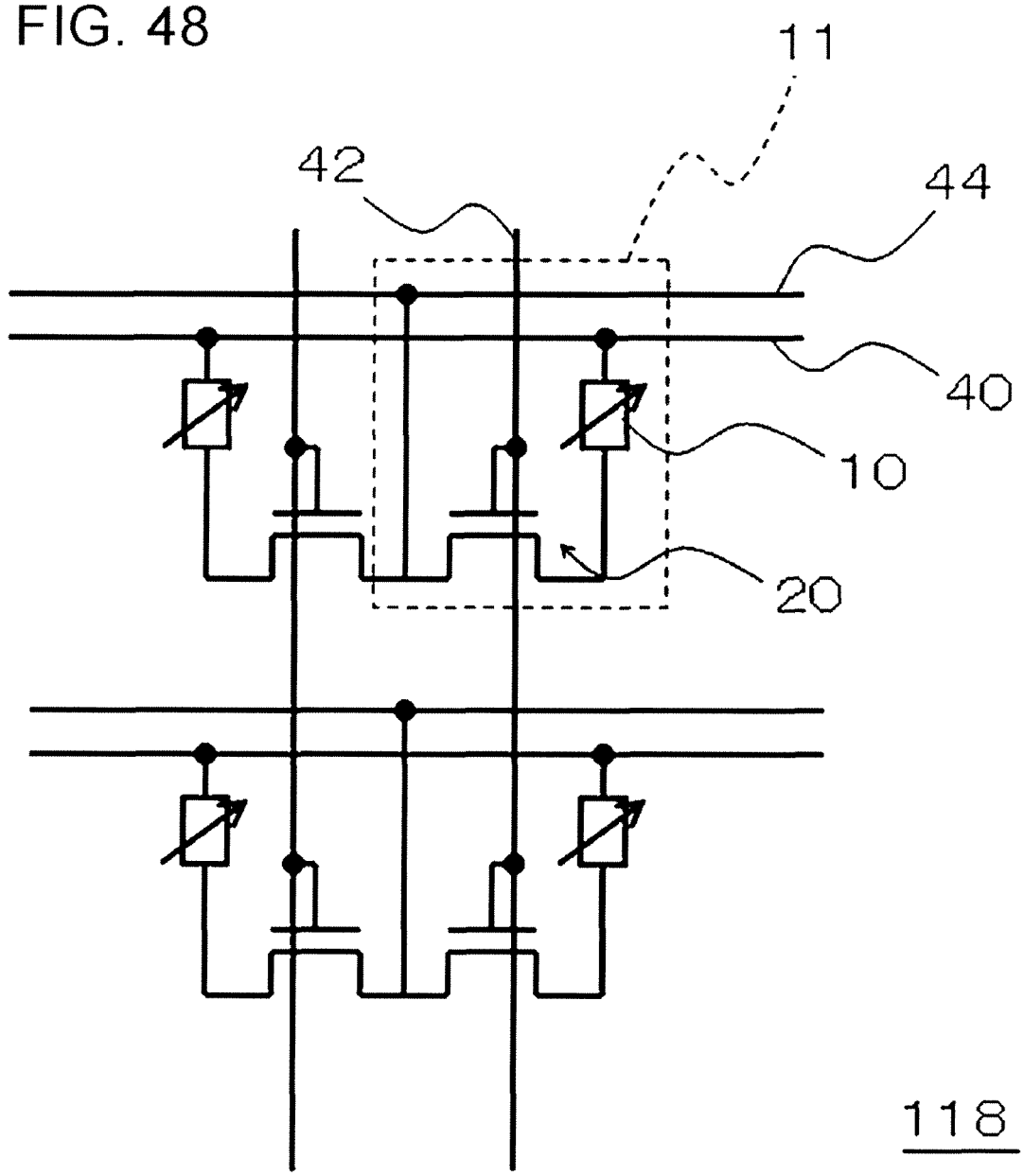
FIG. 48 is a circuit diagram illustrating the cell array structure shown in FIG. 47.

FIG. 47 is a top view illustrating a cell array structure constituting a nonvolatile memory 118 according to a thirteenth embodiment, and shows a portion of the cell array structure. FIG. 47 corresponds to FIG. 31 according to the first embodiment. FIG. 48 is a circuit diagram illustrating the cell array structure shown in FIG. 47, and corresponds to FIG. 32 according to the first embodiment.

As shown in FIGS. 47 and 48, the nonvolatile memory 118 according to the embodiment, two adjacent memory cells 11 are configured such that the source/drain regions 31 are formed integrally with each other. The source/drain regions 31 formed integrally with each other are connected to the bit line 44 through one bit contact 56. The nonvolatile memory 118 according to the embodiment has the same configuration as that of the nonvolatile memory 100 according to the first embodiment, except for these points.

As shown in FIG. 47, in the nonvolatile memory 118 according to the embodiment, the source/drain regions 31 included in each of the two memory cells 11 adjacent in the X direction are provided integrally with each other. That is, the two memory cells 11 adjacent in the X direction share the source/drain region 31 with each other. In addition, a device isolation film 210 is not provided between two memory cells 11 in which the source/drain regions 31 are provided integrally with each other. The source/drain regions 31 formed integrally with each other are connected to the bit line 44 through one bit contact 56. In addition, two memory cells 11 in which the source/drain regions 31 are integrally provided are connected to the word lines 42 different from each other.

In addition, as shown in FIG. 47, the source/drain regions 31 of two memory cells 11 adjacent in the Y direction are isolated from each other by the device isolation film 210.

In the nonvolatile memory 118 according to the embodiment, the specific memory cell 11 can also be selected by combination of the plate line 40, the word line 42 and the bit line 44.

In the embodiment, it is also possible to obtain the same effect as that of the first embodiment.

In addition, according to the embodiment, the source/drain regions 31 included in each of the two adjacent memory cells 11 are formed integrally with each other. For this reason, it is not necessary to provide the device isolation film 210 between the two adjacent memory cell 11. Therefore, the size of the cell array structure can be reduced.

Further, only one bit contact 56 is provided in the source/drain regions 31 which are integrally formed. That is, the limitation of the diameter of the bit contact 56 by the lithography resolution limit and the like is alleviated. Thereby, it is possible to increase the diameter of the bit contact 56, and to reduce the contact resistance in the bit contact 56. Therefore, the operation speed of the nonvolatile memory can be improved.

Figure 49:
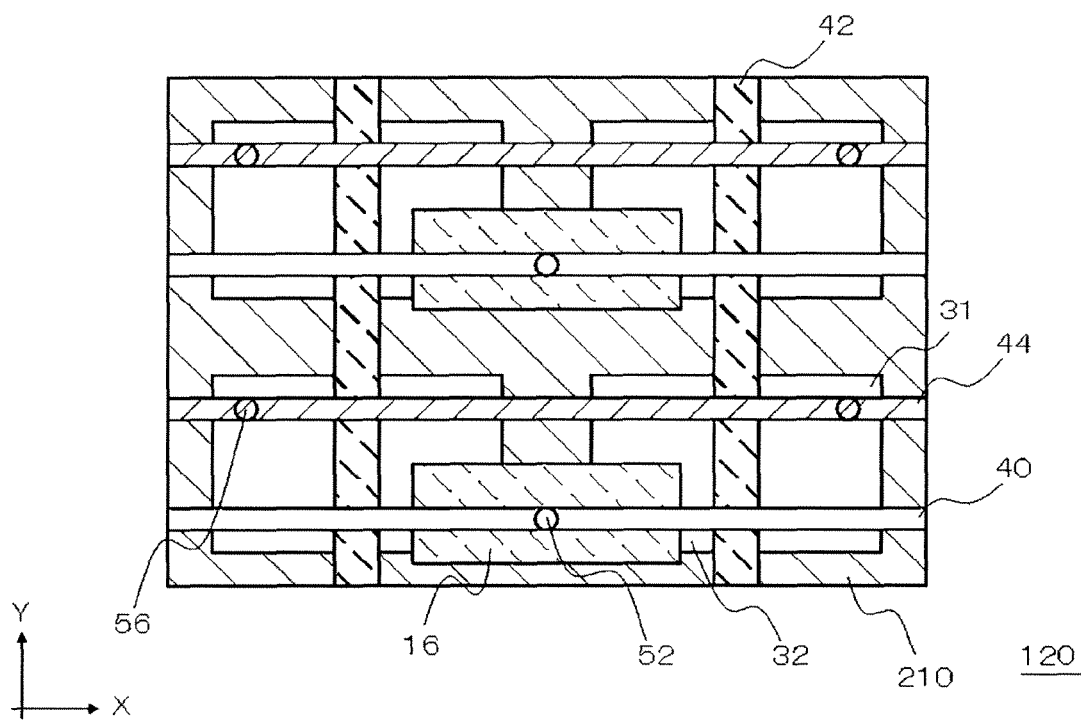
FIG. 49 is a top view illustrating the cell array structure constituting the nonvolatile memory according to a fourteenth embodiment.
Figure 50:
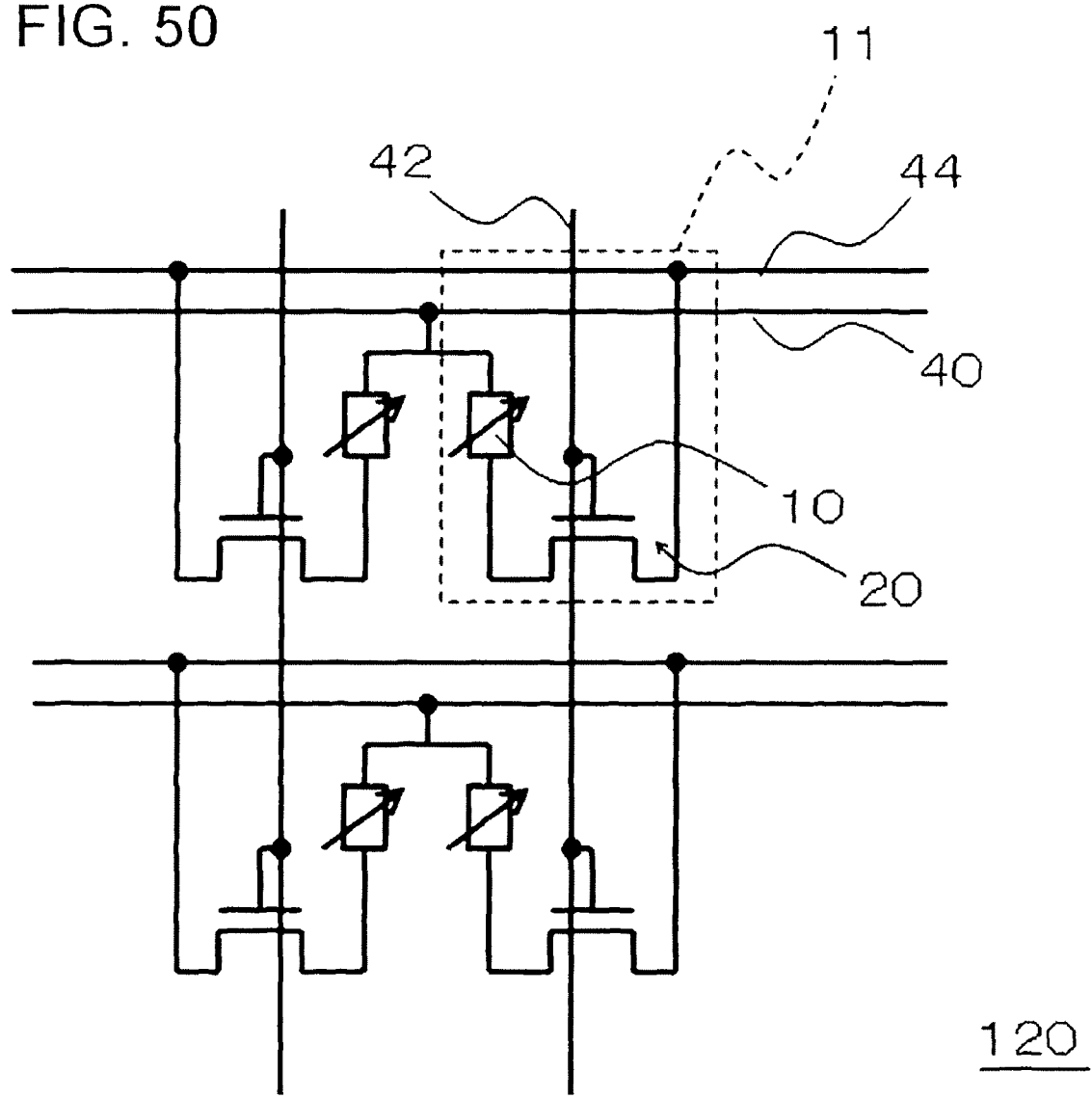
FIG. 50 is a circuit diagram illustrating the cell array structure shown in FIG. 49.
Figure 51:
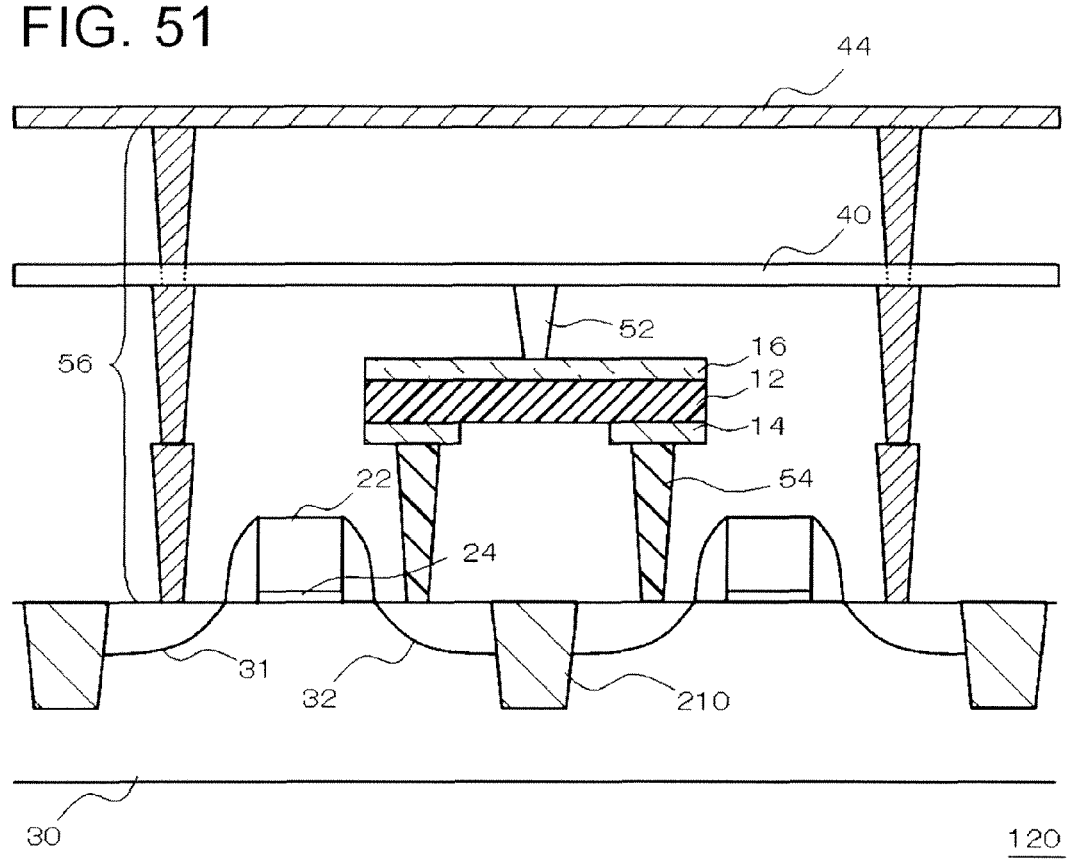
FIG. 51 is a side view illustrating a portion of the cell array structure shown in FIG. 49.

FIG. 49 is a top view illustrating a cell array structure constituting a nonvolatile memory 120 according to a fourteenth embodiment, and shows a portion of the cell array structure. FIG. 49 corresponds to FIG. 31 according to the first embodiment. FIG. 50 is a circuit diagram illustrating the cell array structure shown in FIG. 49, and corresponds to FIG. 32 according to the first embodiment. FIG. 51 is a side view illustrating a portion of the cell array structure shown in FIG. 49.

In the nonvolatile memory 120 according to the embodiment, two adjacent memory cells 11 connected to the same bit line 44 are configured such that the upper electrodes 16 are formed integrally with each other, and the lower electrodes 14 are separated from each other. The upper electrode 16 which are integrally formed are connected to the plate line 40 through one plate contact 52. The nonvolatile memory 120 according to the embodiment has the same configuration as that of the nonvolatile memory 100 according to the first embodiment, except for these points.

As shown in FIG. 49, in the nonvolatile memory 120 according to the embodiment, the upper electrodes 16 are formed integrally with each other in two memory cells 11 adjacent in the X direction in the drawing. As shown in FIGS. 49 and 50, the upper electrodes 16 which are integrally formed are connected to the plate line 40 through one plate contact 52. The two memory cells 11 adjacent in the X direction in the drawing are connected to the same bit line 44. In addition, the two memory cells 11 adjacent in the X direction in the drawing are connected to the word lines 42 different from each other.

On the other hand, the upper electrodes 16 of the two memory cells 11 adjacent in the Y direction in FIG. 49 are separated from each other. The two memory cells 11 adjacent in the Y direction are connected to the bit lines different from each other.

As shown in FIG. 51, the lower electrodes 14 included in each of the two memory cells 11 in which the upper electrodes 16 are integrally formed are separated from each other. Each of the lower electrodes 14 separated from each other is respectively connected to the different source/drain regions 32 through the different source/drain contacts 54. Thereby, two variable resistance devices 10 capable of being independently controlled corresponding to each of the lower electrodes 14 separated from each other are realized. Therefore, two memory cells 11 in which the upper electrodes 16 are integrally formed can be caused to function as the memory cells 11 independent of each other.

As shown in FIG. 51, the insulating films 12 included in each of the two memory cells 11 in which the upper electrodes 16 are integrally formed are formed, for example, integrally with each other. Meanwhile, the insulating films 12 included in each of the two memory cells 11 in which the upper electrodes 16 are integrally formed may be separated from each other.

In the embodiment, it is also possible to obtain the same effect as that of the first embodiment.

In addition, according to the embodiment, only one plate contact 52 is provided to the upper electrodes 16 which are integrally formed. That is, the limitation of the diameter of the plate contact 52 by the lithography resolution limit and the like is alleviated. Thereby, it is possible to increase the diameter of the plate contact 52, and to reduce the contact resistance in the plate contact 52. Therefore, the operation speed of the nonvolatile memory can be improved.

Figure 52:
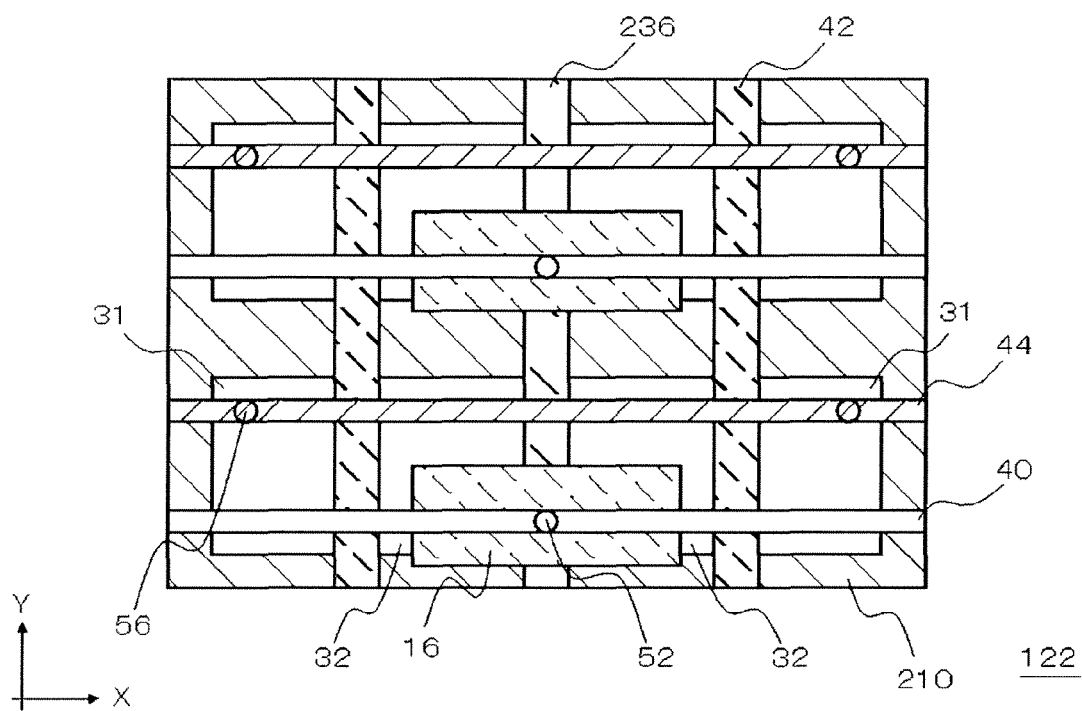
FIG. 52 is a top view illustrating the cell array structure constituting the nonvolatile memory according to a fifteenth embodiment.
Figure 53:
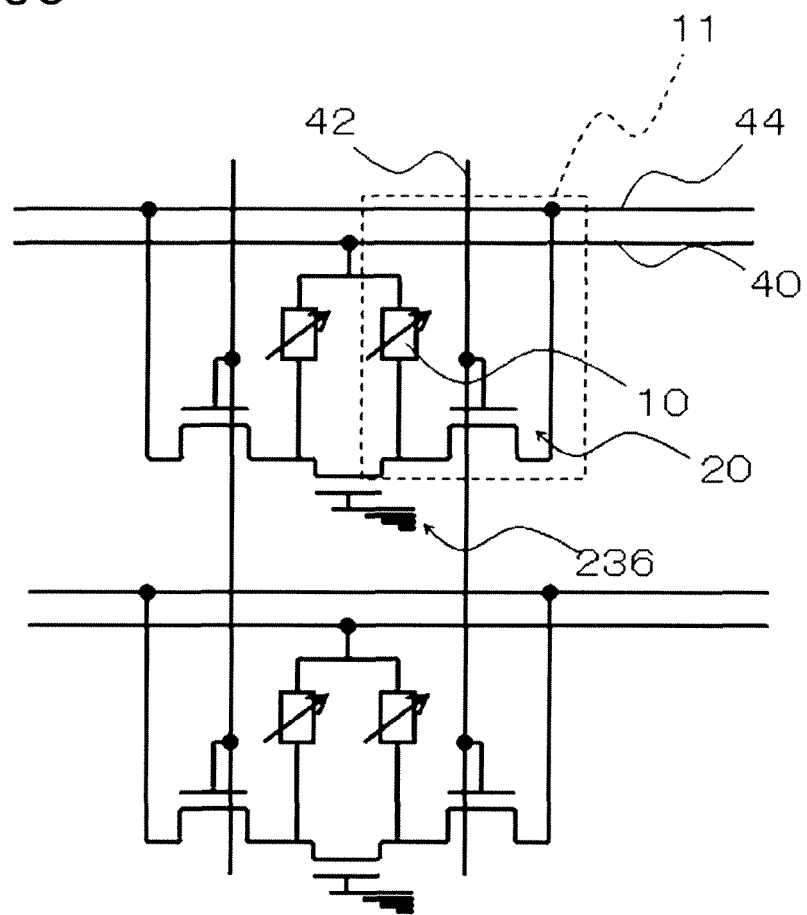
FIG. 53 is a circuit diagram illustrating the cell array structure shown in FIG. 52.
Figure 54:
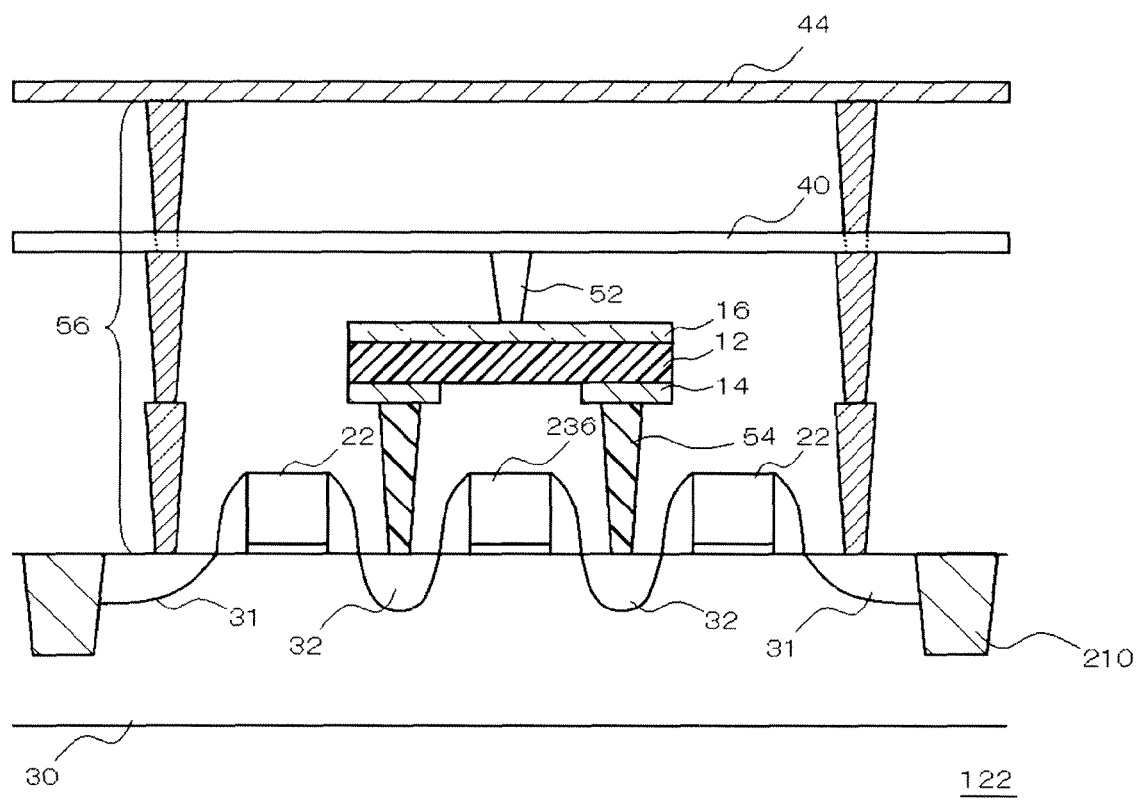
FIG. 54 is a side view illustrating a portion of the cell array structure shown in FIG. 52.

FIG. 52 is a top view illustrating a cell array structure constituting a nonvolatile memory 122 according to a fifteenth embodiment, and shows a portion of the cell array structure. FIG. 52 corresponds to FIG. 49 according to the fourteenth embodiment. FIG. 53 is a circuit diagram illustrating the cell array structure shown in FIG. 52, and corresponds to FIG. 50 according to the fourteenth embodiment. FIG. 54 is a side view illustrating a portion of the cell array structure shown in FIG. 52, and corresponds to FIG. 51 according to the fourteenth embodiment.

As shown in FIGS. 52, 53, and 54, the nonvolatile memory 122 according to the embodiment has the same configuration as that of the nonvolatile memory 120 according to the fourteenth embodiment, except that two adjacent memory cells 11 are isolated by a device isolation electrode 236.

As shown in FIG. 52, the nonvolatile memory 122 includes a device isolation electrode 236 provided between the selection transistor 20 included in one memory cell 11 and the selection transistor 20 included in another memory cell 11 adjacent to the one memory cell 11 in the X direction in the drawing. As shown in FIG. 54, the device isolation electrode 236 is provided between the source/drain regions 32 included in each of the adjacent memory cells 11, when seen in a plan view.

The channel between the source/drain regions 32 included in each of the two selection transistors 20 is set to an OFF state by applying a voltage to the device isolation electrode 236. Thereby, two adjacent selection transistors 20 are isolated from each other.

As shown in FIG. 52, the device isolation electrode 236 according to the embodiment is provided, for example, between two memory cells 11 adjacent in the X direction. In addition, as shown in FIG. 54, the device isolation film 210 is not provided between the two adjacent memory cells 11.

As shown in FIG. 52, the device isolation electrode 236 extends in the Y direction in the drawing. A plurality of memory cells 11 arranged in the Y direction in FIG. 52 is connected to, for example, the common device isolation electrode 236. In addition, as shown in FIG. 54, the device isolation electrode 236 is provided, for example, in the same layer as the word line 42.

In the embodiment, it is also possible to obtain the same effect as that of the fourteenth embodiment.

In addition, according to the embodiment, the adjacent selection transistors 20 are isolated by the device isolation electrode 236. For this reason, it is not necessary to provide the device isolation film 210 between the two selection transistors 20. Therefore, the shape of the device isolation film 210 can be simplified. In this manner, according to the embodiment, the nonvolatile memory can be easily manufactured.

In addition, the device isolation electrode 236 can be formed simultaneously with the word line 42. Therefore, it is possible to obtain the above-mentioned effect without increasing a load in the manufacturing process.

Figure 55:
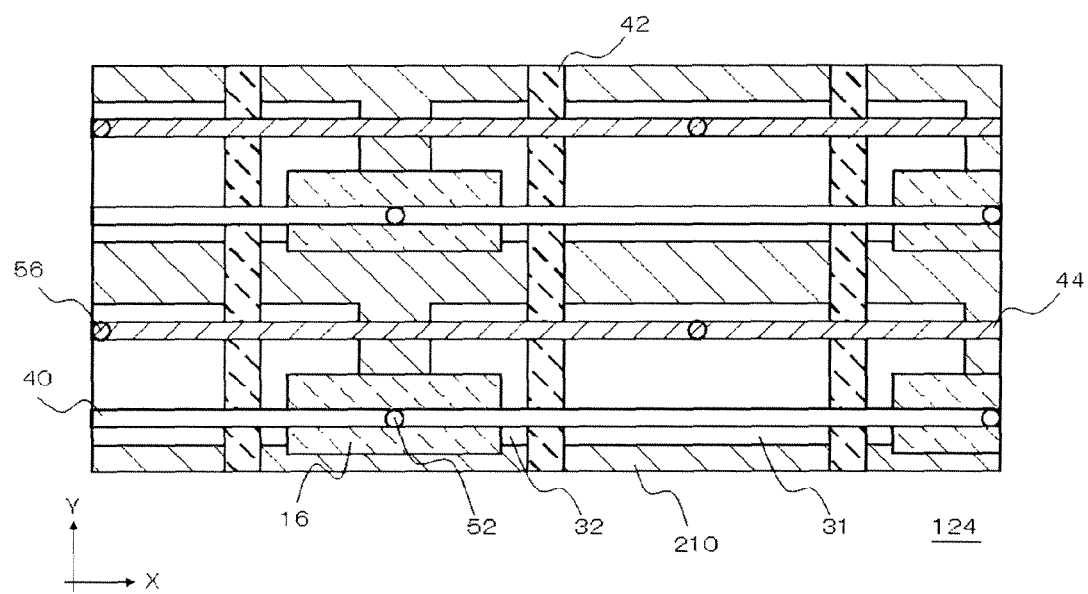
FIG. 55 is a top view illustrating the cell array structure constituting the nonvolatile memory according to a sixteenth embodiment.
Figure 56:
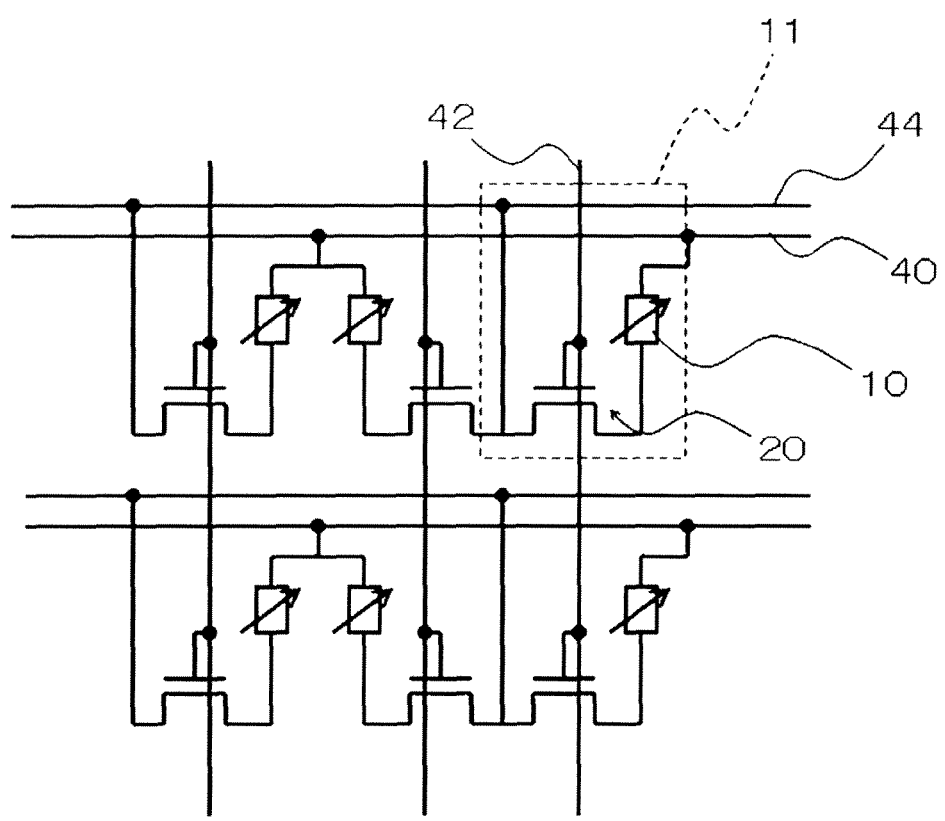
FIG. 56 is a circuit diagram illustrating the cell array structure shown in FIG. 55.

FIG. 55 is a top view illustrating a cell array structure constituting a nonvolatile memory 124 according to a sixteenth embodiment, and shows a portion of the cell array structure. FIG. 56 is a circuit diagram illustrating the cell array structure shown in FIG. 55.

The nonvolatile memory 124 according to the embodiment includes the configurations of the nonvolatile memory 118 according to the thirteenth embodiment and the nonvolatile memory 120 according to the fourteenth embodiment.

As shown in FIG. 55, the source/drain region 31 of one memory cell 11 is formed integrally with the source/drain region 31 of the memory cell 11 adjacent in the X direction in the drawing. That is, the two memory cells 11 adjacent in the X direction share the source/drain region 31 with each other. The source/drain regions 31 which are integrally formed are connected to the bit line 44 through one bit contact 56.

In addition, as shown in FIG. 55, the upper electrode 16 of the one memory cell 11 is formed integrally with the upper electrode 16 of the memory cell 11 adjacent on the side opposite to the memory cell 11 sharing the source/drain region 31. The upper electrodes 16 which are integrally formed are connected to the plate line 40 through one plate contact 52. As shown in FIGS. 55 and 56, two adjacent memory cells 11 in which the upper electrodes 16 are integrally formed are connected to the same bit line 44. Meanwhile, similarly to the configuration shown in FIG. 51, the lower electrodes 14 included in each of the two adjacent memory cells 11 in which the upper electrodes 16 are integrally formed are separated from each other (not shown).

In the embodiment, it is also possible to obtain the same effect as those of the thirteenth embodiment and the fourteenth embodiment.

Figure 57:
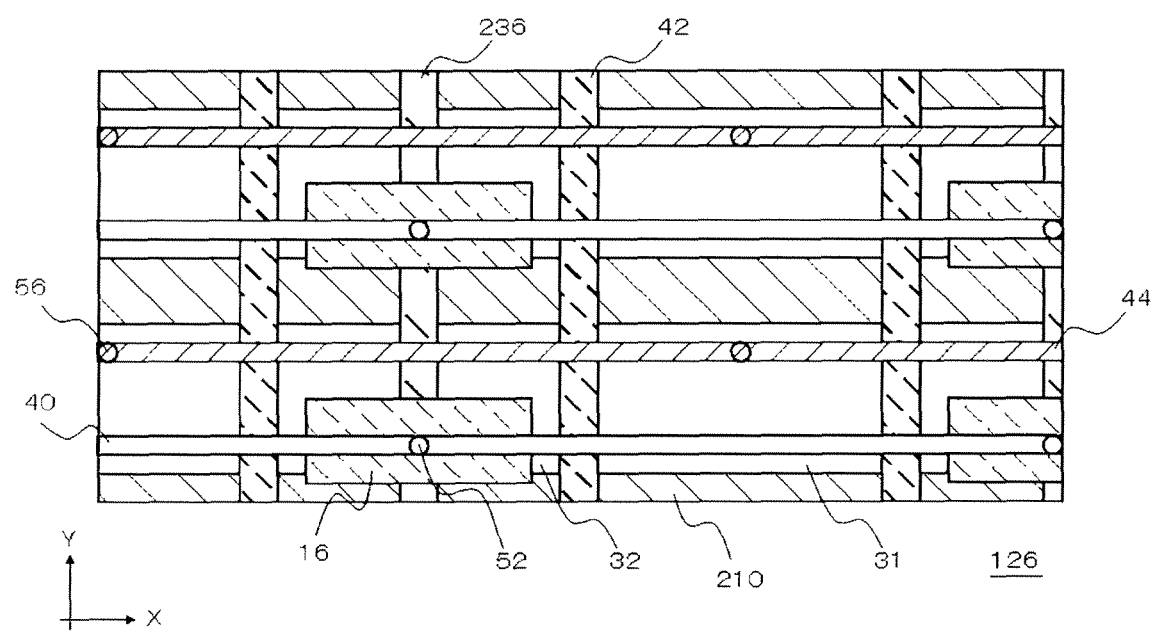
FIG. 57 is a top view illustrating the cell array structure constituting the nonvolatile memory according to a seventeenth embodiment.
Figure 58:
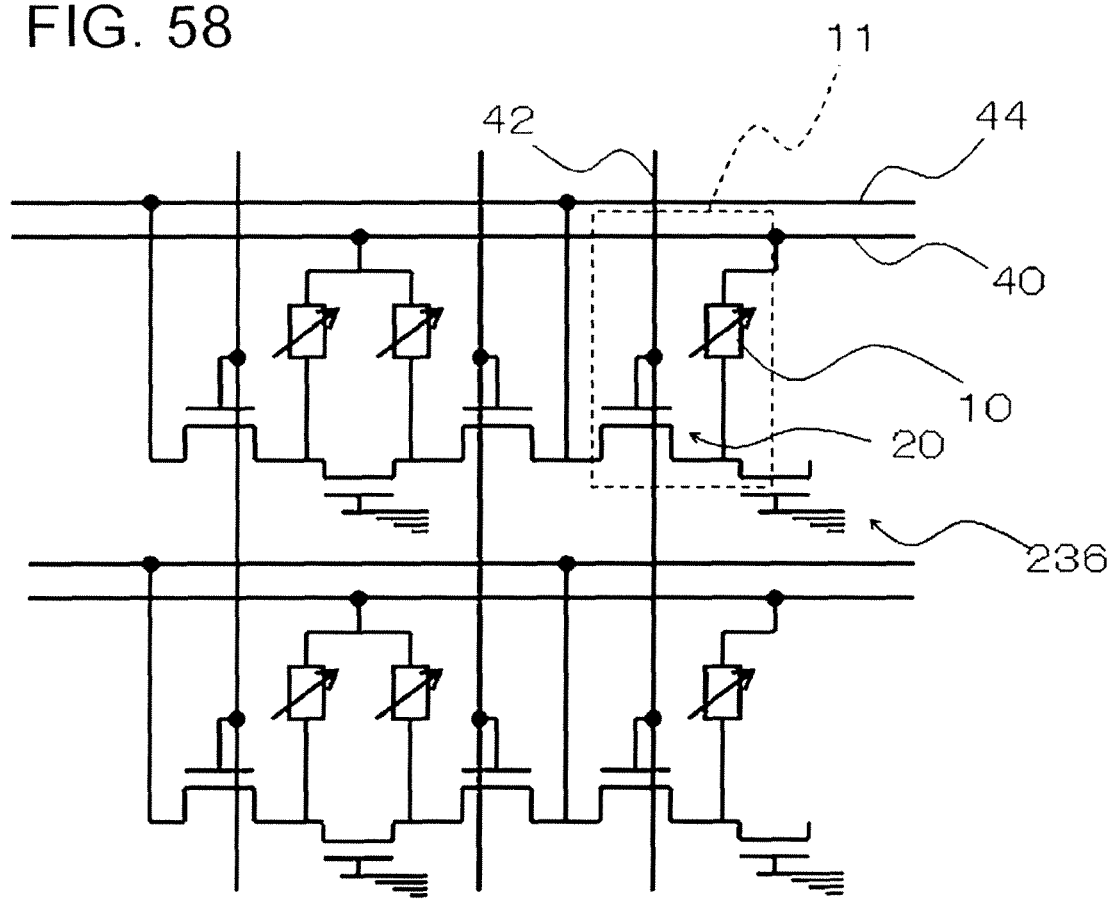
FIG. 58 is a circuit diagram illustrating the cell array structure shown in FIG. 57.

FIG. 57 is a top view illustrating a cell array structure constituting a nonvolatile memory 126 according to a seventeenth embodiment, and shows a portion of the cell array structure. FIG. 58 is a circuit diagram illustrating the cell array structure shown in FIG. 57.

The nonvolatile memory 126 according to the embodiment has the same configuration as that of the nonvolatile memory 124 according to the sixteenth embodiment, except that two adjacent memory cells 11 are isolated by the device isolation electrode 236. In addition, the configuration regarding the device isolation electrode 236 is the same as that of the nonvolatile memory 122 according to the fifteenth embodiment.

As shown in FIGS. 57 and 58, the device isolation electrode 236 is provided between two adjacent memory cells 11 in which the upper electrodes 16 are integrally formed. As shown in FIG. 57, the device isolation electrode 236 extends in the Y direction in the drawing. The memory cells 11 arranged in the Y direction have the common device isolation electrode 236.

As shown in FIG. 57, in the embodiment, the device isolation film 210 is not provided between two memory cells 11 adjacent in the X direction in the drawing in which the upper electrodes 16 are integrally formed. In addition, the device isolation film 210 is not provided between the two memory cells 11 adjacent in the X direction in the drawing in which the source/drain regions 31 are integrally formed. That is, as shown in FIG. 57, the device isolation film 210 can be provided so as to extend linearly only in the X direction in the drawing.

In the embodiment, it is also possible to obtain the same effect as those of the fifteenth embodiment and the sixteenth embodiment.

In addition, according to the embodiment, the device isolation film 210 can be provided so as to extend linearly only in one direction. For this reason, processing of the device isolation film 210 is facilitated. Therefore, the nonvolatile memory can be easily manufactured.

Figure 59:
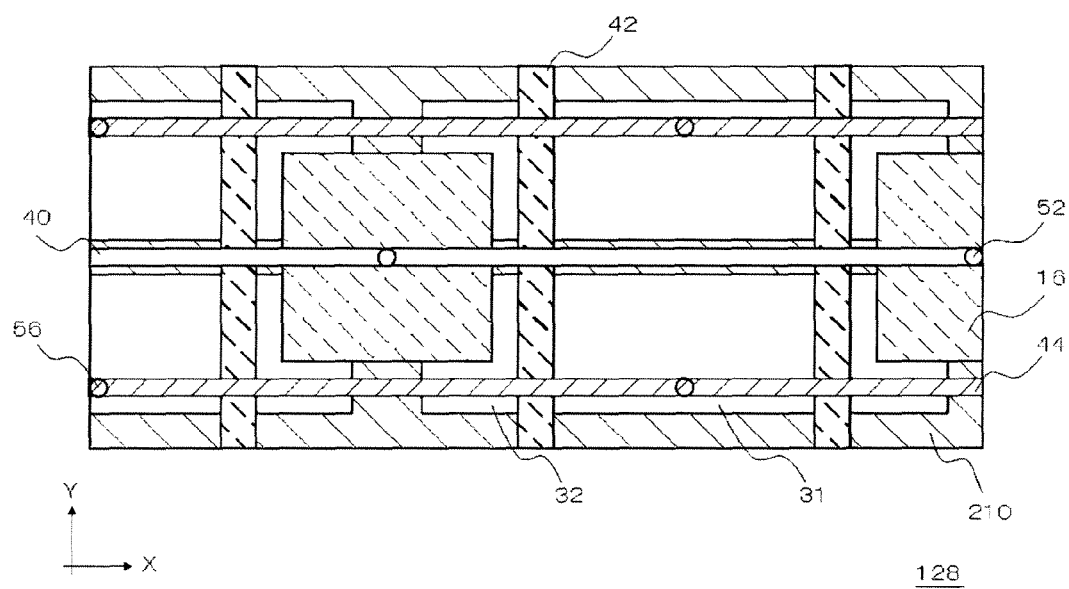
FIG. 59 is a top view illustrating the cell array structure constituting the nonvolatile memory according to an eighteenth embodiment.
Figure 60:
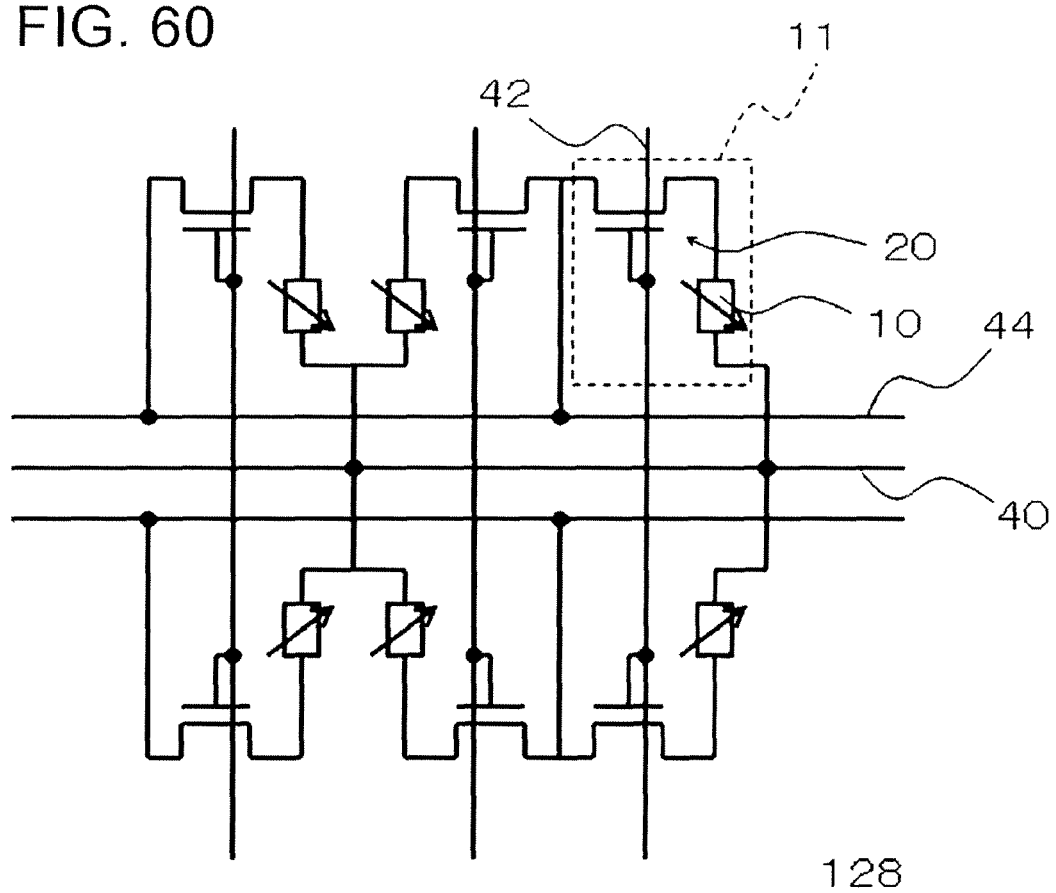
FIG. 60 is a circuit diagram illustrating the cell array structure shown in FIG. 59.

FIG. 59 is a top view illustrating a cell array structure constituting a nonvolatile memory 128 according to an eighteenth embodiment, and shows a portion of the cell array structure. FIG. 60 is a circuit diagram illustrating the cell array structure shown in FIG. 59.

In the nonvolatile memory 128 according to the embodiment, two memory cells 11 connected to the bit lines 44 different from each other are configured such that the upper electrodes 16 are formed integrally with each other, and the lower electrodes 14 are separated from each other. The upper electrodes 16 which are integrally formed are connected to the plate line 40 through one plate contact 52. The nonvolatile memory 128 according to the embodiment has the same configuration as that of the nonvolatile memory 124 according to the sixteenth embodiment, except for these points.

As shown in FIG. 59, in the nonvolatile memory 128 according to the embodiment, the upper electrodes 16 included in each of the two memory cells 11 adjacent in the Y direction in the drawing are formed integrally with each other. The two memory cells 11 adjacent in the Y direction in the drawing are connected to the bit lines 44 different from each other. In addition, the upper electrodes 16 included in each of the two memory cells 11 adjacent in the X direction in the drawing are formed integrally with each other.

For this reason, the upper electrodes 16 included in each of four memory cells 11 are integrally formed. As shown in FIGS. 59 and 60, the upper electrodes 16, integrally formed, which are included in each of the four memory cells 11 are connected to the plate line 40 through one plate contact 52.

The lower electrodes 14 included in each of the memory cells 11 in which the upper electrodes 16 are integrally formed are separated from each other (not shown). Each of the lower electrodes 14 separated from each other is respectively connected to the different source/drain regions 32 through the different source/drain contacts 54. For this reason, each of the variable resistance devices 10 in which the upper electrodes 16 are integrally formed can be independently controlled corresponding to each of the lower electrodes 14 separated from each other. Therefore, each of the memory cells 11 in which the upper electrodes 16 are integrally formed can be caused to function as the memory cells 11 independent of each other.

Meanwhile, in the embodiment, the device isolation electrode 236 may be provided between two memory cells 11 adjacent in the X direction in FIG. 59 in which the upper electrodes 16 are integrally formed. Two memory cells 11 adjacent in the X direction in FIG. 59 in which the upper electrodes 16 are integrally formed can be isolated from each other by providing the device isolation electrode 236. In this case, the device isolation film 210 can be provided so as to extend linearly only in the X direction in FIG. 59.

Moreover, in the embodiment, the specific selection transistor 20 can be selected by combination of the bit line 44 and the word line 42.

In the embodiment, it is also possible to obtain the same effect as that of the sixteenth embodiment.

In addition, two memory cells 11 adjacent in the Y direction in FIG. 59 in which the upper electrodes 16 are integrally formed are connected to one plate line 40. For this reason, the number of plate lines 40 can be reduced. Therefore, the area of the cell array structure can be reduced.

Figure 61:
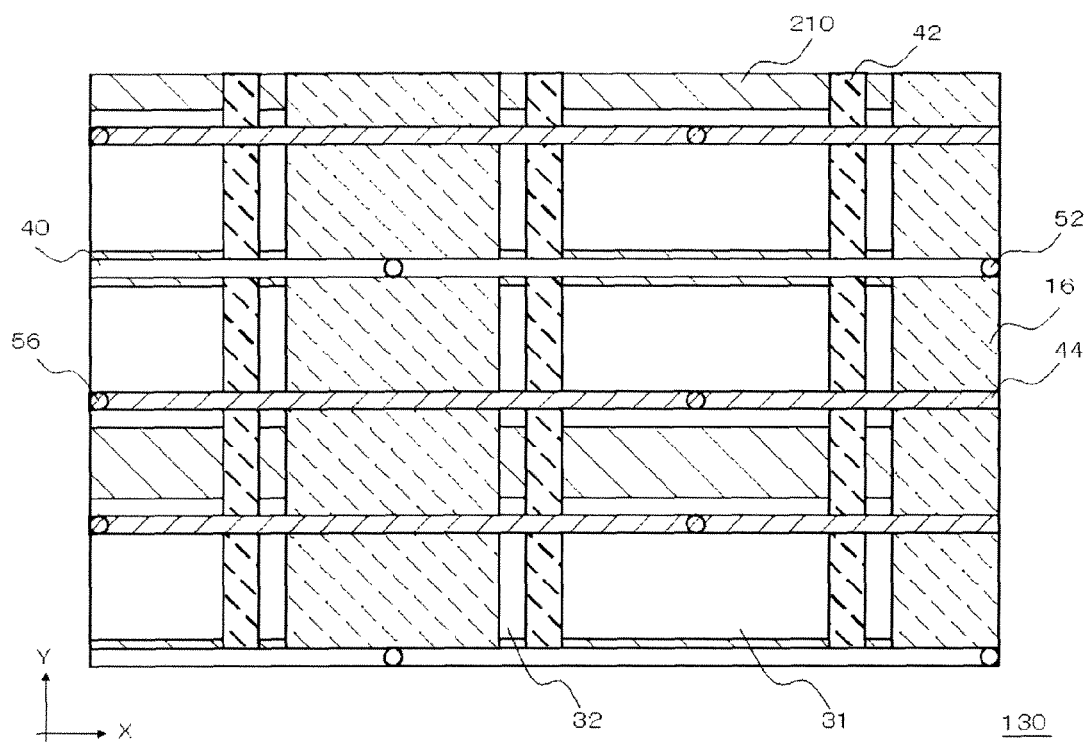
FIG. 61 is a top view illustrating the cell array structure constituting the nonvolatile memory according to a nineteenth embodiment.
Figure 62:
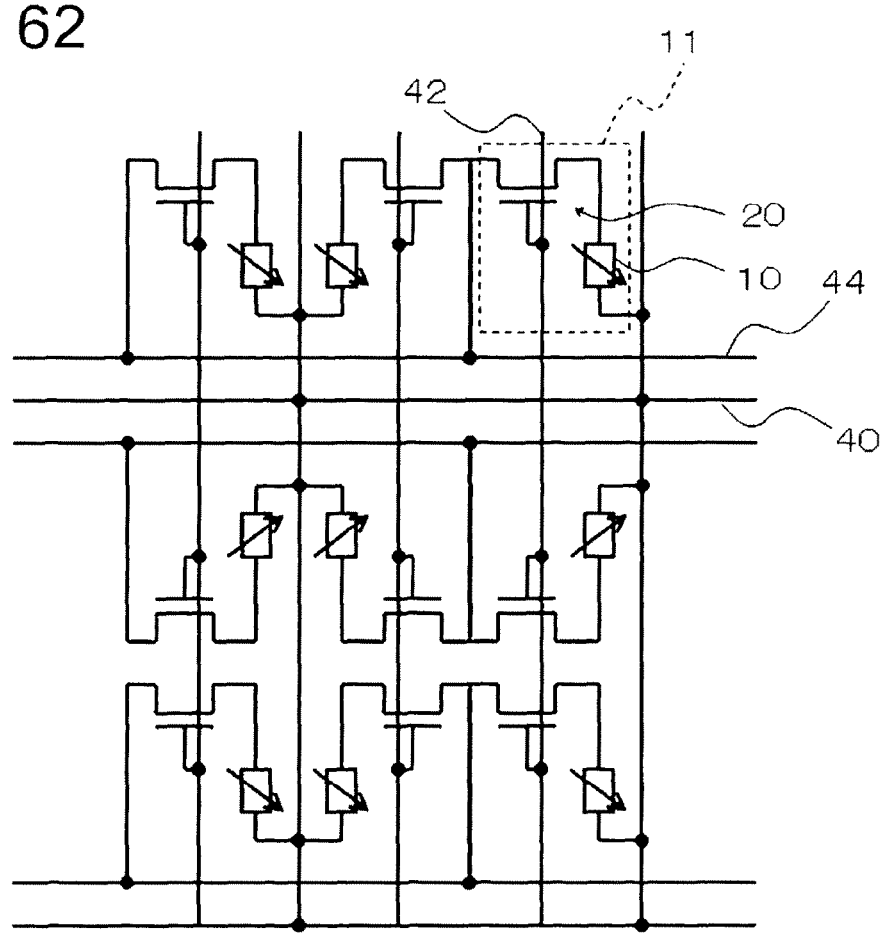
FIG. 62 is a circuit diagram illustrating the cell array structure shown in FIG. 61.

FIG. 61 is a top view illustrating a cell array structure constituting a nonvolatile memory 130 according to a nineteenth embodiment, and shows a portion of the cell array structure. FIG. 62 is a circuit diagram illustrating the cell array structure shown in FIG. 61.

In the nonvolatile memory 130 according to the embodiment, a plurality of memory cells 11 connected to the bit lines 44 different from each other and arranged in one direction is configured such that the upper electrodes 16 are formed integrally with each other, and the lower electrodes 14 are separated from each other. The nonvolatile memory 130 according to the embodiment has the same configuration as that of the nonvolatile memory 128 according to the eighteenth embodiment, except for these points.

As shown in FIG. 61, in the nonvolatile memory 130 according to the embodiment, the upper electrodes 16 included in each of a plurality of memory cells 11 arranged in the Y direction in the drawing are formed integrally with each other. In addition, as shown in FIGS. 61 and 62, a plurality of memory cells 11 arranged in the Y direction in FIG. 61 is connected to the bit lines 44 different from each other.

In the embodiment, as shown in FIG. 61, the upper electrode 16 can be provided, for example, so as to extend linearly in the Y direction. For this reason, processing of the upper electrode 16 is facilitated. Therefore, even when the material, which is not easily etched, for example, such as Pt is applied as the upper electrode, it is possible to easily form the variable resistance device.

As shown in FIG. 61, in the embodiment, the upper electrodes 16 are provided integrally with each other in a plurality of memory cells 11 arranged in the Y direction in the drawing. In addition, a plurality of memory cells 11 arranged in the X direction in the drawing is connected to the same plate line 40. For this reason, the upper electrodes 16 included in each of all the memory cells 11 constituting the nonvolatile memory 130 have the same potential. That is, even when the number of plate lines is omitted, the nonvolatile memory can be normally operated. Therefore, it is possible to reduce the area of the cell array structure.

Meanwhile, in the embodiment, the specific selection transistor 20 can be selected by combination of the bit line 44 and the word line 42.

The lower electrodes 14 included in each of the memory cells 11 in which the upper electrodes 16 are integrally formed are separated from each other (not shown). Each of the lower electrodes 14 separated from each other is respectively connected to the different source/drain regions 32 through the different source/drain contacts 54. For this reason, each of the variable resistance devices 10 in which the upper electrodes 16 are integrally formed can be independently controlled corresponding to each of the lower electrodes 14 separated from each other. Therefore, each of the memory cells 11 in which the upper electrodes 16 are integrally formed can be caused to function as the memory cells 11 independent of each other.

In the embodiment, the insulating films 12 included in each of a plurality of memory cells 11 in which the upper electrodes 16 are formed integrally with each other can be formed, for example, integrally with each other (not shown). In this case, the shape of the insulating film 12 can be made to be the same as the shape of the upper electrode 16. Thereby, processing of the variable resistance device can be facilitated.

In the embodiment, it is also possible to obtain the same effect as that of the eighteenth embodiment.

Figure 63:
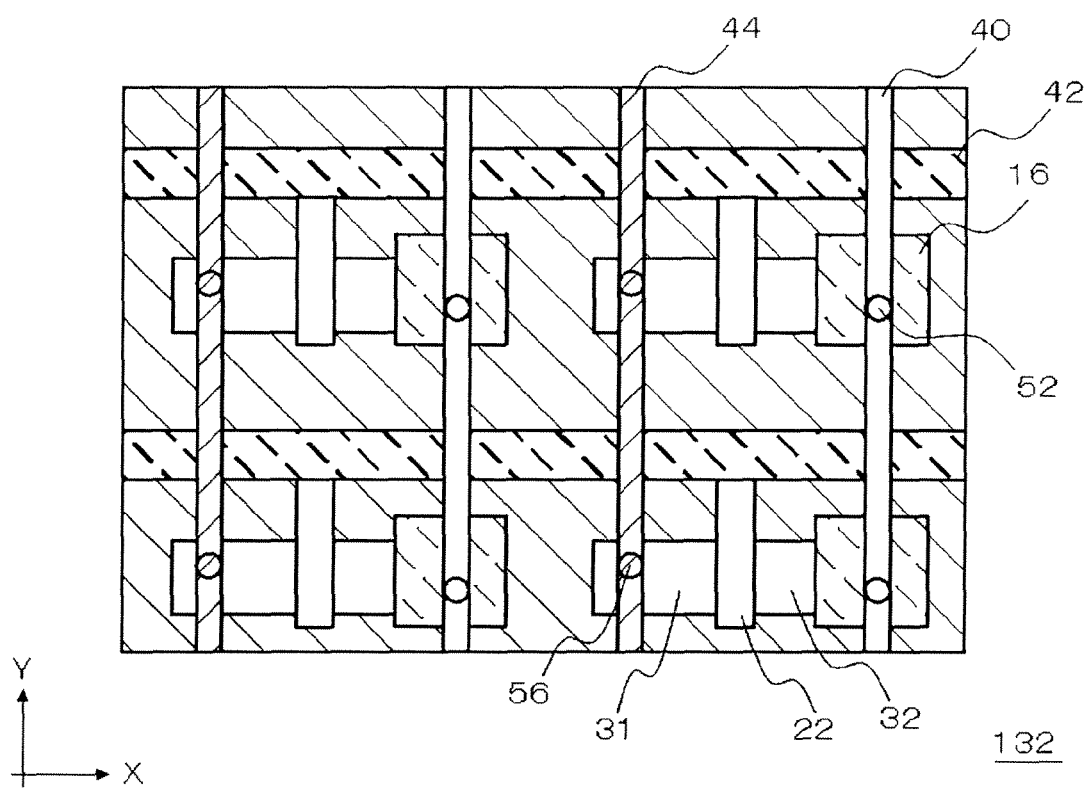
FIG. 63 is a top view illustrating the cell array structure constituting the nonvolatile memory according to a twentieth embodiment.
Figure 64:
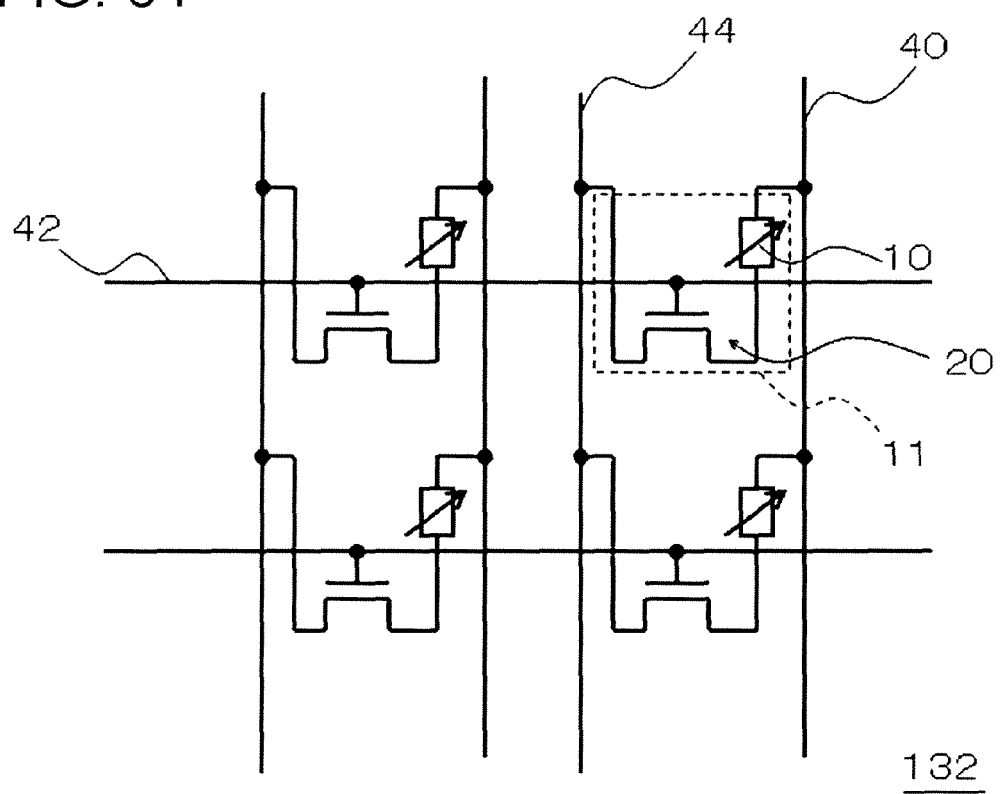
FIG. 64 is a circuit diagram illustrating the cell array structure shown in FIG. 63.

FIG. 63 is a top view illustrating a cell array structure constituting a nonvolatile memory 132 according to a twentieth embodiment, and shows a portion of the cell array structure. FIG. 64 is a circuit diagram illustrating the cell array structure shown in FIG. 63. The nonvolatile memory 132 according to the embodiment is configured such that the memory cells 11 having the structure shown in twelfth embodiment are arrange in an array.

As shown in FIG. 63, the word line 42 extends in the direction perpendicular to the gate electrode 22 included in the memory cell 11 within the plane horizontal to the planar surface of the substrate 30. In the embodiment, the word line 42 extends in the X direction in FIG. 63. As shown in FIGS. 63 and 64, the memory cells 11 arranged in the X direction in FIG. 63 are connected to the common word line 42.

As shown in FIG. 63, the plate line 40 and the bit line 44 extend in the direction parallel to the gate electrode 22. In the embodiment, the plate line 40 and the bit line 44 extend in the Y direction in FIG. 63. As shown in FIGS. 63 and 64, the memory cells 11 arranged in the Y direction in FIG. 63 are connected to the common plate line 40 and the bit line 44.

In the embodiment, it is also possible to obtain the same effect as that of the twelfth embodiment.

Figure 65:
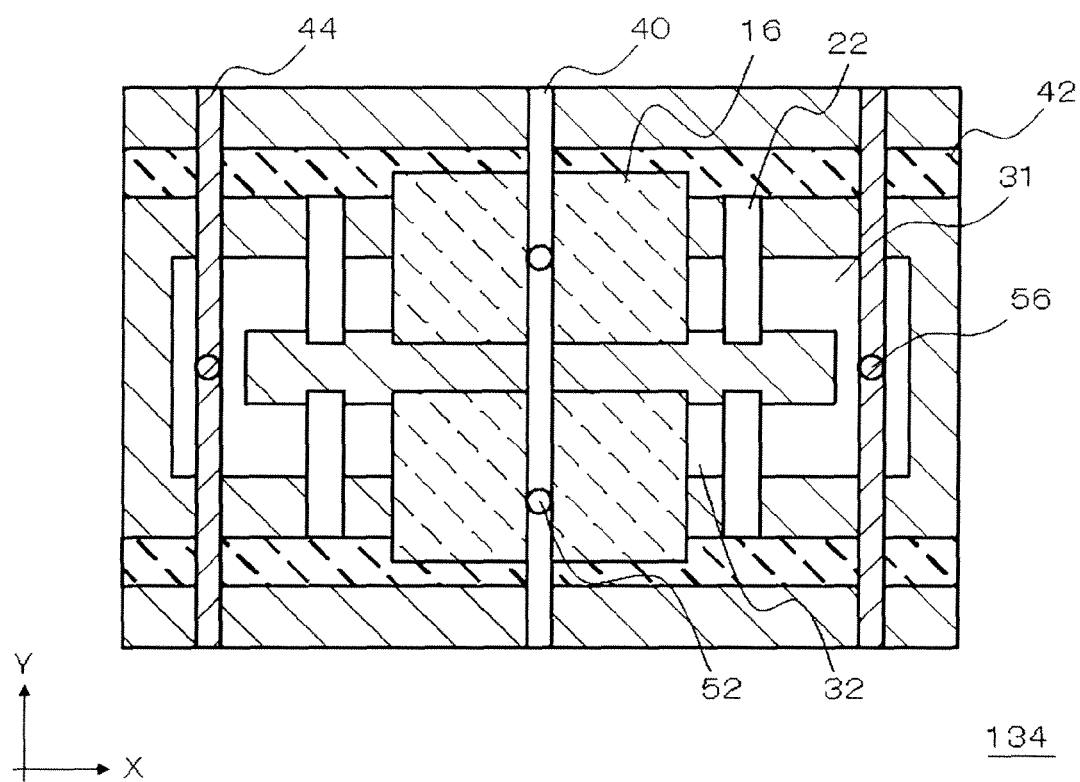
FIG. 65 is a top view illustrating the cell array structure constituting the nonvolatile memory according to a twenty-first embodiment.
Figure 66:
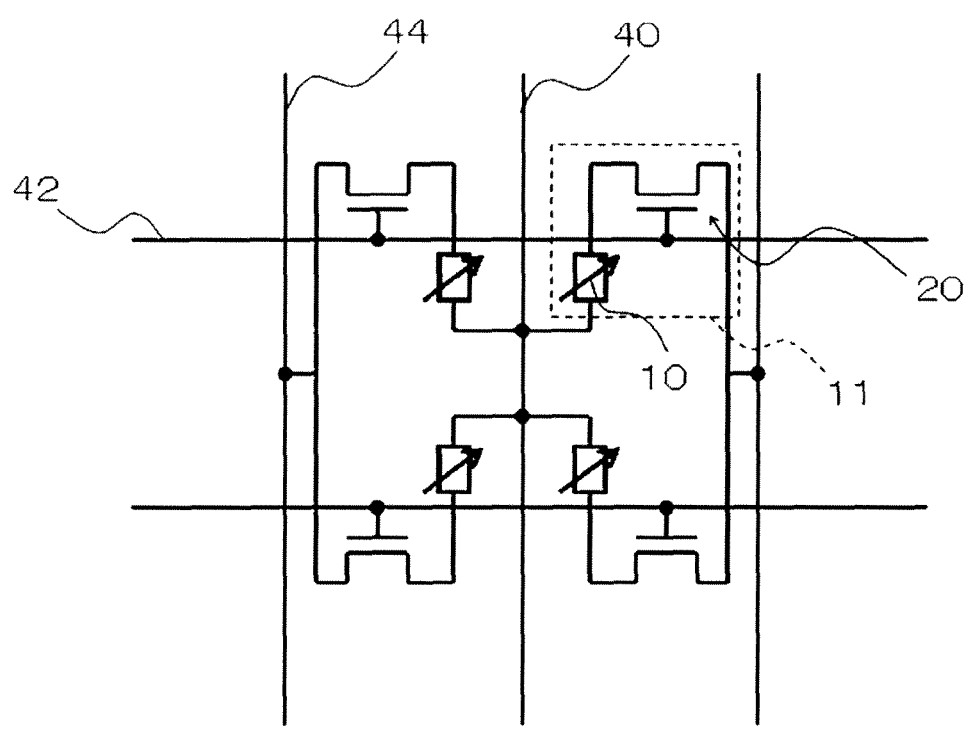
FIG. 66 is a circuit diagram illustrating the cell array structure shown in FIG. 65.

FIG. 65 is a top view illustrating a cell array structure constituting a nonvolatile memory 134 according to a twenty-first embodiment, and shows a portion of the cell array structure. FIG. 66 is a circuit diagram illustrating the cell array structure shown in FIG. 65.

In the nonvolatile memory 134 according to the embodiment, two adjacent memory cells 11 are configured such that the source/drain regions 31 are formed integrally with each other. The source/drain regions 31 which are integrally formed are connected to the bit line 44 through one bit contact 56.

In addition, two adjacent memory cells connected to the bit lines 44 different from each other are configured such that the upper electrodes 16 are formed integrally with each other, and the lower electrodes 14 are separated from each other. The upper electrodes 16 which are integrally formed are connected to the plate line 40 through one plate contact 52.

The nonvolatile memory 134 according to the embodiment has the same configuration as that of the nonvolatile memory 132 according to the twentieth embodiment, except for these points.

As shown in FIG. 65, in the nonvolatile memory 134 according to the embodiment, the source/drain regions 31 included in each of the two memory cells 11 adjacent in the Y direction in the drawing are provided integrally with each other. As shown in FIGS. 65 and 66, the source/drain regions 31 which are integrally formed are connected to the bit line 44 through one bit contact 56. In addition, two memory cells 11 in which the source/drain regions 31 are integrally provided are connected to the word lines 42 different from each other.

In addition, as shown in FIG. 65, the source/drain regions 31 of two memory cells 11 adjacent in the X direction in the drawing are isolated from each other by the device isolation film 210.

According to the embodiment, only one bit contact 56 is provided in the source/drain regions 31 which are integrally formed. That is, the limitation of the diameter of the bit contact 56 by the lithography resolution limit and the like is alleviated. Thereby, it is possible to increase the diameter of the bit contact 56, and to reduce the contact resistance in the bit contact 56. Therefore, the operation speed of the nonvolatile memory can be improved.

As shown in FIG. 65, in the nonvolatile memory 134 according to the embodiment, the upper electrodes 16 included in each of the two memory cells 11 adjacent in the X direction in the drawing are formed integrally with each other. The two memory cells 11 adjacent in the X direction in FIG. 65 are connected to the bit lines 44 different from each other. As shown in FIGS. 65 and 66, the upper electrodes 16, integrally provided, which are included in each of the two memory cells 11 are connected to the plate line 40 through one plate contact 52.

The lower electrodes 14 included in each of the memory cells 11 in which the upper electrodes 16 are integrally formed are separated from each other (not shown). Each of the lower electrodes 14 separated from each other is respectively connected to the different source/drain regions 32 through the different source/drain contacts 54. For this reason, each of the variable resistance devices 10 in which the upper electrodes 16 are integrally formed can be independently controlled corresponding to each of the lower electrodes 14 separated from each other. Therefore, each of the memory cells 11 in which the upper electrodes 16 are integrally formed can be caused to function as the memory cells 11 independent of each other.

According to the embodiment, two memory cells 11 adjacent in the X direction in FIG. 65 in which the upper electrodes 16 are integrally formed are connected to one plate line 40. For this reason, the number of plate lines 40 can be reduced. Therefore, the area of the cell array structure can be reduced.

In the embodiment, it is also possible to obtain the same effect as that of the twentieth embodiment.

Figure 67:
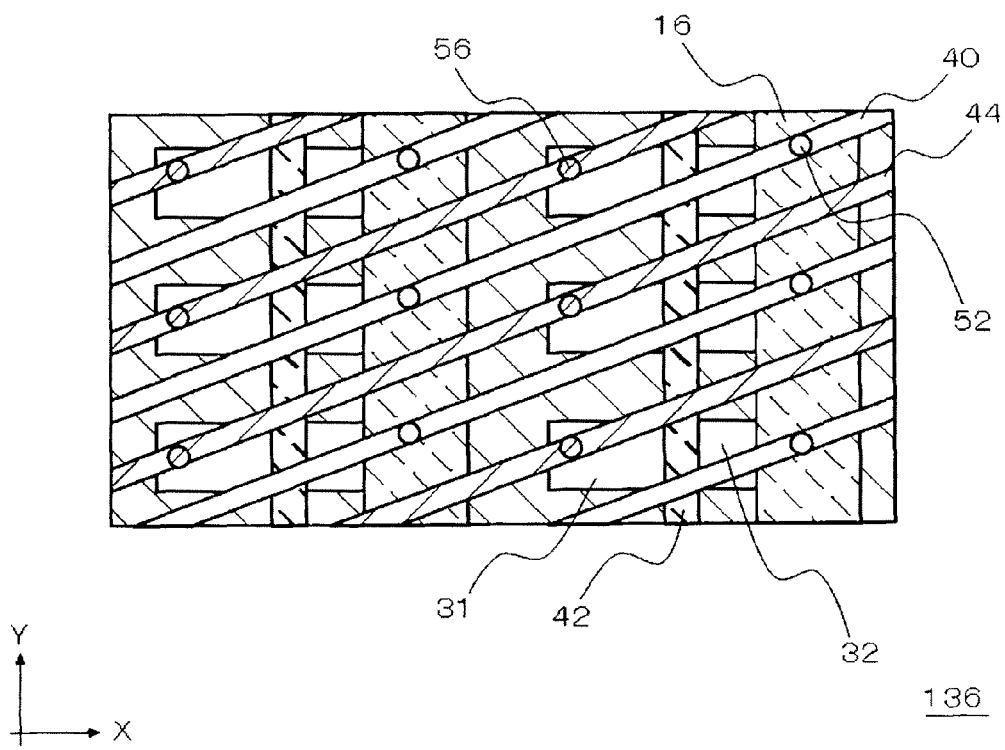
FIG. 67 is a top view illustrating the cell array structure constituting the nonvolatile memory according to a twenty-second embodiment.

FIG. 67 is a top view illustrating a cell array structure constituting a nonvolatile memory 136 according to a twenty-second embodiment, and shows a portion of the cell array structure.

In the nonvolatile memory 136 according to the embodiment, the plate line 40 and the bit line 44 are not provided perpendicular to the word line 42, within the plane horizontal to the planar surface of the substrate 30. In addition, a plurality of memory cells 11 connected to the bit lines 44 different from each other and arranged in one direction is configured such that the upper electrodes 16 are formed integrally with each other, and the lower electrodes 14 are separated from each other.

The nonvolatile memory 136 according to the embodiment has the same configuration as that of the nonvolatile memory 100 according to the first embodiment, except for these points.

As shown in FIG. 67, the plate line 40 and the bit line 44 are provided so as to extend obliquely to the word line 42, within the plane horizontal to the planar surface of the substrate 30. In addition, the plate line 40 and the bit line 44 are provided parallel to each other. A plurality of memory cells 11 arranged in the extending direction of the plate line 40 and the bit line 44 is connected to the common plate line 40 and the common bit line 44, and is connected to the word lines 42 different from each other.

When the plate line 40 and the bit line 44 extend obliquely to the word line 42, the gap between the plate line 40 and the bit line 44 is larger than the case where the plate line and the bit line extend in the direction perpendicular to the word line 42. In the embodiment, the plate line 40 and the bit line 44 are provided, for example, so as to extend in the direction inclined 45° from the extending direction of the word line 42. In this case, the gap between the plate line 40 and the bit line 44 is approximately 1.4 times larger than the case where the plate line and the bit line extend in the direction perpendicular to the word line 42.

As shown in FIG. 67, in the nonvolatile memory 136 according to the embodiment, the upper electrodes 16 included in each of a plurality of memory cells 11 arranged in the Y direction in the drawing are formed integrally with each other. In addition, a plurality of memory cells 11 arranged in the Y direction in FIG. 57 is connected to the bit lines 44 different from each other.

In the embodiment, as shown in FIG. 67, the upper electrode 16 can be provided, for example, so as to extend linearly in the Y direction. For this reason, processing of the upper electrode 16 is facilitated. Therefore, even when the material, which is not easily etched, for example, such as Pt is applied as the upper electrode, it is possible to easily form the variable resistance device.

In the embodiment, it is also possible to obtain the same effect as that of the first embodiment.

The plate line 40 is connected to the source/drain region 32, and the bit line 44 is connected to the source/drain region 31. For this reason, when the plate line 40 and the bit line 44 are provided perpendicular to the gate electrode 22 as in the first embodiment, a gate width by which the plate line 40 and the bit line 44 are provided parallel to each other is required.

According to the embodiment, the plate line 40 and the bit line 44 are provided so as to extend obliquely to the word line 42. Thereby, it is possible to increase the gap between the plate line 40 and the bit line 44. That is, even when the gate width is made small, it is possible to maintain the gap between the plate line 40 and the bit line 44. Therefore, it is possible to realize a cell array structure having a fine selection transistor of which the gate width is small.

Example 1

Figure 16:
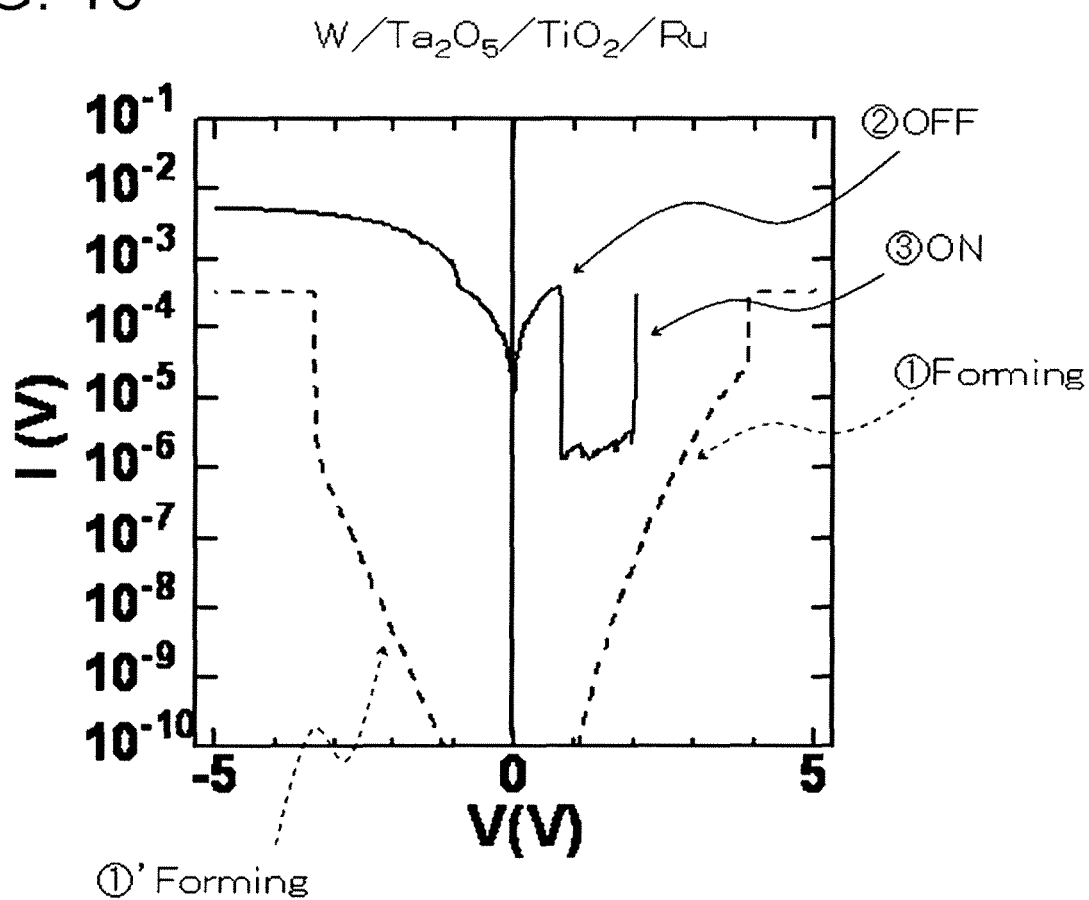
FIG. 16 is a graph illustrating operation behavior of the nonvolatile memory according to Example 1.

FIG. 16 is a graph illustrating operation behavior of the nonvolatile memory 100 according to Example 1. In Example 1, a voltage was applied to the variable resistance device 10 obtained by laminating Ru ($\Delta H_f$=152.5 kJ/mol), TiO$_2$ ($\Delta H_f$=472.5 kJ/mol), Ta$_2$O$_5$ ($\Delta H_f$=409.2 kJ/mol), and W ($\Delta H_f$=280.9667 to 294.85 kJ/mol) in this order, to examine the operation behavior of the nonvolatile memory 100. In this case, W constitutes the first electrode in the variable resistance device 10, and Ru constitutes the second electrode in the variable resistance device 10.

Meanwhile, FIG. 16 shows a relationship between the value of the voltage applied to the second electrode and the value of the current flowing to the variable resistance device 10. Hereinafter, the same is of FIG. 17 to 21.

As shown in FIG. 16, in Example 1, when a positive voltage was applied to the second electrode, the transition to a high-resistance state (OFF state) and the transition to a low-resistance state (ON state) occurred. On the other hand, when a positive voltage was applied to the first electrode (a negative voltage was applied to the second electrode), the transition to a high-resistance state did not occur.

Example 2

Figure 17:
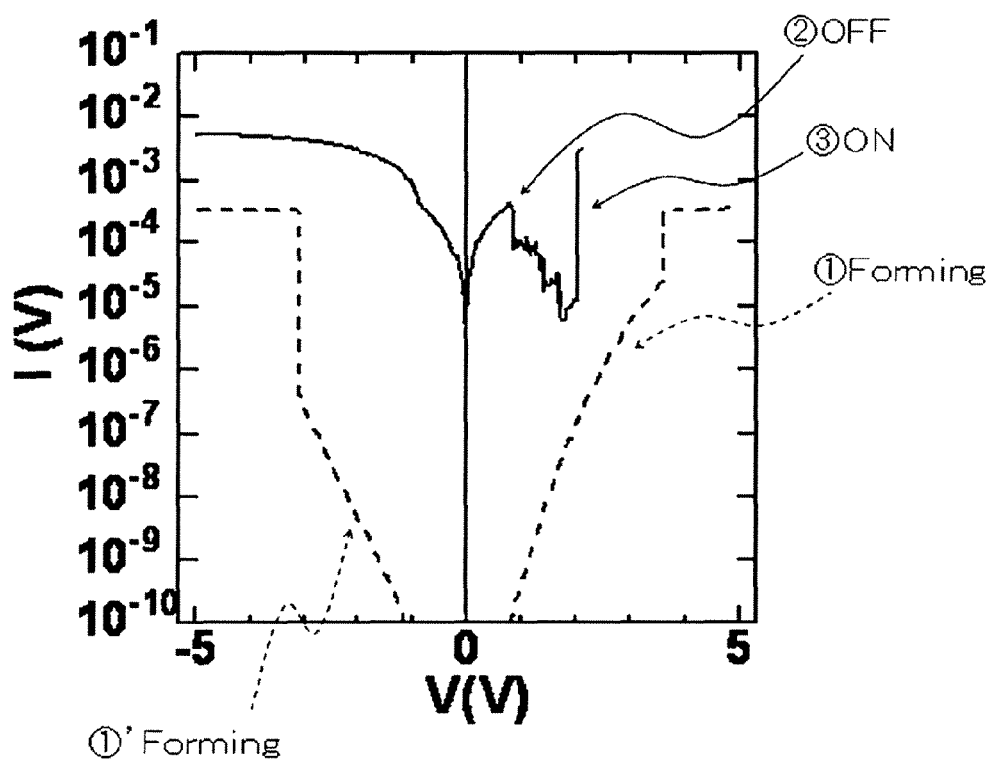
FIG. 17 is a graph illustrating operation behavior of the nonvolatile memory according to Example 2.

FIG. 17 is a graph illustrating operation behavior of the nonvolatile memory 100 according to Example 2. In Example 2, a voltage was applied to the variable resistance device 10 obtained by laminating Ru ($\Delta H_f$=152.5 kJ/mol), TiO$_2$ ($\Delta H_f$=472.5 kJ/mol), Ta$_2$O$_5$ ($\Delta H_f$=409.2 kJ/mol), and TiN ($\Delta H_f$=303.5 kJ/mol) in this order, to examine the operation behavior of the nonvolatile memory 100. In this case, TiN constitutes the first electrode, and Ru constitutes the second electrode.

As shown in FIG. 17, in Example 2, when a positive voltage was applied to the second electrode, the transition to a high-resistance state (OFF state) and the transition to a low-resistance state (ON state) occurred. On the other hand, when a positive voltage was applied to the first electrode (a negative voltage was applied to the second electrode), the transition to a high-resistance state did not occur.

Example 3

Figure 18:
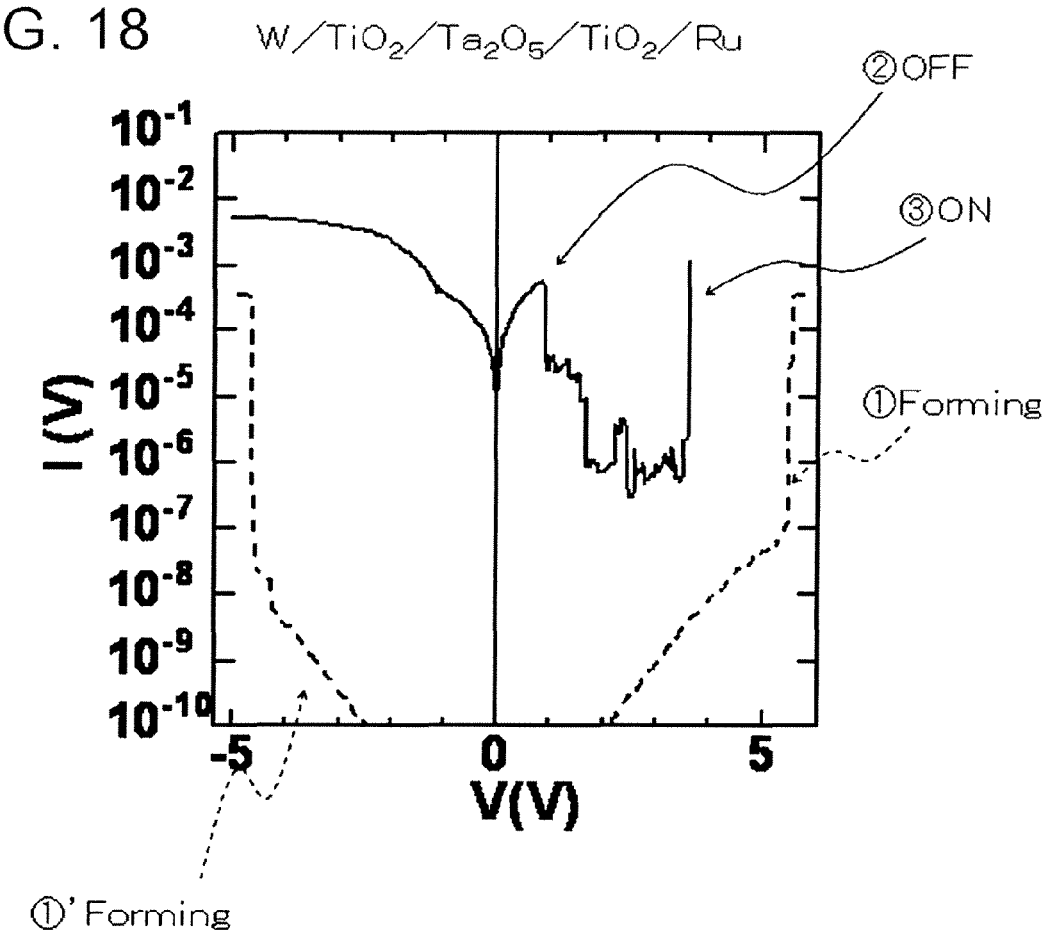
FIG. 18 is a graph illustrating operation behavior of the nonvolatile memory according to Example 3.

FIG. 18 is a graph illustrating operation behavior of the nonvolatile memory 100 according to Example 3. In Example 3, a voltage was applied to the variable resistance device 10 obtained by laminating Ru ($\Delta H_f$=152.5 kJ/mol), TiO$_2$ ($\Delta H_f$=472.5 kJ/mol), Ta$_2$O$_5$ ($\Delta H_f$=409.2 kJ/mol), TiO$_2$, and W ($\Delta H_f$=280.9667 to 294.85 kJ/mol) in this order, to examine the operation behavior of the nonvolatile memory 100. In this case, W constitutes the first electrode, and Ru constitutes the second electrode.

As shown in FIG. 18, in Example 3, when a positive voltage was applied to the second electrode, the transition to a high-resistance state (OFF state) and the transition to a low-resistance state (ON state) occurred. On the other hand, when a positive voltage was applied to the first electrode (a negative voltage was applied to the second electrode), the transition to a high-resistance state did not occur.

Example 4

Figure 19:
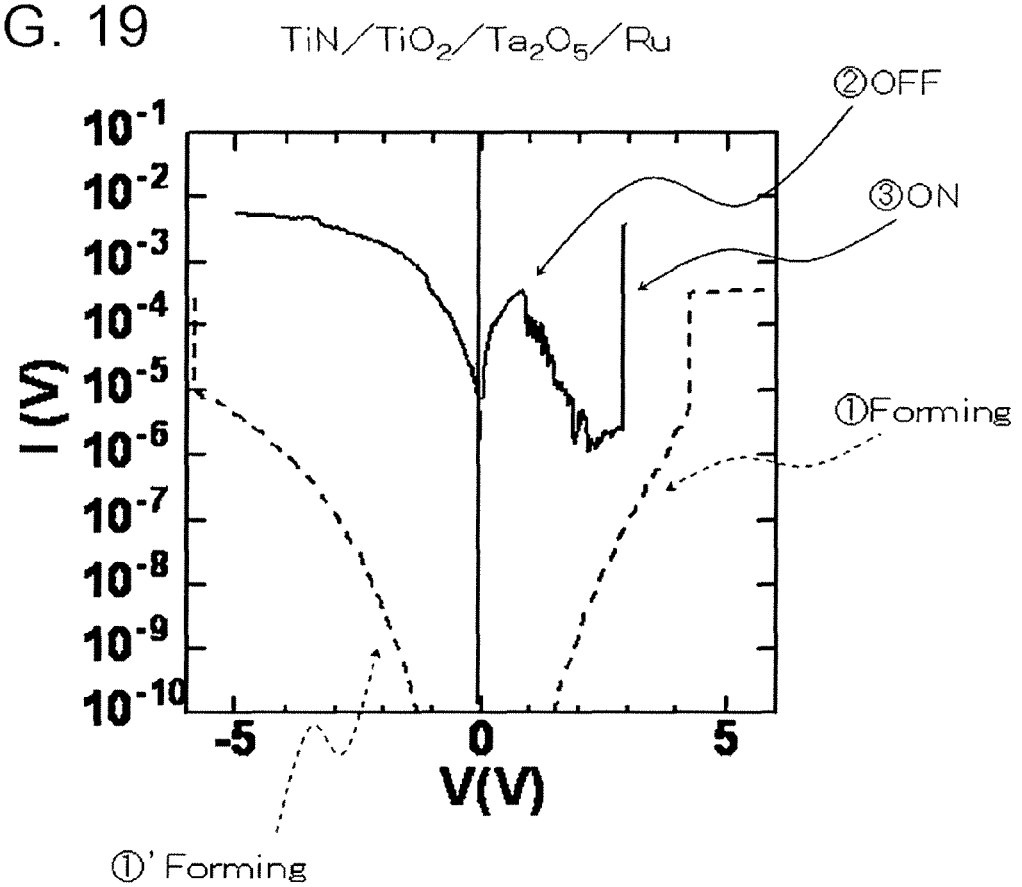
FIG. 19 is a graph illustrating operation behavior of the nonvolatile memory according to Example 4.

FIG. 19 is a graph illustrating operation behavior of the nonvolatile memory 100 according to Example 4. In Example 4, a voltage was applied to the variable resistance device 10 obtained by laminating Ru ($\Delta H_f$=152.5 kJ/mol), $Ta_2O_5$ ($\Delta H_f$=409.2 kJ/mol), $TiO_2$ ($\Delta H_f$=472.5 kJ/mol), and TiN ($\Delta H_f$=303.5 kJ/mol) in this order, to examine the operation behavior of the nonvolatile memory 100. In this case, TiN constitutes the first electrode, and Ru constitutes the second electrode.

As shown in FIG. 19, in Example 4, when a positive voltage was applied to the second electrode, the transition to a high-resistance state (OFF state) and the transition to a low-resistance state (ON state) occurred. On the other hand, when a positive voltage was applied to the first electrode (a negative voltage was applied to the second electrode), the transition to a high-resistance state did not occur.

Comparative Example 1

Figure 20:
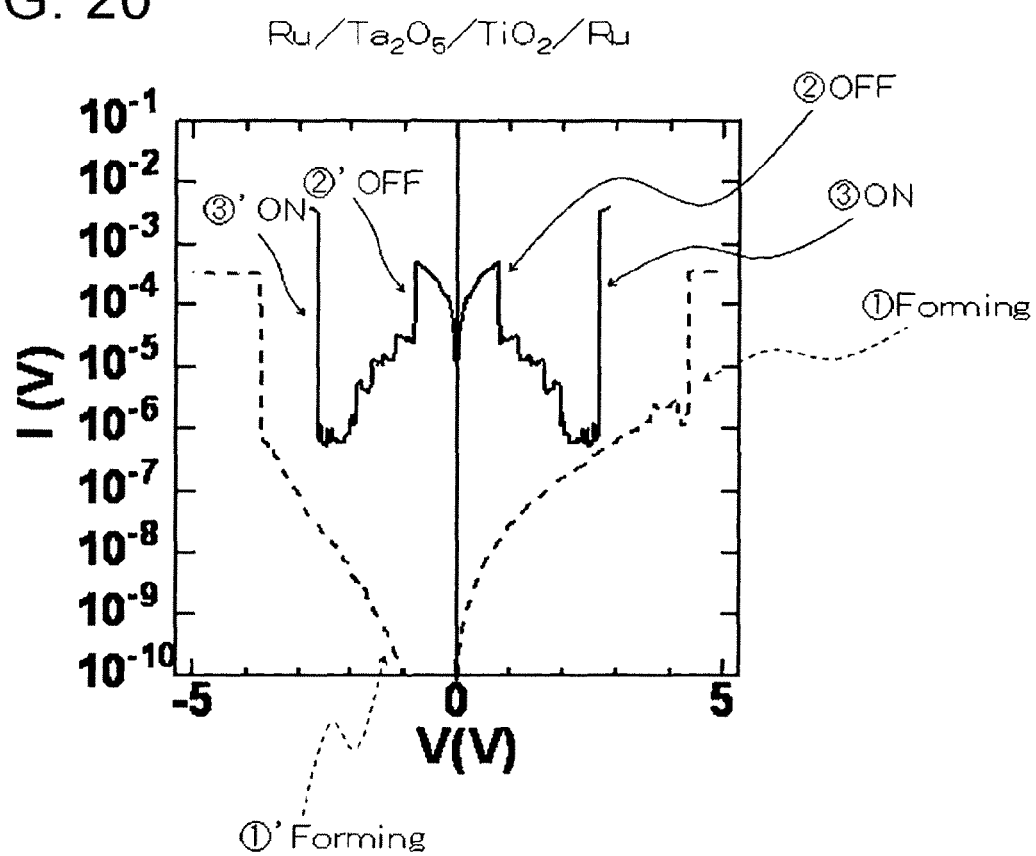
FIG. 20 is a graph illustrating operation behavior of the nonvolatile memory according to Comparative Example 1.

FIG. 20 is a graph illustrating operation behavior of the nonvolatile memory according to Comparative Example 1. In Comparative Example 1, a voltage was applied to the variable resistance device 10 obtained by laminating Ru ($\Delta H_f$=152.5 kJ/mol), $TiO_2$ ($\Delta H_f$=472.5 kJ/mol), $Ta_2O_5$ ($\Delta H_f$=409.2 kJ/mol), and Ru in this order, to examine the operation behavior of the nonvolatile memory. In this case, Ru constitutes the first electrode and the second electrode.

As shown in FIG. 20, in Comparative Example 1, even when a positive voltage was applied to any of the first electrode and the second electrode, the transition to a high-resistance state (OFF state) and the transition to a low-resistance state (ON state) occurred.

Comparative Example 2

Figure 21:
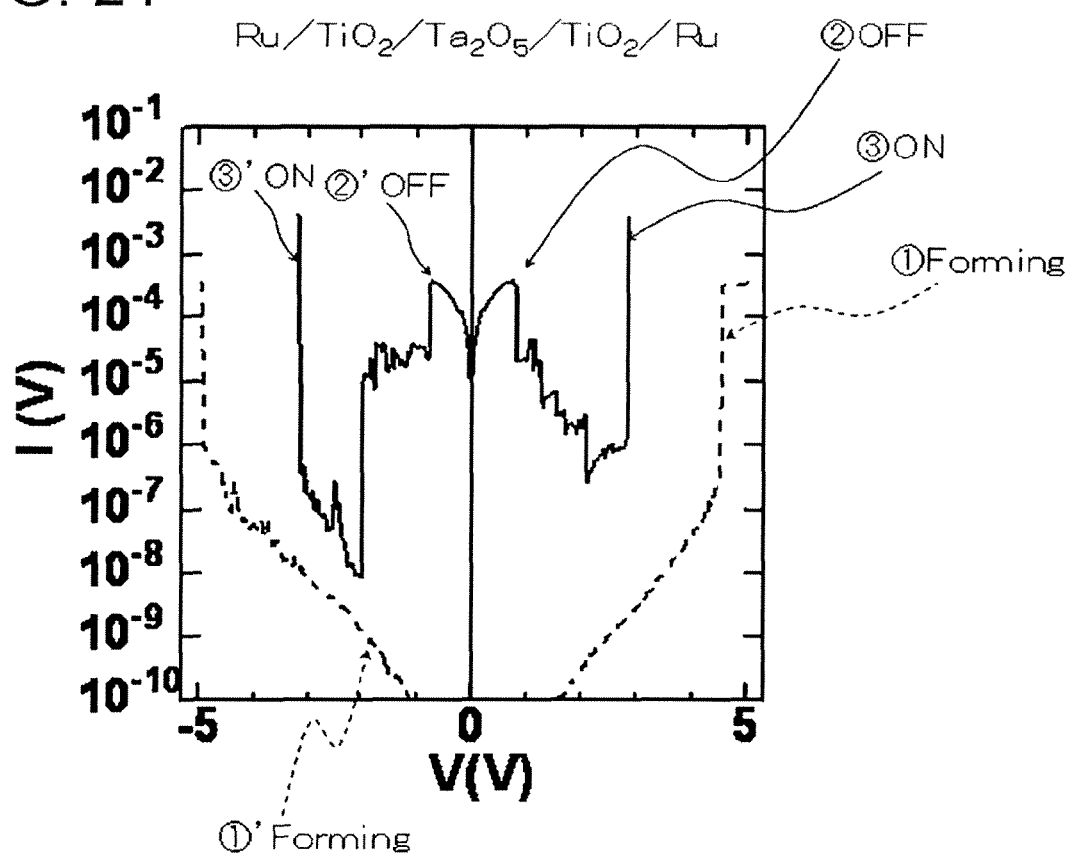
FIG. 21 is a graph illustrating operation behavior of the nonvolatile memory according to Comparative Example 2.
Figure 22:
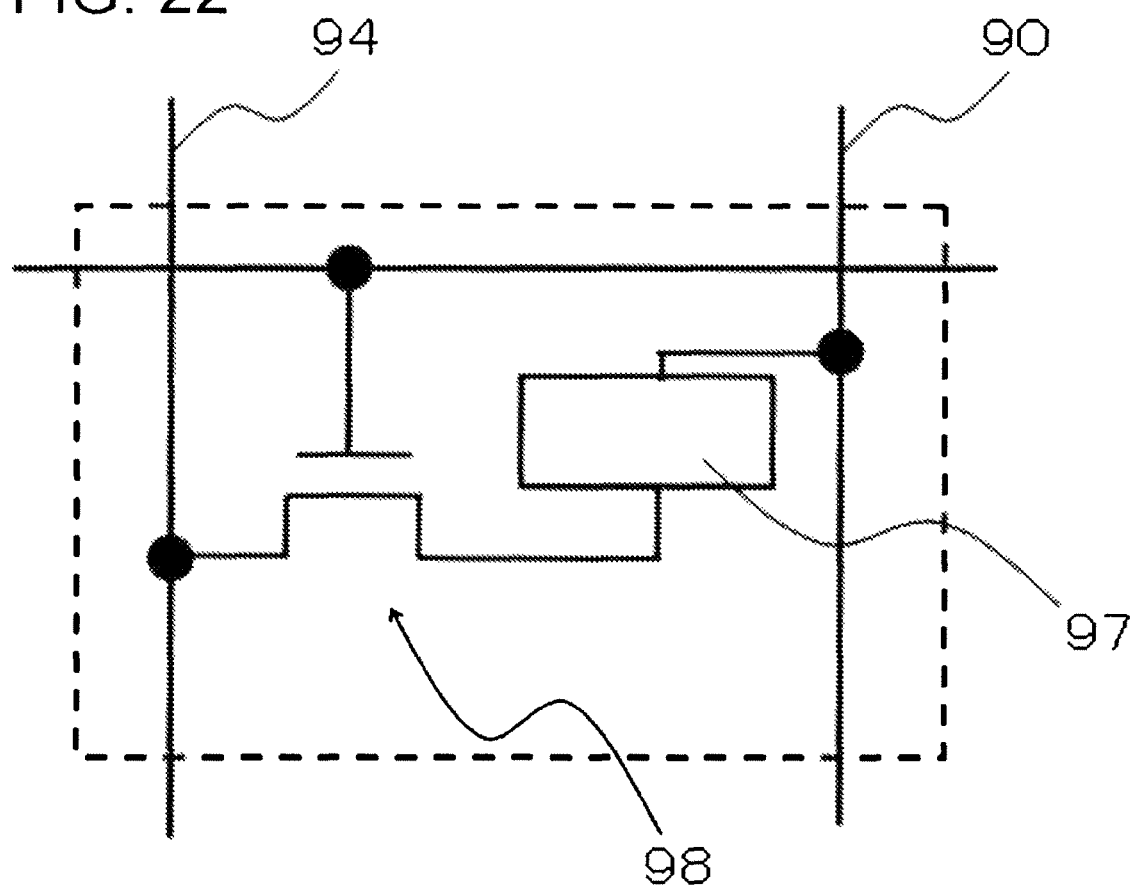
FIG. 22 is a circuit diagram illustrating a typical configuration of a ReRAM cell.

FIG. 21 is a graph illustrating operation behavior of the nonvolatile memory according to Comparative Example 2. In Comparative Example 2, a voltage was applied to the variable resistance device 10 obtained by laminating Ru ($\Delta H_f$=152.5 kJ/mol), $TiO_2$ ($\Delta H_f$=472.5 kJ/mol), $Ta_2O_5$ ($\Delta H_f$=409.2 kJ/mol), $TiO_2$, and Ru in this order, to examine the operation behavior of the nonvolatile memory. In this case, Ru constitutes the first electrode and the second electrode.

As shown in FIG. 21, in Comparative Example 2, even when a positive voltage was applied to any of the first electrode and the second electrode, the transition to a high-resistance state (OFF state) and the transition to a low-resistance state (ON state) occurred.

When the normalized oxide formation energy of the first electrode is higher than the normalized oxide formation energy of the second electrode, from the results Examples and Comparative Examples, it is known that the transition to a high-resistance state in the insulating film occurs only when a positive voltage is applied to the second electrode.

As described above, although the embodiments of the invention have been set forth with reference to the drawings, they are merely illustrative of the invention, and various configurations other than those stated above can be adopted.

It is apparent that the present invention is not limited to the above embodiment, and may be modified and changed without departing from the scope and spirit of the invention.

What is claimed is:

1. A semiconductor device comprising:
   a memory cell having a variable resistance device; and
   a control unit that controls a voltage applied to the memory cell,
   wherein the variable resistance device includes
   a first electrode containing a first metal material,
   a second electrode containing a second metal material, and
   an insulating film, provided between the first electrode and the second electrode, that contains a third metal material and oxygen,
   the first metal material has a normalized oxide formation energy higher than that of the second metal material, and
   the control unit applies a positive voltage to the second electrode at the time of an operation of increasing a resistance value of the insulating film and an operation of decreasing the resistance value thereof, and applies a positive voltage to the first electrode at the time of an operation of reading out the resistance value of the insulating film.

2. The semiconductor device according to claim 1, wherein when normalized oxide formation energies of the first metal material, the second metal material, and the third metal material are defined as $\Delta H_{f1}$, $\Delta H_{f2}$, and $\Delta H_{f3}$, respectively, relationships of $\Delta H_{f1} \geq \Delta H_{f3}/7+220$ (kJ/mol) and $\Delta H_{f2} \leq \Delta H_{f3}/7+100$ (kJ/mol) are satisfied.

3. The semiconductor device according to claim 1, wherein the variable resistance device is a unipolar type.

4. The semiconductor device according to claim 1, wherein the insulating film is formed of $Ta_2O_5$, a laminated film of $Ta_2O_5$ and $TiO_2$, $ZrO_2$, a laminated film of $ZrO_2$ and $Ta_2O_5$, NiO, $SrTiO_3$, $SrRuO_3$, $Al_2O_3$, $La_2O_3$, $HfO_2$, $Y_2O_3$ or $V_2O_5$.

5. The semiconductor device according to claim 4, wherein the insulating film is formed of $Ta_2O_5$, and
   when the normalized oxide formation energies of the first metal material and the second metal material are defined as $\Delta H_{f1}$ and $\Delta H_{f2}$, respectively, relationships of $\Delta H_{f1} > 280$ (kJ/mol) and $\Delta H_{f2} < 160$ (kJ/mol) are satisfied.

6. The semiconductor device according to claim 1, wherein the first electrode is formed of W, Al, TiN, Ti, Ta, TaN, Hf, HfN, Zr, ZrN, or an alloy thereof.

7. The semiconductor device according to claim 1, wherein the second electrode is formed of Ru, $RuO_2$, Pt, Ir, Rh, Pd, Cu, or an alloy thereof.

8. The semiconductor device according to claim 1, wherein the positive voltage applied to the first electrode at the time of the operation of reading out the resistance value of the insulating film is 0.8 V or higher.

9. The semiconductor device according to claim 1, further comprising a first interfacial layer, provided between the first electrode and the insulating film,
   wherein a stoichimetric composition of the first interfacial layer is expressed by $M_xO_y$ (M: metal element), and the interfacial layer has a composition ratio of oxygen to a metal element M which is smaller than y/x.

10. The semiconductor device according to claim 9, wherein the first interfacial layer has $Ta_2O_5$ as a stoichiometric composition.

11. The semiconductor device according to claim 1, further comprising a second interfacial layer provided between the first electrode and the insulating film, formed of a metal oxide of which an electronic density of states at a conduction band minimum is equal to or smaller than an electronic density of states at a valence band maximum.

12. The semiconductor device according to claim 11, wherein the second interfacial layer is a layer formed of MgO, CaO, Al$_2$O$_3$, Ga$_2$O$_3$, or SiO$_2$, or a layer including at least one of MgO, CaO, Al$_2$O$_3$, Ga$_2$O$_3$, and SiO$_2$.

13. The semiconductor device according to claim 1, further comprising a third interfacial layer, provided between the first electrode and the insulating film, which is formed of an oxide of a metal material having a valence lower than that of the third metal material constituting the insulating film.

14. The semiconductor device according to claim 13, wherein the third metal material is Al, Y or La, and
the third interfacial layer is a layer formed of MgO or CaO, or a layer including at least one of MgO and CaO.

15. The semiconductor device according to claim 13, wherein the third metal material is Ti, Zr or Hf, and
the third interfacial layer is a layer formed of MgO, CaO, Al$_2$O$_3$, Y$_2$O$_3$ or La$_2$O$_3$, or a layer including at least one of MgO, CaO, Al$_2$O$_3$, Y$_2$O$_3$ and La$_2$O$_3$.

16. The semiconductor device according to claim 13, wherein the third metal material is V or Ta, and
the third interfacial layer is a layer formed of MgO, CaO, Al$_2$O$_3$, Y$_2$O$_3$, La$_2$O$_3$, TiO$_2$, ZrO$_2$, or HfO$_2$, or a layer including at least one of MgO, CaO, Al$_2$O$_3$, Y$_2$O$_3$, La$_2$O$_3$, TiO$_2$, ZrO$_2$, and HfO$_2$.

17. The semiconductor device according to claim 1, further comprising a fourth interfacial layer, provided between the first electrode and the insulating film, which has an impurity functioning as a donor.

18. The semiconductor device according to claim 1, wherein the memory cell has a selection transistor, and
the control unit applies a positive voltage to the first electrode side, and then stops the application of a positive voltage to the first electrode side, and applies a positive voltage to the selection transistor, at the time of the operation of reading out the resistance value of the insulating film.

19. The semiconductor device according to claim 18, wherein the first electrode is connected to the selection transistor.

20. The semiconductor device according to claim 1, further comprising an interconnect provided on the memory cell,
wherein the memory cell has a selection transistor, and
one of the first electrode and the second electrode is connected to the interconnect, and the other one is connected to a source/drain region of the selection transistor.

21. The semiconductor device according to claim 20, wherein the other one of the first electrode and the second electrode is constituted by a first contact that connects the insulating film and the source/drain region.

22. The semiconductor device according to claim 20, further comprising a silicide layer formed in a surface of the source/drain region,
wherein the other one of the first electrode and the second electrode is formed of the silicide layer.

23. The semiconductor device according to claim 20, further comprising the plurality of memory cells arranged in an array.

24. The semiconductor device according to claim 23, wherein two adjacent memory cells are configured such that one of the source/drain regions which is not connected to the variable resistance device is formed integrally therewith, and the source/drain region integrally formed is connected to a bit line through one bit contact.

25. The semiconductor device according to claim 23, further comprising a device isolation electrode located between the selection transistor included in one memory cell and the selection transistor included in another memory cell adjacent to the one memory cell.

26. The semiconductor device according to claim 23, wherein the two adjacent memory cells connected to the same bit line are configured such that the one of the first electrode and the second electrode is formed integrally therewith, the other is separated therefrom, and the one of the first electrode and the second electrode which is formed integrally therewith is connected to a plate line through one plate contact.

27. The semiconductor device according to claim 23, wherein the two adjacent memory cells connected to bit lines different from each other are configured such that the one of the first electrode and the second electrode is formed integrally therewith, the other is separated therefrom, and the one of the first electrode and the second electrode which is formed integrally therewith is connected to a plate line through one plate contact.

28. The semiconductor device according to claim 23, wherein the plurality of memory cells which is connected to bit lines different from each other and is arranged in one direction is configured such that the one of the first electrode and the second electrode is formed integrally therewith, and the other is separated therefrom.

29. The semiconductor device according to claim 20, wherein the one of the first electrode and the second electrode is constituted by a second contact that connects the interconnect and the insulating film.

30. The semiconductor device according to claim 20, wherein the one of the first electrode and the second electrode is constituted by the interconnect.

31. A method of controlling a semiconductor device including a first electrode containing a first metal material, a second electrode containing a second metal material, and an insulating film, provided between the first electrode and the second electrode, that contains a third metal material and oxygen, the first metal material having a normalized oxide formation energy higher than that of the second metal material, the method comprising:
applying a positive voltage to the second electrode at the time of an operation of increasing a resistance value of the insulating film and an operation of decreasing the resistance value thereof, and applying a positive voltage to the first electrode at the time of an operation of reading out the resistance value of the insulating film.

* * * * *